(12) United States Patent
Brederlow et al.

(10) Patent No.: US 7,733,156 B2
(45) Date of Patent: Jun. 8, 2010

(54) TRANSISTOR ARRANGEMENT, INTEGRATED CIRCUIT AND METHOD FOR OPERATING FIELD EFFECT TRANSISTORS

(75) Inventors: Ralf Brederlow, München (DE); Jeongwook Koh, Seoul (KR); Roland Thewes, Gröbenzell (DE)

(73) Assignee: Infineon Technologies AG, Neubiberg (DE)

( * ) Notice: Subject to any disclaimer, the term of this patent is extended or adjusted under 35 U.S.C. 154(b) by 874 days.

(21) Appl. No.: 10/570,924

(22) PCT Filed: Sep. 1, 2004

(86) PCT No.: PCT/DE2004/001941

§ 371 (c)(1),
(2), (4) Date: Nov. 16, 2006

(87) PCT Pub. No.: WO2005/025055

PCT Pub. Date: Mar. 17, 2005

(65) Prior Publication Data

US 2007/0176634 A1    Aug. 2, 2007

(30) Foreign Application Priority Data

Sep. 4, 2003    (DE) ............................... 103 40 846

(51) Int. Cl.
*H03K 17/16* (2006.01)
*H03K 17/687* (2006.01)
(52) U.S. Cl. ..................... 327/378; 327/379; 327/389
(58) Field of Classification Search ............ 327/378, 327/379, 389
See application file for complete search history.

(56) References Cited

U.S. PATENT DOCUMENTS

| 4,611,135 A | 9/1986 | Nakayama et al. |
| 5,392,043 A | 2/1995 | Ribner |
| 6,140,872 A | 10/2000 | McEldowney |

(Continued)

FOREIGN PATENT DOCUMENTS

| DE | 44 35 305 | 4/1995 |
| DE | 100 01 124 | 6/2001 |
| JP | 60 174518 | 9/1985 |

OTHER PUBLICATIONS

S. Christensson et al., "Low Frequency Noise in Mos Transistors—I Theory", Solid-St. El. 11, pp. 791-812, 1968.
R. Brederlow et al., "Influence of Fluorinated Gate Oxides on the Low Frequency Noise of MOS Transistors under Analog Operation", Proceedings of the 28th European Solid-State Device Research Conference, pp. 472-475, 1998.

(Continued)

*Primary Examiner*—Evan Pert
(74) *Attorney, Agent, or Firm*—Dicke, Billig & Czaja, PLLC

(57) ABSTRACT

The transistor arrangement contains a first and a second field effect transistor comprising a first and a second source drain connection and a control connection for applying a first or a second signal. The two field effect transistors are of the same conductive type. The transistor arrangement is configured in such a manner that the first signal can be applied in an alternating manner to the control connection of the first field effect transistor and the second signal can be applied in a simultaneous manner to the control connection of the second field effect transistor, and/or the second signal can be applied to the control connection of the first field effect transistor and the first signal can be applied simultaneously to the control connection of the second field effect transistor.

25 Claims, 25 Drawing Sheets

U.S. PATENT DOCUMENTS

| | | |
|---|---|---|
| 6,259,313 B1 | 7/2001 | Lewicki |
| 6,331,846 B1 | 12/2001 | Nakao |
| 2003/0011249 A1 | 1/2003 | Brederlow et al. |
| 2003/0080810 A1 | 5/2003 | Reber |
| 2003/0128776 A1 | 7/2003 | Rawlins et al. |

OTHER PUBLICATIONS

S. Gierkink et al., "Reducing NOSFET 1/f Noise and Power Consumption by 'Switched Biasing'", Proceedings of the 28$^{th}$ European Solid-State Circuits Conference, pp. 154-157, 1999.

E. Simoen et al., "Empirical Model for the Low-Frequency Noise of Hot-Carrier Degraded Submicron LDD MOSFET's", IEEE El. Dev. Lett. 18, pp. 480-482, 1997.

I. Bloom et al., "1/f Noise Reduction of Metal-Oxide-Semiconductor Transistors by Cycling from Inversion to Accumulation", Appl. Phys. Lett. 58, pp. 1664-1666, 1991.

R. Gregorian et al., "Analog MOS Integrated Circuits", NY, John Wiley & Sons, 1986.

P.E. Allen et al., "CMOS Analog Circuit Design", NY, Oxford University Press, 1987.

P.R. Gray et al., "Analysis and Design of Analog Integrated Circuits", NY, John Wiley & Sons, 1993.

A.B. Grebene, "Bipolar and MOS Analog Integrated Circuit Design", NY, John Wiley & Sons, 1984.

S.L.J. Gierkink et al., "Intrinsic 1/f Device Noise Reduction and Its Effect on Phase Noise in CMOS Ring Oscillators", in: IEEE Journal of Solid-State Circuits, 1999, vol. 34, No. 7, pp. 1022-1025.

E. Klumpernik et al., "Reducing MOSFET 1/f Noise and Power Consumption by Switched Biasing", In: IEEE Journal of Solid-State Circuits, 2000, vol. 35, No. 7, pp. 994-1001.

CC Enz et al., "Circuit Techniques for Reducing the Effectos of OP-Amp Imperfections: Auto Zeroing, Correclated Double Sampling and Chopper Stabilization", Proceedings of the IEEE, vol. 4, No. 11, Sep. 1996.

Tihanyi et al., "Properties of ESFI MOS Transistors Due to the Floating Substrate and the Finite Volume", IEEE Trans. Electron Devices, vol. Ed-22, S. 1017, 1975.

Chan et al., "Comparative Study of Fully Depleted and Body-Grounded Non Fully Depleted SOI MOSFETs for High Performance Analog and Mixed Signal Circuits", IEEE Trans. On Electron Devices, vol. Ed-42, Nr. 11, S.1975, 1995.

Tenbroek et al., "Impact of Self-Heating and Thermal Coupling on Analog Circuits in SOI CMOS", IEEE Journal of Solid-State Circuits, vol. 33, Nr. 7, S.1037, 1998.

Wei et al., "Minimizing Floating-Body-Introduced Threshold Voltage Variation in Partially Depleted SOI CMOS", IEEE Electron Device Letters, vol. 17, Nr. 8, 1996.

Colionge, "Silicon-on-Insulator Technology: Material to VLSI", Norwel, MA: Kluwer, S.139-141, 1991.

Jenkins, "Characteristics of SOI FETs Under Pulsed Conditions", IEEE Transactions on Electron Devices, vol. 44, Nr. 11, 1997.

Perron, "Switch-Off Behaviour of Floating Body PD SOI-MOSFETs", IEEE Transactions on Electron Devices, vol. 45, Nr. 11, 1998.

S.L. Wong et al., "A Switched Differential OP-Amp with Low Offset and Reduced 1/fNoise", IEEE Transactions on Circuits and Systems, vol. 33, No. 11, Nov. 1, 1986.

Chinese Office Action for Application No. 200480032739.5 mailed Jun. 27, 2008 (4 pgs.).

A translation of Chinese Office Action for Application No. 200480032739.5 mailed Jun. 27, 2008 (7 pgs.).

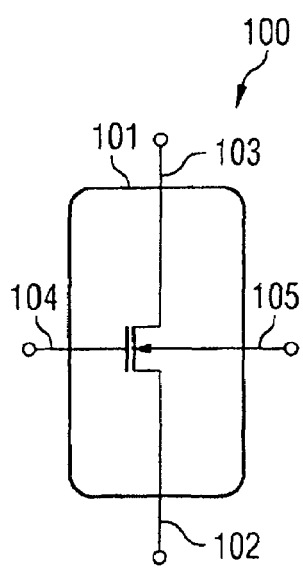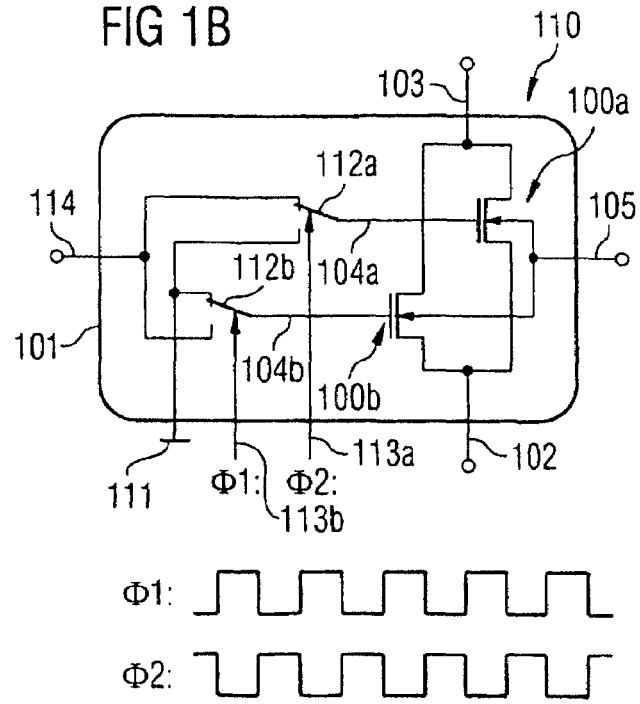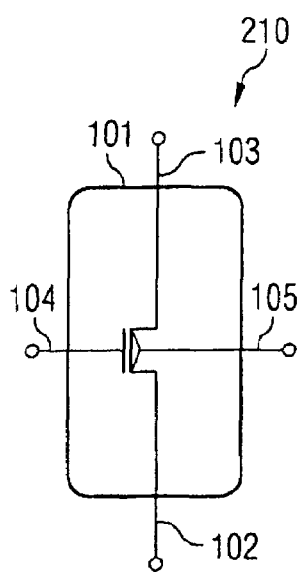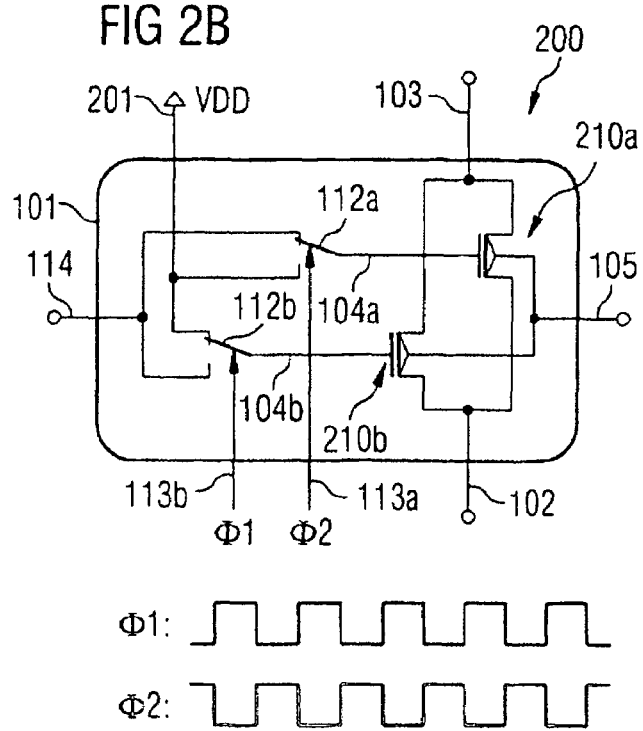

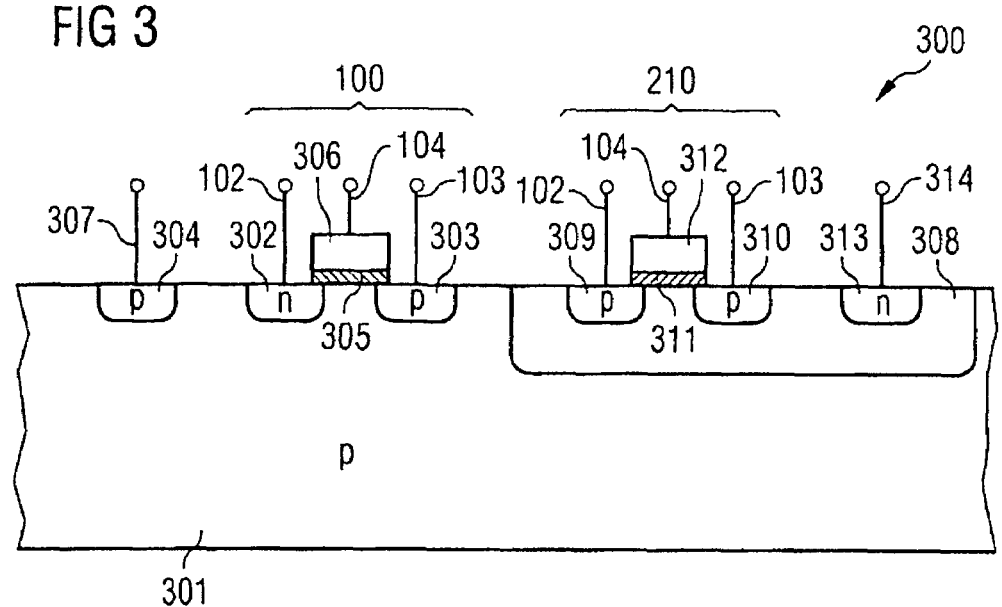
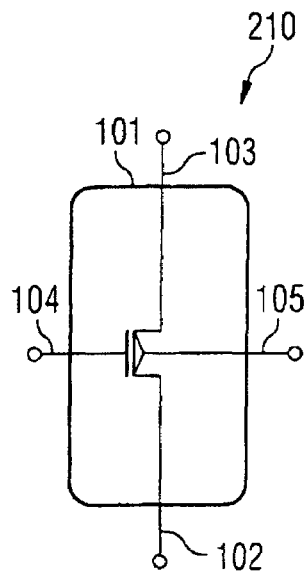
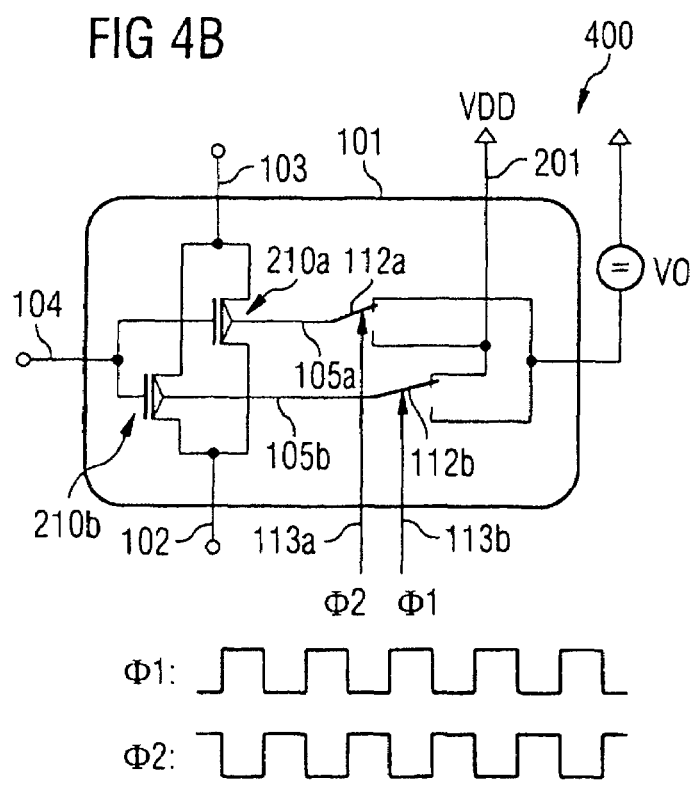

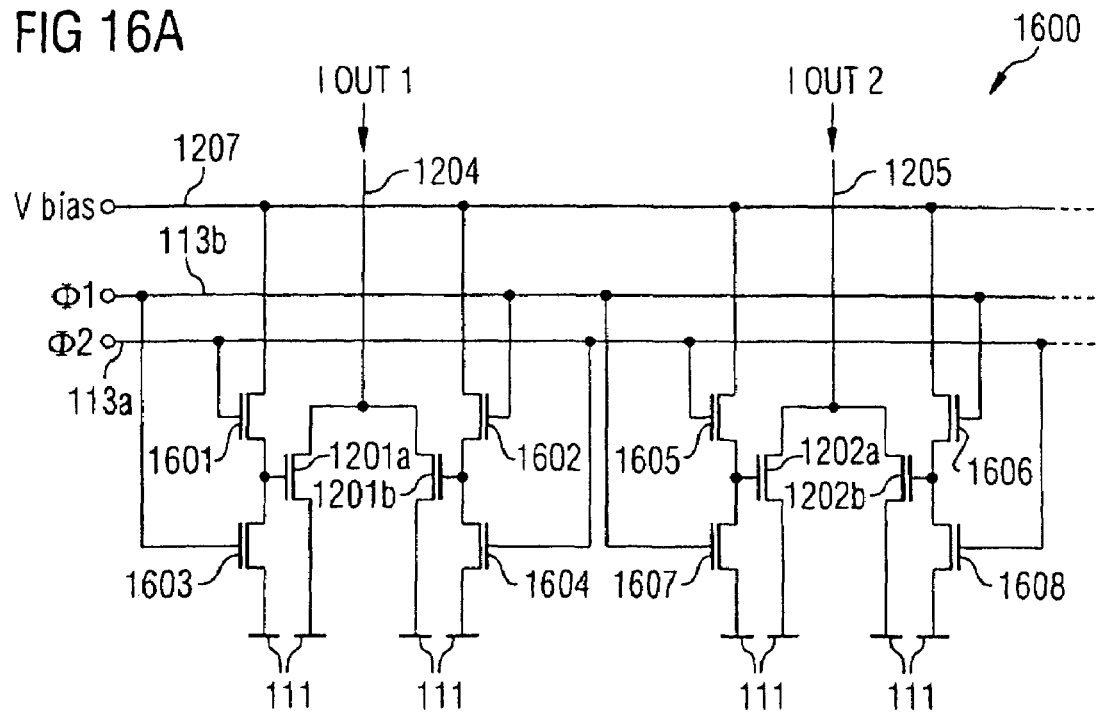
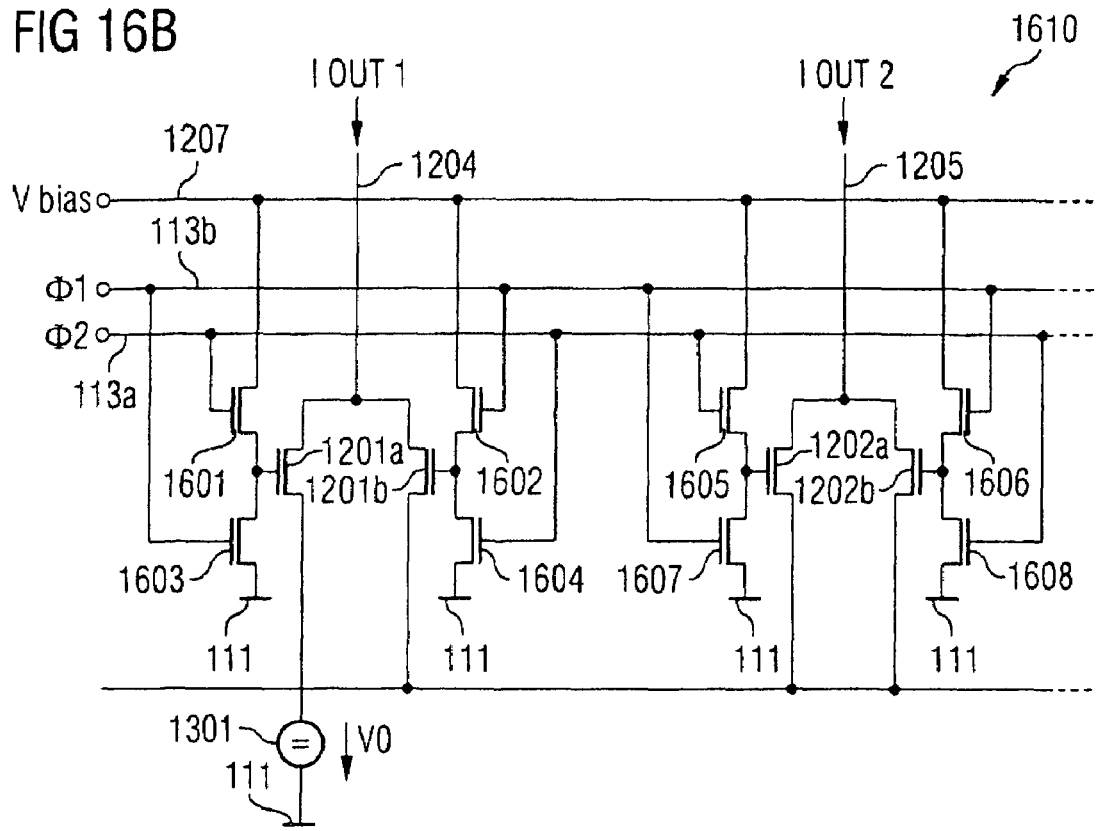

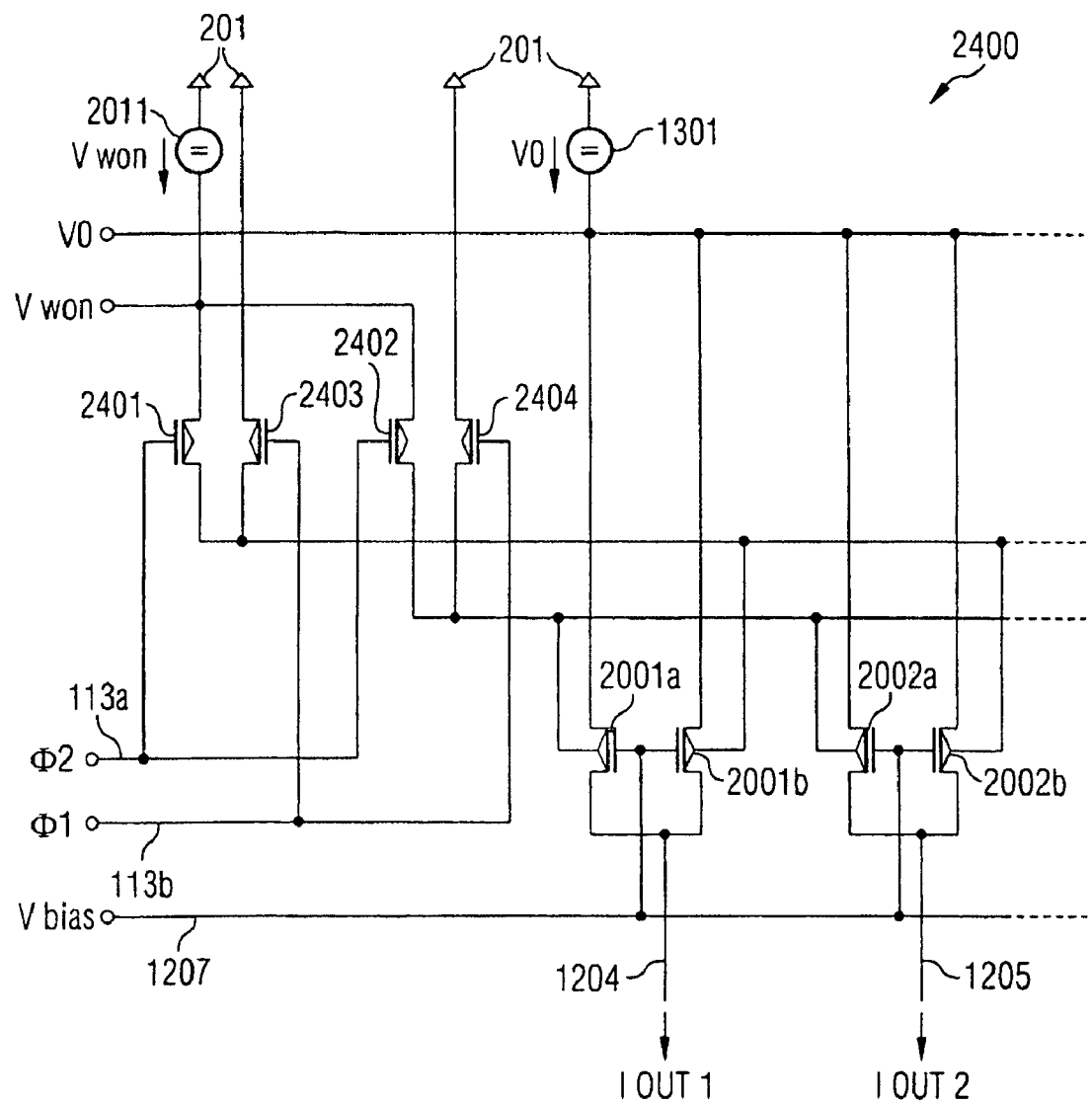

FIG 32A
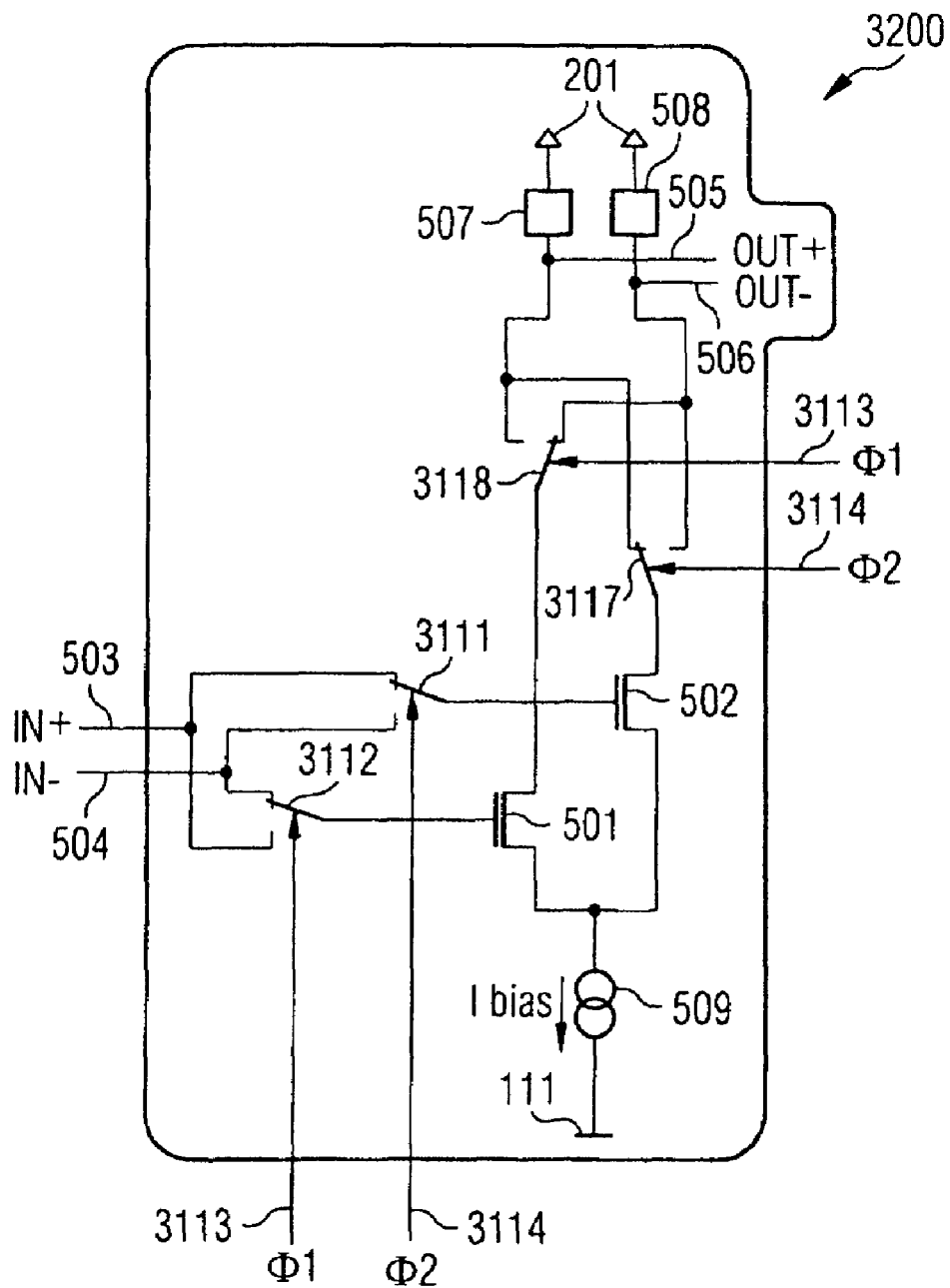

TRANSISTOR ARRANGEMENT, INTEGRATED CIRCUIT AND METHOD FOR OPERATING FIELD EFFECT TRANSISTORS

CROSS REFERENCE TO RELATED APPLICATION

This Utility Patent Application claims the benefit of the filing date of Application Number DE 103 40 846.0, filed Sep. 4, 2003 and International Application No. PCT/DE2004/001941, filed Sep. 1, 2004, all of which are herein incorporated by reference.

BACKGROUND

The invention relates to a transistor arrangement, an integrated circuit and a method for operating field effect transistors.

The noise of a field effect transistor (in particular MOSFET, "metal oxide semiconductor field effect transistor") limits the accuracy of an electrical circuit. This is problematic when a signal having a small amplitude occurs in such a circuit. Therefore, the performance of an analog circuit is limited by the phenomenon of noise.

The low-frequency noise of a MOS transistor is caused by statistical loading or unloading of defect states at the interface between the channel region and the gate insulating region of the field effect transistor. At low frequencies, this mechanism supplies the dominant contribution to the noise. On account of their localization the defects are also often referred to as interface states. Predominantly those defects whose energy level lies close to the (quasi) Fermi level of the charge carriers contributing to the current flow contribute to the low-frequency noise. Other interface states whose energy level is significantly higher or lower are either completely occupied or completely unoccupied and thus do not contribute to the noise, cf. S. Christensson, I. Lundström, and C. Svensson, "Low frequency noise in MOS transistors—I theory," Solid-St. El. 11, pp. 791-812, 1968.

R. Brederlow, W. Weber, R. Jurk, C. Dahl, S. Kessel, J. Holz, W. Sauert, P. Klein, B. Lemaitre, D. Schmitt-Landsiedel, and R. Thewes, "Influence of fluorinated gate oxides on the low frequency noise of MOS transistors under analog operation," in Proceedings of the 28th European Solid-State Device Research Conference, pp. 472-5, 1998 discloses suppressing low-frequency noise by means of optimizing the fabrication process for the field effect transistors. This exploits the fact that the magnitude of the low-frequency noise critically depends on the quality of the interface between channel region and gate insulating layer. However, narrow limits are imposed on the technological optimization possibilities.

A further method for reducing the low-frequency noise is based on setting the operating point of the field effect transistors such that the low-frequency noise is minimized. By way of example, it is known that choosing the operating point within the framework of those operating points which are suitable for analog circuit technology permits a reduced noise power to be achieved, cf. S. Christensson, I. Lundstrom, and C. Svensson, "Low frequency noise in MOS transistors—I theory," Solid-St. El. 11, pp. 791-812, 1968. If Vg designates the gate voltage, Vt designates the threshold voltage and Vd designates the drain voltage of a field effect transistor, then Vg−Vt=100 mV to 1V and Vd>VgVt is a suitable choice. With this method, however, there is the restriction of the degrees of freedom in the circuit design from other standpoints, such as, e.g. power consumption, modulation range, bandwidth. Furthermore, the noise reduction that can be achieved by means of this method is small.

Since low-frequency noise voltages or noise currents in a MOSFET are inversely proportional to the root of the active area thereof, cf. S. Christensson, I. Lundstrom, and C. Svensson, "Low frequency noise in MOS transistors—I theory," Solid-St. El. 11, pp. 791-812, 1968, there is the possibility of reducing the low-frequency noise of a circuit by choosing the component areas to be sufficiently large. With this method, there is the increased area taken up. Moreover, an increased power consumption may result, particularly if the bandwidth of the circuit cannot be reduced, since then only the widths, but not the lengths of the transistors are permitted to be increased. The current consumption of the circuit or of the paths in which the relevant transistors are operated rises approximately proportionally to the width of the relevant transistors. Furthermore, all the capacitive loads that occur in a predetermined circuit rise the input capacitance of sensitive amplifier circuits.

DE 10001124 C1 to I. Bloom, and Y. Nemirowsky, "1/f noise reduction of metal-oxide-semiconductor transistor by cycling from inversion to accumulation," Appl. Phys. Lett. 58, pp. 1664-6, 1991 disclose that the low-frequency noise of a transistor can be reduced if the quasi Fermi level at the interface is periodically altered.

DE 10001124 C1, S. L. J. Gierkink, E. A. M. Klumperink, E. Van Tuijl, and B. Nauta, "Reducing MOSFET 1/f noise and power consumption by 'switched biasing'," in Proceedings of the 28th European Solid-State Circuits Conference, pp. 154-7, 1999 describe circuitry methods for reducing the low-frequency noise of MOSFETs. The method described in S. L. J. Gierkink, E. A. M. Klumperink, E. Van Tuijl, and B. Nauta, "Reducing MOSFET 1/f noise and power consumption by 'switched biasing'," in Proceedings of the 28th European Solid-State Circuits Conference, pp. 154-7, 1999 is restricted, however, to circuits in which the transistors are periodically switched on and off. This is not desirable, however, in many analog circuits since continuous signals are intended to be processed.

DE 44 35 305 A1 discloses a signal integrator operated with double sampling speed.

US 2003/0128776 A1 discloses a method and a device for reducing DC offsets in a communication system.

S. L. J. Gierkink et al. "Intrinsic 1/f Device Noise Reduction and Its Effect on Phase Noise in CMOS Ring Oscillators" In: IEEE Journal of Solid-State Circuits, 1999, Vol. 34, No. 7, pp. 1022-1025 discloses intrinsic reduction of 1/f noise and its effect on phase noise in CMOS ring oscillators.

E. Klumpernik et al. "Reducing MOSFET 1/f Noise and Power Consumption by Switched Biasing" In: IEEE Journal of Solid-State Circuits, 2000, Vol. 35, No. 7, pp. 994-1001 discloses a method for reducing 1/f noise and the power consumption in a MOSFET by means of switched biasing.

A mismatch of MOS transistors limits the resolution of circuits. This is the case if said circuits have to process very small signals. Consequently, the performance primarily of analog circuits is limited on account of these phenomena. Manufacturing tolerances (mismatch) of MOS transistors are also caused by the fluctuation of the dopant concentration in the transistor channel and in many cases constitute a great obstacle to the miniaturization of analog circuits.

Precise analog circuits, which are thus susceptible to manufacturing tolerances, are usually constructed in differential fashion. In this case, the transistors important for the function of the circuits (but not necessarily the transistors used for a current source) are doubly present, the pairs of transistors in each case processing signals that are different in their sign but are of identical type in terms of magnitude and phase. For the performance of the analog circuit, it is of crucial importance that the manufacturing tolerances between these transistor pairs become as small as possible.

Various methods are proposed in Enz, C C, Temes, G "Circuit techniques for reducing the effects of op-amp imperfections: auto zeroing, correlated double sampling and chopper stabilization", Proceedings of the IEEE, Vol. 4, No. 11, September 1996 for reducing the manufacturing tolerances in analog circuits. Firstly, it is possible to enlarge the area of a transistor and to implement a centered layout. In the case of this method, the area of the transistors used has to be enlarged to an extent such that it satisfies the mismatch requirements made of the respective circuit. This is often associated not only with circuitry disadvantages but also with higher manufacturing costs. Furthermore, Enz, CC, Temes, G "Circuit techniques for reducing the effects of op-amp imperfections: auto zeroing, correlated double sampling and chopper stabilization", Proceedings of the IEEE, Vol. 4, No. 11, September 1996 proposes autozeroing (for example correlated double sampling) and chopper stabilization.

A description is given below of the floating body effect and the self-heating effect, which can occur in partially depleted (PD) and in fully depleted (FD) SOI transistors ("silicon on insulator") in CMOS technology. These effects have an influence on the circuit design in particular of analog circuits.

With regard to the future development of semiconductor technology, alterations are to be expected away from conventional bulk CMOS processes toward SOI processes, and moreover toward double or triple gate transistor architectures. This expectation is evident e.g. from the International Technology Roadmap for Semiconductors, ITRS 2001.

Despite the advantages of SOI CMOS transistor technology compared with bulk CMOS transistor technology (for example the reduction of parasitic capacitances, the possibility of better diffusion resistances and capacitances, the better device insulation, whereby latch-up effects and substrate coupling effects are reduced, etc.), integrated SOI circuits using analog circuit technology have been investigated only little heretofore, see Tihanyi et al. "Properties of ESFI MOS transistors due to the floating substrate and the finite volume", IEEE Trans. Electron Devices, Vol. ED-22, p. 1017, 1975.

One problem of SOI field effect transistors is the floating body effect inherent to them, which leads to a kink effect in the case of the drain current. MOS transistors which are processed on SOI films, so that the channel region is partially depleted of charge carriers, or for example a double gate transistor on an SOI film, a vertical transistor on an SOI film (FinFET), etc., are exposed to the floating body effect, see Tihanyi et al. "Properties of ESFI MOS transistors due to the floating substrate and the finite volume", IEEE Trans. Electron Devices, Vol. ED-22, p. 1017, 1975, Chan et al. "Comparative Study of Fully Depleted and Body-Grounded Non Fully Depleted SOI MOSFETs for High performance analog and Mixed Signal Circuits", IEEE Trans. On Electron Devices, Vol. ED-42, No. 11, p. 1975, 1995.

The kink effect is brought about by the injection of holes or electrons into the floating substrate of an n-MOS transistor or of a p-MOS transistor on an SOI film. For an n-MOSFET in SOI technology, said holes are generated by means of impact ionization (clearly ionization through charge carrier introduction) into a region with a high electric field near the drain. Once they have been generated, the holes migrate into the region in which the electrical potential is lowest, that is to say in the direction of the floating substrate. Accumulation of holes increases the floating substrate potential until the substrate-source junction is sufficiently biased, for compensating for the current generated by hole generation. The accumulated charge in the body depends on the previous state of the transistor (that is to say its history), on process parameters, device dimension, supply voltage, temperature, slew rate and switching frequency.

The increase in the substrate potential leads to a reduction of the threshold voltage and results in a kink in the output characteristic curve or characteristic, as a result of which the gain of analog amplifiers and the constancy of current sources are impaired.

Another feature of SOI technology compared with bulk MOSFET technology is that the self-heating of individual devices is not negligible. This results from the poor thermal conductivity of the buried silicon oxide layer arranged beneath a silicon layer of an SOI substrate, so that the channel temperature of the SOI device may rise by tens of ° C. above the temperature at normal operation. The insulating substrate forms a thermal barrier, so that the heat generated by the operated device cannot simply be transferred to the substrate. The thermal conductivity of silicon oxide ($SiO_2$) is a few orders of magnitude worse than that of bulk silicon. Therefore, in contrast to a bulk MOS transistor, significant self-heating can occur in the case of a MOS transistor on an SOI film. This self-heating occurs in any type of transistor structure which has a poor thermal coupling between the channel region and heat sinks, such as the bulk silicon or even the housing (e.g. all SOI or double or triple gate concepts).

If the device heats up, the mobility of charge carriers decreases in the channel region, which in turn reduces the drain current. Consequently, the device characteristic is significantly modified, with negative output conductivity, as can often be observed at high drain currents.

Thermal effects are in most cases not significant for digital circuits, on account of the low average energy dissipation, and by virtue of the fact that clock frequencies normally lie sufficiently far above thermal time constants. However, analog circuits can be significantly influenced by self-heating effects. The output conductivity can be low or even negative at low frequencies and can then rise with the frequency, which leads to unforeseen gain and phase variations. Interacting devices that adjoin one another may be at different temperatures, which may lead to a thermally induced mismatch. The temperature gradients which result from the self-heating effect and the thermal coupling effect lead to non-isothermal conditions and therefore to malfunctions, see Tenbroek et al. "Impact of Self-Heating and Thermal Coupling on Analog Circuits in SOI CMOS", IEEE Journal of Solid-State Circuits, Vol. 33, No. 7, p. 1037, 1998.

Possibilities for alleviating floating body effects of a MOS transistor on an SOI film are known, see Wei et al. "Minimizing Floating-Body-Introduced Threshold Voltage Variation in Partially Depleted SOI CMOS", IEEE Electron Device Letters, Vol. 17, No. 8, 1996. Among these possibilities, the body contact method appears to be the only circuit-oriented possibility. All the other concepts are related to device engineering. The body potential in a partially depleted SOI transistor is kept constant by the body contact, although the problem occurs as to how the system configuration can be optimized given simultaneous minimization of the effect of stray resistance and stray capacitance between the body contact path and the active region. Furthermore, it is known that the effectiveness of hole absorption falls rapidly if the channel width is increased. In particular, the physical definition of the contact to the FinFET or to the planar double gate transistor requires tricky lithography.

Fully depleted (FD) SOI devices in which an ultra thin silicon body of an SOI substrate having a thickness of 10 nm to 30 nm is used are naturally a good choice for analog/mixed signal applications, since they suppress the kink effect, see Colionge "Silicon-on-Insulator Technology: Material to VLSI", Norwel, Mass.: Kluwer, p. 139-141, 1991. However, even fully depleted device structures cannot prevent self-heating effects, and it is necessary to take account of the small process margin of FD devices with regard to the threshold voltage control, and also a loss of area. Furthermore, the high inherent body resistance and the high inherent body capacitance which are introduced by the body contact are problematic, and the floating body effects are far more serious in an analog design.

Even advanced double and triple gate concepts suffer from self-heating and, depending on how they are constructed, they may also be exposed to charge accumulation effects such as the kink effect in partially depleted SOI substrates.

SUMMARY

One aspect of the invention improves the functionality of a transistor arrangement by effectively reducing the low-frequency noise of transistors with little outlay or reducing effects of production tolerances of transistors.

The transistor arrangement according to one embodiment of the invention has a first and a second field effect transistor, each of which has a first and a second source/drain terminal and a control terminal for application of a first or a second signal. The transistor arrangement is set up in such a way that alternately the first signal can be applied to the control terminal of the first field effect transistor and, simultaneously, the second signal can be applied to the control terminal of the second field effect transistor, and the second signal can be applied to the control terminal of the first field effect transistor and, simultaneously, the first signal can be applied to the control terminal of the second field effect transistor.

The integrated circuit according to the invention contains at least one transistor arrangement having the abovementioned features.

In accordance with one method according to the invention for operating field effect transistors, a first and a second field effect transistor are connected up to one another, each of the field effect transistors having a first and a second source/drain terminal and having a control terminal for application of a first or a second signal. The transistor arrangement is set up in such a way that alternately the first signal is applied to the control terminal of the first field effect transistor and, simultaneously, the second signal is applied to the control terminal of the second field effect transistor, and the second signal is applied to the control terminal of the first field effect transistor and, simultaneously, the first signal is applied to the control terminal of the second field effect transistor.

In other words, signals are alternately applied to the control terminals, for example gate terminals or substrate terminals, of the two field effect transistors. In a first time interval, by way of example, the first signal, e.g. an electrical ground potential, may be applied to the control terminal of the first field effect transistor and, simultaneously, the second signal, e.g. a useful signal, may be applied to the control terminal of the second field effect transistor. In a second time interval, by way of example, the second signal may be applied to the control terminal of the first field effect transistor and, simultaneously, the first signal may be applied to the control terminal of the first field effect transistor. A changeover is made between these two operating states with a predeterminable frequency.

According to one aspect of the invention, physical properties of interface states are used and combined with a simple and efficient circuit architecture, whereby the noise, for example, the low-frequency noise, of the circuit or the contributions of the transistors contained therein can be significantly reduced.

One important aspect of the invention consists in the fact that a transistor of a circuit is replaced by two structurally identical replacement transistors. The first source/drain terminals of the first and second transistors are coupled to one another and the second source/drain terminals of the two transistors are coupled to one another. The control terminals of the transistors are in each case switched back and forth alternately between two circuit nodes with different electrical potentials. What is clearly achieved in this way is that one of the two transistors in each case assumes an operating point in depletion or accumulation, and the other transistor assumes an operating point in inversion. It should be noted that the (quasi) Fermi levels in inversion, on the one hand, and in depletion or accumulation, on the other hand, are sufficiently far apart from one another.

As is explained below, this interconnection leads to a reduction of the low-frequency noise. An interface state whose energy level is close to the quasi Fermi level in inversion and in depletion or accumulation endeavors to statically change its occupation state at said quasi Fermi level. This phenomenon brings about the low-frequency noise of a transistor since, as a result, a charge carrier is in each case taken from the channel current or a charge carrier is fed to the channel current. Furthermore, the electrical charge that is or is not present in the interface state modulates the channel current.

The low-frequency noise of the transistor can be reduced if first and second signals are applied alternately to the control terminals of the two field effect transistors, so that a resulting signal which is altered temporally with an alternating frequency is applied to a respective control terminal. The interconnection according to the invention therefore makes it possible to switch the quasi Fermi level back and forth in the channel region with the alternating frequency between the values in inversion and in depletion or accumulation. The low-frequency noise can be reduced very effectively if the energy difference between the quasi Fermi levels in inversion, on the one hand, and in depletion or accumulation, on the other hand, is large relative to the thermal noise energy $k_B T$ or if the reciprocal of the frequency of this change is chosen to be sufficiently small in relation to the time constants of the relevant interface states.

Furthermore, the invention may be used in a differential circuit, for example, in a differential analog circuit, in order to significantly reduce the effects of production tolerances of transistors in such a differential circuit. In a differential circuit, the alternate application of the first signal and of the second signal to the control terminals of the first and of the second field effect transistor leads to a reduction of the production tolerances of MOS transistors, and therefore constitutes a circuitry possibility—for example in analog circuits—for compensating for such a mismatch. This prevents a mismatch from leading to an impaired signal processing.

A basic concept of this aspect of the invention consists in the fact that the signals applied to the gate terminals of a differential pair of transistors of a positive and of a negative branch of a differential circuit are alternately changed over in such a way that each transistor of the pair is assigned to the positive branch of the circuit for half of the time and to the negative branch of the circuit for the other half of the time. As a result, a voltage offset (caused by a mismatch of the components) which occurs as a positive value during one phase and occurs as a negative value in the next phase is subtracted again (and vice versa) so that on average the circuit is free of undesirable mismatch effects. This requires the two phases or clock signals Φ1 and Φ2 by means of which useful signals to be processed are applied alternately to the two transistors to be of the same length.

A changeover is in one case performed at the first source/drain terminals of the two field effect transistors with the same clock frequency and in the same clock as at the gate terminals. Furthermore, a changeover is in one case also carried out at the second source/drain terminals with the same clock frequency as at the gate terminals. This holds true if the mismatch effect is intended to be utilized. If noise suppression is simultaneously intended to be utilized, the clocks should be different (gate clock at least twice S/D clock).

If the speed of the change of the transistors between the two branches (referred to hereinafter as switching frequency) is high in relation to the frequency of the signals to be processed, the signal processing is disturbed slightly at most. Sometimes, however, high-frequency thermal noise may be coupled in to a small extent. The high-frequency interference generated by the changeover can largely be removed by a low-pass filter. The stability of an amplifier circuit is only impaired at low changeover frequencies. Furthermore, the changeover requires the bypassing of a few capacitive nodes of the circuit, so that the power consumption of the circuit can be reduced at low changeover frequencies.

Clearly the aspect of the invention described involves an area-efficient combination of an auto-zeroing-like and of a chopper-technique-like method for offset suppression.

In the case of a pair of transistors, two switching elements are provided at the gate terminals (and in each case two additional switching elements are provided at the two first source/drain terminals and two additional switching elements are provided at the second source/drain terminals), and a periodic change of the two gate terminals between the input nodes of a circuit constructed in differential fashion is brought about.

In order to keep down hysteresis effects in a differential circuit, in one case it is advantageous to use not just two, but four transistors, so that in each case only two of the transistors are active in the circuit and the other two transistors are in a predetermined quiescent state. In other words, each of the transistors of such a differential circuit can be replaced in a similar manner, as is illustrated in FIG. 1A and FIG. 1B, and in FIG. 2A and FIG. 2B. A four-phase clock scheme in one case implemented in this case, so that a 1/f noise suppression would be effected in addition to the reduction of mismatch influences.

If, and this is important for some SOI technologies, history effects caused by heat and by floating body effects are intended to be reduced, even higher-order clock schemes can be implemented. In other words, in a differential circuit it is then possible to use rather than four also six or more transistors at which the two useful signals can alternately be processed.

The control terminal may be a gate terminal or a substrate terminal (e.g. bulk terminal). In the case of an SOI transistor ("silicon-on-insulator"), by way of example, the dictates of the technology mean that a substrate terminal may not be present, so that the field effect transistor is controlled by means of the gate terminal in this case. In another case, a transistor may have both a gate terminal and a substrate terminal, so that control can then optionally be effected by means of the gate terminal or by means of the substrate terminal.

For the case where the control terminal of the first and of the second field effect transistor is a gate terminal, the first and the second field effect transistor may have a substrate terminal as additional control terminal. For the case where the control terminal of the first and of the second field effect transistor is a substrate terminal, the first and the second field effect transistor may have a gate terminal as additional control terminal. The additional control terminals of the first and of the second field effect transistor are in one case coupled to one another. In other words, when a gate terminal and a substrate terminal are present, the alternate application of the first and second signals may optionally be effected at the two gate terminals or at the two substrate terminals. The respective two control terminals or additional control terminals to which the first and second signals are alternately not applied may then be coupled to one another.

One of the first and second signals may be a useful signal and the respective other signal may be a reference potential. By way of example, the first signal may be an analog useful signal to be processed and the second signal may be a ground or supply voltage potential, or vice versa. However, it is also possible for the first signal and the second signal in each case to be a useful signal or in each case to be a reference potential. The processing of two (mutually) differential useful signals occurs in a differential circuit.

The first and the second field effect transistor are in one case structurally identical. In other words, the two field effect transistors may have the same geometrical dimensions, be produced from the same materials, etc. This leads to a symmetrical arrangement and consequently to a effective reduction of the noise.

Furthermore, the first and the second signal may alternate at the control terminals of the first and second field effect transistors with an alternating frequency which is at least as great as the cut-off frequency of the noise characteristic of the field effect transistors. The noise power characteristic of a semiconductor component, for example of a field effect transistor, depending on a frequency is a function with a characteristic kink at the so-called cut-off frequency. The low-frequency noise (LF noise) is effectively suppressed at frequencies which are higher (in one case at least a factor of two higher) than the kink or cut-off frequency.

In one case, the first and the second signal alternate at the control terminals of the first and second field effect transistors with an alternating frequency which is greater than the frequencies of a useful frequency band of an assigned circuit. Clearly, this is intended to effectively decouple a useful frequency band from a clock frequency band (a clock signal serving for the alternate application of the first and second signals to the control terminals of the first and second field effect transistors). Many integrated circuits are operated at a characteristic frequency, the so-called useful frequency, or the so-called useful frequency band.

The first and the second signal at the control terminals of the first and second field effect transistors may alternate with a reciprocal alternating frequency which is less, in one case significantly less, than a mean lifetime of an occupation state of a defect in the boundary region between channel region and gate insulating layer of the field effect transistor.

In one case, at least one of the substrate terminals is set up as a well terminal of one of the two field effect transistors, which is formed in a well.

When a p-doped substrate, for example, is used in which a field effect transistor is formed, a MOSFET of the n conduction type may be formed directly in the p-doped substrate. In order to form a MOSFET of the p conduction type in the p-doped substrate, it is necessary to dope the associated surface region of the substrate (the so-called well region) with doping atoms of the n conduction type and thus to form an n-conductive well. In the configuration of the transistor arrangement according to the invention in which the gate terminals of the first and of the second field effect transistor are coupled to one another, the first and the second signal can be applied alternately to the well terminals of the first and second field effect transistors.

In one case, both field effect transistors have the same conduction type. In other words, both field effect transistors are either of the n conduction type, n-MOSFETs, or of the p conduction type, for example p-MOSFETs.

In accordance with one exemplary embodiment, the transistor arrangement may be set up in such a way that a respective one of the two field effect transistors is operated at an inversion operating point and the respective other of the two field effect transistors is operated at an accumulation or depletion operating point.

An explanation is given below, for the example of a p-doped substrate, as to the manner by which the operating points of accumulation, depletion and inversion differ. In the case of electrical voltages having a negative sign between the gate region and the semiconductor material, free charge carriers (holes) are attracted from the p-doped material of the substrate by the negatively charged electrode, so that a layer of positive electrical charge is formed below the gate insulating region. A corresponding opposite charge forms at the gate region. The state established is called accumulation.

In the case of a positive voltage at the gate terminal, the electrically positively charged holes migrate away from the positive region. In the depleted region, only the negatively ionized doping atoms remain, and a space charge zone is formed. This state is referred to as depletion.

If the voltage at the gate terminal is increased further proceeding from the scenario described last, the positive holes migrate into the substrate and the negative electrons are attracted by the positive electrode. In the channel region, they form a conducting inversion layer. The operating point established is referred to as inversion.

In the case of the transistor arrangement according to the invention, the control terminal of the first field effect transistor may be coupled to a first switching element, which can be switched by means of a first clock signal with an alternating frequency. Furthermore, the control terminal of the second field effect transistor may be coupled to a second switching element, which can be switched by means of a second clock signal, which is complementary to the first clock signal, with the alternating frequency. By means of the respective switching element, the first or the second signal is alternately applied to the respective control terminal of the respective field effect transistor with the alternating frequency. Clearly, a switching element that can be switched using a clock signal can be used to apply the first or the second signal alternately to the control terminal of a respective field effect transistor.

The first and second switching elements may be first and second switching transistors, to the respective gate terminal of which the respective clock signal can be applied, and a respective source/drain terminal of a respective switching transistor being coupled to the control terminal of the respective field effect transistor.

The transistor arrangement may be set up as a differential transistor arrangement, in which the first signal and the second signal are differential useful signals with respect to one another.

In the case of a differential circuit, two useful signals are processed in two branches, which useful signals may be identical with regard to phase and amplitude, but may be different with regard to sign. With two such (mutually complementary) signals, a very reliable transmission of the signals can be carried out with high quality even at small signal amplitudes. According to the invention, it is possible to implement the two transistors for processing such differential useful signals such that one of the transistors processes the first useful signal for half of the time and the second useful signal for the other half of the time, and the second transistor can process the second useful signal for the first half of the time and the first useful signal for the second half of the time. Mismatch influences can thereby be suppressed since such mismatch influences average out temporally if a respective signal is processed partly by one transistor and partly by the other transistor.

The transistor arrangement in accordance with this refinement may have a low-pass filter, which is connected up in such a way that an interference signal (for example high-frequency noise) caused by means of the alternating application of the first signal and of the second signal can be suppressed by means of the low-pass filter.

Such a low-pass filter is advantageous in one case when parasitic interference signals are generated as a result of a changeover operation between the two signals at the gate terminals of the field effect transistors, which interference signals can be reliably filtered out by means of such a low-pass filter.

In addition to the provision of a first and of a second switching element at the gate terminals of such a differential circuit, the first source/drain terminal of the first field effect transistor may be coupled to a third switching element, which can be switched by means of the first clock signal with the alternating frequency. Furthermore, the first source/drain terminal of the first field effect transistor may be coupled to a fourth switching element, which can be switched by means of the second clock signal, which is complementary to the first clock signal, with the alternating frequency.

As an alternative, provision may be made of a current source (for example an additional field effect transistor controlled with a bias voltage), which is coupled to the first source/drain terminal of the first field effect transistor and to the first source/drain terminal of the second field effect transistor.

Furthermore, the second source/drain terminal of the first field effect transistor may be coupled to a fifth switching element, which can be switched by means of the first clock signal with the alternating frequency. The second source/drain terminal of the second field effect transistor may be coupled to a sixth switching element, which can be switched by means of the second clock signal, which is complementary to the first clock signal, with the alternating frequency.

The transistor arrangement of the invention may be formed on and/or in a silicon on insulator substrate (SOI substrate).

In accordance with this refinement, the first field effect transistor and the second field effect transistor may be realized as SOI field effect transistors.

The invention's driving of the first and of the second field effect transistor with alternate first and second signals opens up important advantages some SOI applications. Apart from the reduction of the noise, in particular of the low-frequency noise, the advantageous effect that the floating body effect and self-heating effects are reduced additionally occurs in the case of SOI transistor arrangements of the invention. This is a significant improvement in particular for analog circuit technology using SOI CMOS technology.

This aspect of the invention utilizes characteristics of an SOI transistor under periodic switching conditions, see Jenkins, K. A. "Characteristics of SOI FETs Under Pulsed Conditions", IEEE Transactions on Electron Devices, Vol. 44, No. 11, 1997, Perron, L. M. "Switch-Off Behaviour of Floating-Body PD SOI-MOSFETs", IEEE Transactions on Electron Devices, Vol. 45, No. 11, 1998. If the switching frequency is increased, the charging or discharging current of the floating body in an SOI transistor, reflecting the intrinsic capacitive coupling in the device, limits the hole accumulation, driven by impact ionization. According to the invention this leads to a suppression of the body-source bias voltage and of the kink effect. This periodic switching operation of the SOI transistor enables a good linearity in the output characteristic (e.g. output conductivity). In addition, this operation permits the SOT transistor to be exposed less to the self-heating effect, see Tenbroek et al. "Impact of Self-Heating and Thermal Coupling on Analog Circuits in SOI CMOS", IEEE Journal of Solid-State Circuits, Vol. 33, No. 7, p. 1037, 1998.

However, this switching operation of the transistor is not always possible in analog/radiofrequency circuits. Only some analog circuits such as voltage controlled oscillators (VCO) or switched-capacitor circuits permit these switching conditions to be applied to them, a bias current only being required during specific time intervals or signal processing not taking place continuously.

The invention for the first time implements the realization of this switching condition in an analog circuit operated in a temporally continuous fashion. The S/D interchange is also possible for SC circuits.

The advantages of the transistor arrangement according to one embodiment of the invention become apparent to a particularly high degree when the first and the second field effect transistor are realized on and/or in a silicon-on-insulator substrate since, apart from the reduction of the noise, the floating body effect and the self-heating effect are reduced in the case of SOI substrates on account of the clocked operation of the two field effect transistors. The self-heating effect is reduced in particular because each of the two transistors is operated only for half of a clock cycle and has time to relax in the respective other half of the clock cycle, as a result of which thermal energy can be dissipated from the transistor and the transistor can be brought back to its normal operating temperature.

The transistor arrangement of the invention may be realized using analog circuit technology. In analog circuit technology, the floating body effect and self-heating occur to a great extent in the case of an SOI circuit arrangement, so that reducing the floating body effect and the self-heating effect is important in an analog circuit.

In accordance with one refinement of the transistor arrangement in the realization in and/or on an SOI substrate, at least one additional field effect transistor is provided. Each of the at least one additional field effect transistor has a first and a second source/drain terminal and having a control terminal, to which the first or the second signal can be applied. The transistor arrangement is set up in such a way that, in a first operating state, the first signal is applied to the control terminal of the first field effect transistor or of the second field effect transistor or of precisely one of the at least one additional field effect transistor and, simultaneously, the second signal is applied to the control terminals of all of the other field effect transistors. In subsequent operating states the first signal is applied progressively to the control terminal of in each case one of the remaining field effect transistors and, simultaneously, the second signal is applied to the control terminals of all of the other field effect transistors.

In other words, in accordance with this refinement compared with the prior art, an individual transistor (or the two transistors of a differential circuit) is replaced by three, four or more transistors. The first and second signals are then switched back and forth in a temporally variable manner between these transistors in such a way that, in the case of a respective one of the transistors, the first signal is applied to its control terminal, and the second signal is applied in the case of all the other transistors. Consequently, it is progressively possible for a respective one of the transistors to be operated as a transistor for processing the first signal (for example a useful signal), the second signal (for example another useful signal, the potential required for switching off the transistor or a reference potential) being provided to all the other transistors.

The transistor arrangement may have a clock generator unit which is coupled to the field effect transistors in such a way that it provides the signals to the field effect transistors alternately by means of clock signals that are shifted relative to one another.

In one case, such a clock generator unit may be provided in the transistor arrangement having more than two field effect transistors, the clock generator unit being coupled to the field effect transistors in such a way that it switches the field effect transistors between the first operating state and the subsequent operating states by means of providing clock signals that are shifted relative to one another.

In accordance with this refinement, the switching between different operating states is carried out with the aid of switching elements which can be controlled by means of a respective clock signal. The clock signals are shifted relative to one another in such a way that a clock signal with a logic value "1" is provided to a respective one of the field effect transistors at a specific point in time, whereas a clock signal with a logic value "0" is provided to all the other field effect transistors. This realization makes it possible to activate a respective one of the field effect transistors and to deactivate all the other field effect transistors with respect to a specific operating state.

In the case of the transistor arrangement, the clock generator unit may be set up in such a way that it prescribes the clock signals for reducing the heating of the field effect transistors formed on and/or in the silicon on insulator substrate and/or for reducing the floating body effect of the field effect transistors formed on and/or in the silicon on insulator substrate.

The transistor arrangement may be set up for reducing the two effects described by virtue of the fact that the switching frequency (or the clock signal) with which the two field effect transistors are operated alternately are coordinated with a value such that the charging or discharging parameters reduce the floating body effect and/or that the quiescent times of a transistor between adjacent active operation times are long enough to ensure that the transistor cools down sufficiently. The clock frequency may be chosen e.g. such that the quiescent time of one field effect transistor, during which the other field effect transistor is actively operated, suffices for dissipating the thermal energy to the surroundings. The setting of the clock signal parameters also influences the floating body effect, which can therefore be greatly reduced by a favorable choice of the clock signal parameters.

The integrated circuit according to the invention is described in more detail below. Refinements of the transistor arrangement also hold true for the integrated circuit.

The integrated circuit may be set up for example as a differential stage circuit, current source circuit, current mirror circuit or operational amplifier circuit. However, any other type of circuit is also possible provided that at least one transistor is present therein.

The method according to the invention for reducing the noise of field effect transistors is described in more detail below. Refinements of the transistor arrangement also hold true for the method for reducing the noise of field effect transistors.

In the case of the method, a gate terminal or a substrate terminal may be used as the control terminal.

In accordance with the method, by means of the alternating application of the first and second signals, the quasi-Fermi energy in the boundary region between channel region and gate insulating layer of the field effect transistors is periodically altered by a value which is greater, in one case significantly greater and in one case at least one order of magnitude greater, than the product of the Boltzmann constant and the absolute temperature.

In one case, by means of the alternating application of the first and second signals, the quasi-Fermi energy in the boundary region between channel region and gate insulating layer of the field effect transistors is periodically altered by between approximately 100 meV and approximately 1 eV. In another case, the quasi-Fermi energy is altered periodically by between approximately 150 meV and approximately 700 meV.

Exemplary embodiments of the invention are illustrated in the figures and are explained in more detail below.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1A illustrates a conventional n-MOS transistor and FIG. 1B illustrates a transistor arrangement that replaces the latter in accordance with a first exemplary embodiment of the invention, FIG. 2A illustrates a conventional p-MOS transistor and FIG. 2B illustrates a transistor arrangement that replaces the latter in accordance with a second exemplary embodiment of the invention, FIG. 3 illustrates a cross-sectional view of an integrated CMOS circuit according to the invention with an n-MOS transistor and a p-MOS transistor, FIG. 4A illustrates a conventional p-MOS transistor and FIG. 4B illustrates a transistor arrangement that replaces the latter in accordance with a third exemplary embodiment of the invention, FIGS. 16A to 18, FIGS. 20 to 24 illustrate current source circuits as integrated circuits in accordance with sixth to fourteenth exemplary embodiments of the invention, FIG. 32A and FIG. 32B illustrate differential stage circuits as integrated circuits in accordance with nineteenth and twentieth exemplary embodiments of the invention.

DETAILED DESCRIPTION

Figure 5A:
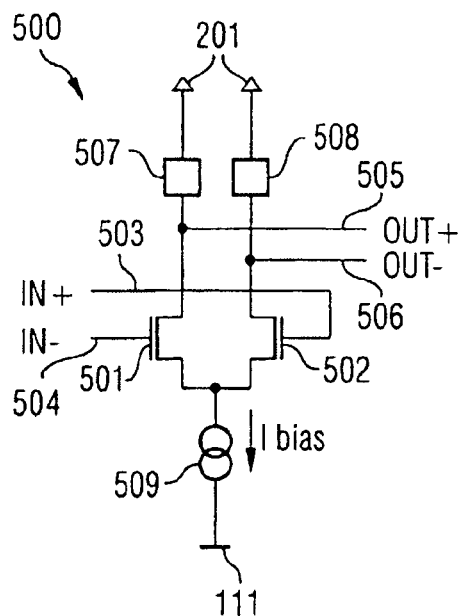
FIGS. 5A to 6B illustrate differential stages in accordance with the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1A illustrates a conventional n-MOS transistor 100 integrated in a silicon substrate 101. The n-MOS transistor 100 has a first source/drain terminal 102, a second source/drain terminal 103, a gate terminal 104 and a substrate terminal 105 (bulk terminal).

When operated in a circuit, the n-MOS transistor 100 makes a contribution to the low-frequency noise of the circuit.

FIG. 1B illustrates a transistor arrangement 110 in accordance with a first exemplary embodiment of the invention, in which the n-MOS transistor 100 is replaced according to the invention, so that low-frequency noise is suppressed.

In the case of the transistor arrangement 110, the n-MOS transistor 100 is replaced by a first and a second n-MOS replacement transistor 100a, 100b, which are in each case structurally identical to the n-MOS transistor 100, in particular have the same geometrical dimensions as the n-MOS transistor 100. The first source/drain terminals 102 of the n-MOS replacement transistors 100a, 100b are coupled to one another, the second source/drain terminals 103 of the two n-MOS replacement transistors 100a, 100b are coupled to one another and the substrate terminals 105 of the n-MOS replacement transistors 100a, 100b are coupled to one another. As can furthermore be seen from FIG. 1B, the gate terminal 104 from FIG. 1A is replaced by a first replacement gate terminal 104a as gate terminal of the first n-MOS replacement transistor 100a and by a second replacement gate terminal 104b as gate terminal of the second n-MOS replacement transistor 100b. The first replacement gate terminal 104a of the first n-MOS replacement transistor 100a is coupled to a first switch element 112a, which is controlled by means of a first clock signal $\phi_2$ applied to a first clock signal input 113a. Furthermore, the second replacement gate terminal 104b of the second n-MOS replacement transistor 100b is coupled to a second switch element 112b, which is controlled by means of a second clock signal $\phi_1$. The switch elements 112a, 112b are driven with the clock signals $\phi_1$ and $\phi_2$ that are in antiphase (as illustrated in FIG. 1B). As a result, a respective one of the replacement gate terminals 104a, 104b is brought to ground potential 111 and the respective other replacement gate terminal 104b, 104a is brought to the potential applied to a gate circuit node 114. If the electrical potential of the gate circuit node 114 is applied to a replacement gate terminal 104a, 104b of one of the transistors 100a, 100b, then the corresponding transistor 100a or 100b is brought to a conductive state and assumes an operating point in inversion. If, on the other hand, the electrical ground potential 111 is applied to the replacement gate terminal 104a, 104b of one of the transistors 100a or 100b, then the corresponding transistor 100a, 100b turns off and assumes an operating point in depletion or accumulation. It should be noted that the exact position of the operating point depends on the source/drain potentials. In one case, the electrical signals at the terminals of the transistor arrangement 110 are chosen in such a way that the quasi Fermi levels, which are designated hereinafter by $E_{inv}$ (for inversion) and $E_{depl/acc}$ (for depletion or accumulation), are sufficiently far apart from one another in energetic terms.

As is explained below, the low-frequency noise is reduced in the case of the transistor arrangement 110. An interface state whose energy level is close to $E_{inv}$ or $E_{depl/acc}$ endeavors to change its occupation state at said quasi Fermi level according to the random principle. This phenomenon leads to the low-frequency noise of the transistor since a charge carrier is taken from or fed to the channel current. The charge that is or is not present in the interface state furthermore modulates the channel current. The low-frequency noise of the transistor is reduced if the quasi Fermi level is periodically altered at the interface between channel region and gate insulating layer, in which case the energy difference should be large relative to $k_B T$. Furthermore, the reciprocal of the frequency of this change, that is to say of the signals $\Phi_1$ and $\phi_2$, is chosen to be shorter than the time constants of the relevant interface states which cause the low-frequency noise.

A transistor arrangement 200 in accordance with a second exemplary embodiment of the invention is described below referring to FIG. 2A, FIG. 2B.

FIG. 2A illustrates a conventional p-MOS transistor 210, which is connected up in an analogous manner to the n-MOS transistor 100.

FIG. 2B illustrates a transistor arrangement 200 in accordance with a second exemplary embodiment of the invention, in which the p-MOS transistor 210 is replaced according to the invention by a first p-MOS replacement transistor 210a and by a second p-MOS replacement transistor 210b.

In a departure from the configuration of FIG. 1B, now the gate potentials of the p-MOS replacement transistors 210a, 210b are switched between the potential of the gate circuit node 114 and a supply potential VDD 201. In accordance with this configuration, the p-MOS replacement transistors 210a, 210b turn off if the supply potential VDD 201 is present at their respective gate terminal 104a, 104b.

A description is given below, referring to FIG. 3A, FIG. 4A, FIG. 4B, of a further variant as to how, according to the invention, the low-frequency noise is reduced by means of a sufficiently rapid change of the quasi Fermi levels of the transistors used. In accordance with this variant, the operating point can be set by means of driving the relevant transistor or transistors via well terminals. Consequently, the alternative described can be applied for transistors which are realized in a dedicated well.

Firstly, an explanation is given below, referring to the integrated circuit 300 from FIG. 3 of what is understood by a bulk terminal or a well terminal (examples of the substrate terminal).

The n-MOS transistor 100 is integrated in a first surface region of a p-doped silicon substrate 301. Said n-MOS transistor contains one n-doped surface region as first source/drain region 302, another n-doped surface region as second source/drain region 303 and a p-doped substrate region 304. A gate insulating layer 305 made of silicon oxide is applied on a surface region of the p-doped substrate 301 between the source/drain regions 302, 303, a metallically conductive gate region 306 (e.g. made of highly doped polysilicon, made of aluminum or made of tungsten) being formed on said gate insulating layer. The gate region 306 is coupled to the gate terminal 104, the first source/drain region 302 is coupled to the first source/drain terminal 102, the second source/drain region 303 is coupled to the second source/drain terminal 103 and the p-doped substrate region 304 is coupled to a bulk terminal 307.

Furthermore, the p-MOS transistor 210 is integrated in the p-doped silicon substrate 301. In order to form said p-MOS transistor in the p-doped silicon substrate 301, an n-doped well region 308 is previously formed in a surface region of the p-doped silicon substrate 301. First and second source/drain regions 309, 310 are formed as p-doped regions in the n-doped well region. A gate insulating layer 311 is formed between the source/drain regions 309, 310, a gate region 312 being formed on said gate insulating layer. A further n-doped substrate region 313 in the n-doped well region 308 is coupled to a well terminal 314. Furthermore, the first source/drain region 309 is coupled to the first source/drain terminal 102, the second source/drain region 310 is coupled to the second source/drain terminal 103 and the gate region 312 is coupled to the gate terminal 104.

As illustrated schematically in FIG. 3, the use of a p-doped substrate 301 is the general case in many CMOS processes, so that firstly an n-doped well region 308 is to be formed in order to form p-MOS transistors 210 in the p-doped substrate 301. By contrast, n-MOS transistors 100 can be formed directly in a p-doped substrate 301.

It should be noted that the following embodiments referring to FIG. 4A, FIG. 4B, in which the operating point is changed over between inversion and depletion or accumulation by means of a well terminal 314, are illustrated and explained in each case for p-MOS transistors. However, this interconnection is also possible for n-MOS transistors. This is because, on the one hand, processes on the basis of an n-doped substrate exist in which a p-MOS transistor can be formed directly in a substrate, whereas an n-MOS transistor is then fabricated in a p-doped well. In the case of such processes, the principle of changing over the operating point between inversion and depletion or accumulation by means of a well terminal is possible for n-MOS transistors. On the other hand, modern CMOS processes permit the fabrication of n- and p-MOS transistors in a dedicated well. If such processes are carried out for example on the basis of a p-doped substrate, then the p-MOSFET is situated there in an n-type well, whereas the n-MOSFET is situated in a p-type well, which is in turn situated in a superordinate n-type well. In this case, it is possible to change over the operating point between inversion and accumulation or depletion by means of the well terminal for n- and p-MOS transistors.

A transistor arrangement 400 in accordance with a third exemplary embodiment of the invention is described below referring to FIG. 4A, FIG. 4B.

FIG. 4A once again illustrates the conventional p-MOS transistor 210 illustrated in FIG. 2A.

In the case of the transistor arrangement 400 illustrated in FIG. 4B, the p-MOS transistor 210, in a manner similar to that in FIG. 2B, is replaced by a first and a second p-MOS replacement transistor 210a, 210b. In contrast to FIG. 2B, however, in accordance with FIG. 4B a common gate terminal 104 is provided for the two p-MOS replacement transistors 210a, 210b. By contrast, in the case of the transistor arrangement 400, the substrate terminals (that is to say the well terminals) of the two transistors 210a, 210b are provided separately from one another.

By means of a first replacement substrate terminal 105a, the substrate or well terminal of the first p-MOS replacement transistor 210a is coupled to a first switch element 112a. The first replacement substrate terminal 105a is switched back and forth between the supply voltage potential VDD 201 and a reference voltage V0 (which is negative relative to VDD in accordance with the exemplary embodiment described) by means of the switch element 112a, which is controlled by a first clock signal $\phi_2$. Furthermore, the potential of the well terminal of the second p-MOS replacement transistor 210a is switched back and forth between the supply potential 201 VDD and the reference voltage V0 by means of a second replacement substrate terminal 105b and a second switch element 112b coupled thereto. The second switch element 112b is controlled by means of a second clock signal $\phi_1$, which is in antiphase with respect to the first clock signal $\phi_2$.

According to the invention, the p-MOS transistor 210 in the circuit is replaced by the two p-MOS replacement transistors 210a and 210b, which are in each case structurally identical to the p-MOS transistor 210, in one case have the same geometrical dimensions as the p-MOS transistor 210. Once again the first source/drain terminals 102 of the p-MOS replacement transistors 210a, 210b, are coupled to one another, the second source/drain terminal 103 of the p-MOS replacement transistors 210a, 210b are coupled and the gate terminals of said transistors 210a, 210b are coupled to one another. The well terminals 105a, 105b of the p-MOS replacement transistors 210a, 210b are switched by means of the switch elements 112a, 112b in each case alternately between the supply potential 201 VDD as positive operating voltage and the reference voltage V0 as a negative voltage relative to VDD. The reference voltage V0 is not necessarily a constant voltage, but rather may also be derived from other potentials within the circuit, for example, from the potential at the second source/drain terminal 103 of the transistors 210a, 210b. Furthermore, instead of the supply potential VDD, it is also possible to use a voltage greater than VDD provided that such a voltage is available. Furthermore, instead of the supply potential 201 VDD, it is possible to use a regulated voltage, that is to say a voltage that is derived from other potentials within the circuit. Since it is generally favorable, however, for the difference between the two voltages for driving the wells to be kept as large as possible, it is often advantageous for practical reasons to choose the highest potential available in the given application for one of the two voltages, that is to say also not to regulate these voltages. For the reference voltage V0, the boundary condition should be complied with that the difference between the potential of a source/drain terminal and the potential V0 should be less than approximately 0.6 V to 0.7 V, so that an excessively large current does not flow through the diode (pn junction) formed between well and source/drain region. The value of 0.6 V to 0.7 V results from the threshold voltage of the diode formed by means of the pn junction. The potentials are to be applied in such a way that the diode formed between a source/drain region and the well region (or channel region) is essentially not forward-biased.

The switch elements 112a, 112b are driven by means of the clock signals $\phi_1$, $\phi_2$ that are complementary to one another. If the well node 105a of the transistor 210a or the well node 105b of the transistor 210b is coupled to the reference voltage V0, then the associated transistor is electrically conductive and assumes an operating point in inversion. If the well node 105a or 105b is coupled to the supply potential 201 VDD, then the associated transistor turns off and assumes an operating point in depletion or accumulation, the exact position of the operating point again depending on the potential at the source terminal 103.

The noise suppression mechanism is effected in a manner analogous to that described with reference to FIG. 1A to FIG. 2B. In order to attain an effective noise reduction, the reciprocal of the frequency of the signals $\phi_1$, $\phi_2$ is chosen to be shorter than the time constants of the interface states which cause the low-frequency noise. In other words, the frequency of the clock signals $\phi_1$, $\phi_2$ is chosen to be sufficiently high. Furthermore, the difference in the gate-source voltages between the two states should be large enough to significantly alter the quasi Fermi level in the transistor, in one case large with respect to $k_B T$.

Exemplary embodiments of the integrated circuit according to the invention are described below.

For this purpose, in each case a description is given firstly of a realization of a respective circuit (in one case differential stage, current source, current mirror and operational amplifier) in accordance with the prior art, and in each case subsequently of an example of a realization according to the invention in which low-frequency noise is suppressed by virtue of noise-critical transistors being replaced by a transistor arrangement according to the invention.

FIG. 5A illustrates a differential stage 500 having a first and a second n-MOS input transistor 501, 502 which is known from the prior art. The differential stage 500 contains differential first and second inputs 503, 504 IN+, IN– and differential first and second outputs 505, 506 OUT+, OUT–. Furthermore, further circuit elements in the form of abstracted first and second load elements 507, 508 and a current source 509 Ibias are provided.

Figure 5B:
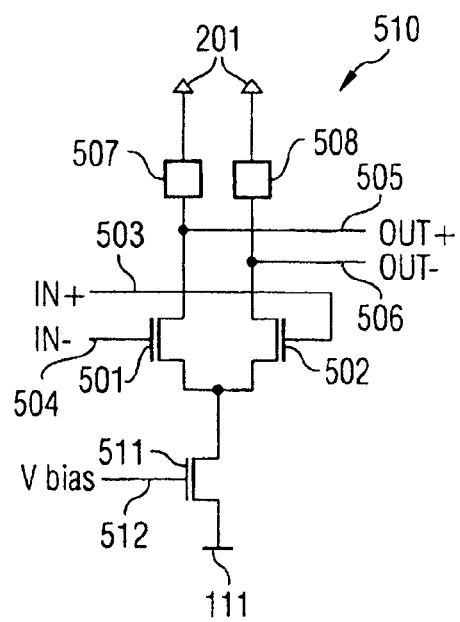

The differential stage 510 in accordance with the prior art as illustrated in FIG. 5B differs from the differential stage 500 by virtue of the fact that the current source 509 is embodied by means of an n-MOS current source transistor 511, to the gate terminal of which a bias voltage 512 Vbias is applied.

Figure 6A:
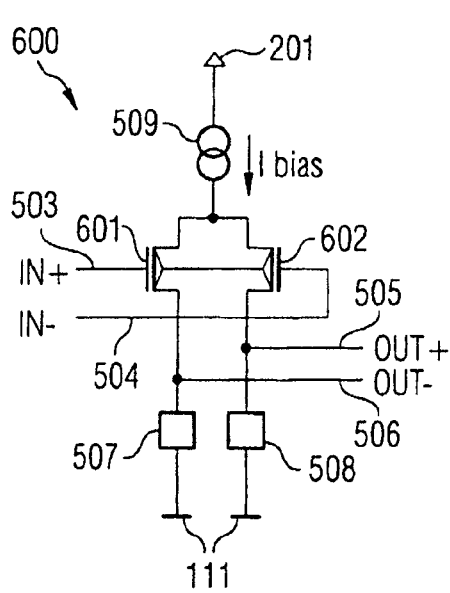

The differential stage 520 in accordance with the prior art as illustrated in FIG. 6A differs from the differential stage 500 essentially by virtue of the fact that first and second p-MOS input transistors 601, 602 are used as input transistors. Furthermore, in FIG. 6A, the well terminal of the p-MOS input transistors 521, 522 is coupled to a common source node of said transistors. Instead of the ground potential 111, the supply potential 201 is applied to a terminal of the current source 509 in FIG. 6A.

Figure 6B:
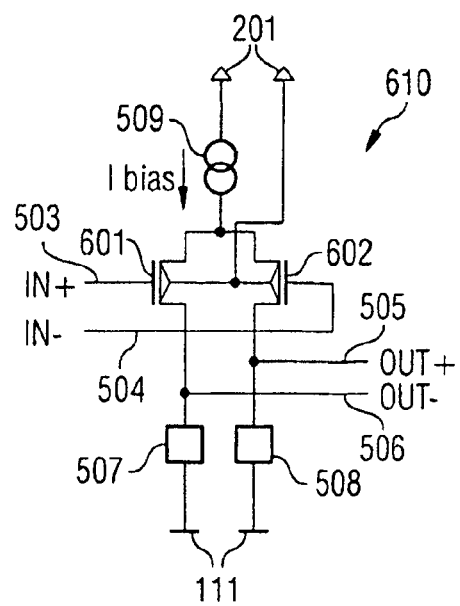

In the case of the differential stage 610 known from the prior art as illustrated in FIG. 6B, the well terminals of the first and second p-MOS input transistors 601, 602 are fixedly at the positive operating voltage, that is to say at the supply potential 201, in a departure from the differential stage 600.

A description is given below, referring to FIG. 7, of a differential stage 700 as an integrated circuit in accordance with a first exemplary embodiment of the invention.

In the case of the differential stage 700, the principle according to the invention is applied for reducing the noise of transistors in relation to the differential stage 500 from FIG. 5A. For this purpose, the first n-MOS input transistor 501 is replaced by a first and a second n-MOS replacement input transistor 501a, 501b, and the second n-MOS input transistor 502 is replaced by a third and by a fourth n-MOS replacement input transistor 502a, 502b. By means of the first and second clock signal inputs 113a, 113b, using first to eighth switching transistors 701 to 708, alternate signals are applied to the gate terminals of the transistors 501a, 501b and 502a, 502b in the manner illustrated in FIG. 7. If the circuits from FIG. 7 and FIG. 5A are intended to have essentially identical electrical properties with regard to shunt current, transconductance and driver capability, the dimensions of the first to fourth n-MOS replacement input transistors 501a, 501b, 502a, 502b are to be provided in the same dimensions as the n-MOS input transistors 501, 502. Clearly, the gate terminals of the n-MOS replacement input transistors 501a, 501b, 502a, 502b are alternately switched back and forth between the potentials of the respective input 503 or 504 and the ground potential 111, which is realized by means of the first to eighth switching transistors 701 to 708. The switching transistors 701 to 708 are in turn driven by means of the mutually complementary clock signals $\phi_1$ and $\phi_2$, the clock signals $\phi_1$ and $\phi_2$ having a duty cycle ratio of approximately 50%.

If, by way of example, the potential of the second clock signal $\phi_1$ is at VDD potential, and that of the first clock signal $\phi_2$ is at ground potential, the first, fourth, fifth and eighth switching transistors 701, 704, 705, 708 turn on, whereas the second, third, sixth and seventh switching transistors 702, 703, 706, 707 turn off, so that the gate terminals of the first and third n-MOS replacement input transistors 501a, 502a are coupled to the inputs 503, 504 IN+, IN− of the differential stage 700, so that these transistors 501a, 502a carry current and are operated in inversion. By contrast, the gate terminals of the second and fourth n-MOS replacement input transistors 501b, 502b are at ground potential 111, so that these transistors 501b, 502b are free of current and are operated in depletion or accumulation. A change in the second clock signal $\phi_1$ to ground potential and in the first clock signal $\phi_2$ to VDD potential has the effect that the second and fourth n-MOS input transistors 501b, 502b are coupled to the inputs 503, 504 IN+, IN− of the differential stage 700 and are thus operated in inversion. By contrast, the first and third n-MOS replacement input transistors 501a, 502a are operated in depletion or accumulation. A sufficiently rapid switching of the first and second clock signals $\phi_1$ and $\phi_2$, back and forth between ground potential and VDD potential has the effect that the noise contributions of the transistors are reduced according to the invention.

It should be noted that, in the case of the differential stage 700, on average over time, an input current Icg flows into the circuit, said input current being calculated in accordance with $$Icg = Vg,on \times f \times (Cg501a + Cg501b) \quad (1)$$

where f is the frequency of the clock signals $\phi_1$ and $\phi_2$, Vg,on is the voltage present at the gate terminal of the input transistors if the latter are in the on state, and Cg501a+Cg501b is the sum of the gate capacitances of the first and second n-MOS replacement input transistors 501a, 501b (which is identical to the sum of the gate capacitances of the third and fourth n-MOS replacement input transistors 502a, 502b).

In the case of even more precise modeling, it would be necessary to take account of the sum of the integrals of the gate capacitances over the voltage range swept over during clocked operation according to the invention of the transistors, which leads to a somewhat lower value for the sum of the capacitances. The gate capacitance is approximately constant in strong inversion and in strong accumulation, but in depletion operation a relatively great voltage dependence and a reduction compared with the values in inversion and accumulation are apparent.

Applying a standpoint known from switched-capacitor circuit technology, as is described for example in R. Gregorian, G. C. Temes, "Analog MOS Integrated Circuits", NY, John Wiley & Sons, 1986 to P. R. Gray, R. G. Meyer, "Analysis and design of analog integrated circuits," NY, John Wiley & Sons, 1993, the operation of the differential stage 700 has an effect as if a nonreactive resistance R of magnitude $$R = Vg,on/Icg = 1/[f \times (Cg501a + Cg501b)] \quad (2)$$

were present at the input of the circuit. It can be assumed that the total input impedance of the circuit 700 decreases compared with the circuits from FIG. 5A to FIG. 6B, or the input impedance is no longer purely capacitive but rather contains a resistive contribution in addition to its capacitive component.

Figure 8:
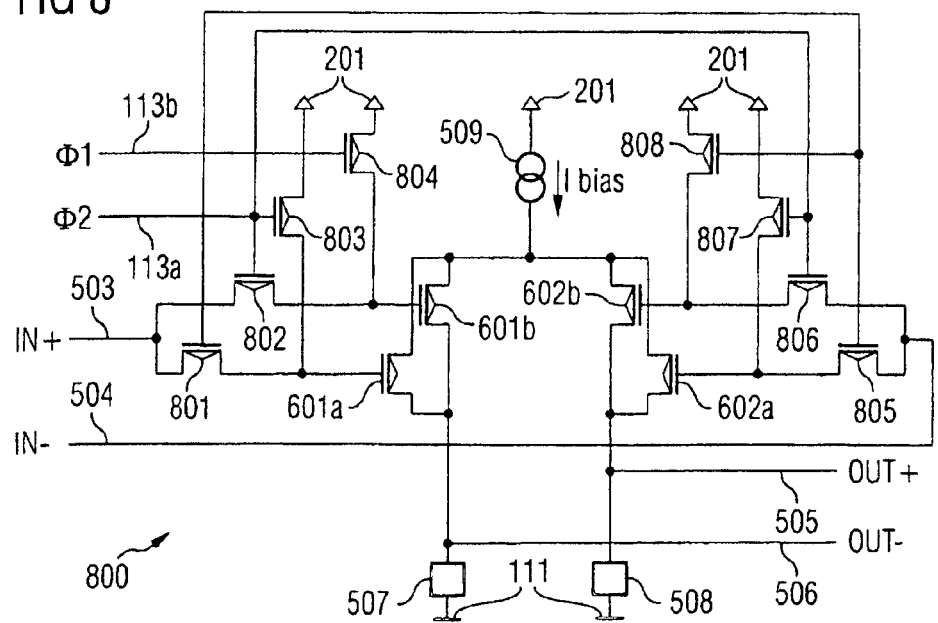

The differential stage 800 illustrated in FIG. 8 as an integrated circuit in accordance with a second exemplary embodiment of the invention constitutes a realization according to the invention of the differential stage 600 from FIG. 6A with reduced low-frequency noise.

Figure 7:
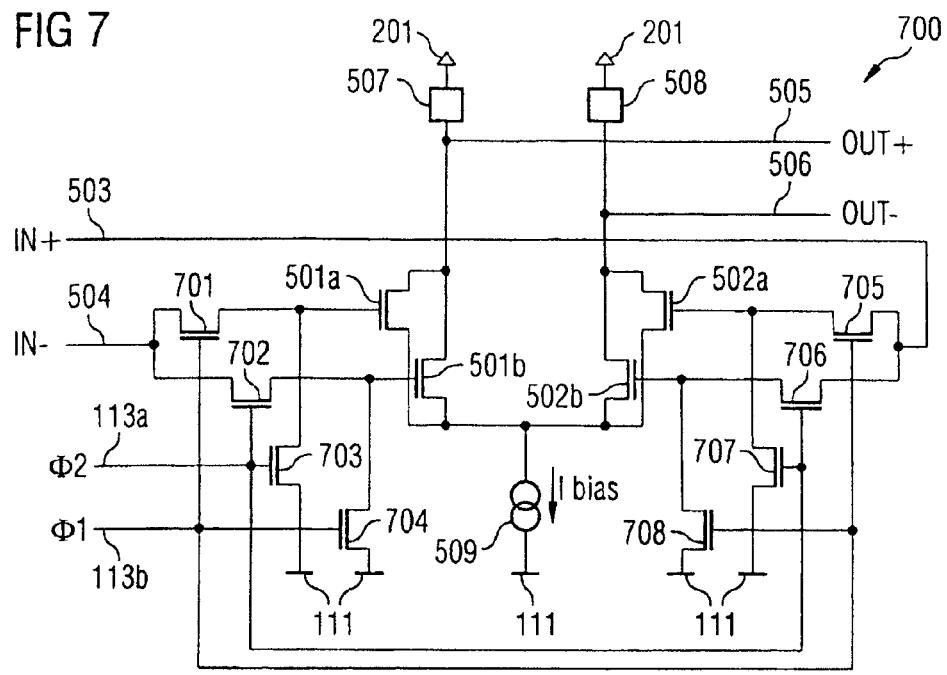
FIGS. 7 to 11 illustrate differential stages as integrated circuits in accordance with first to fifth exemplary embodiments of the invention.

In other words, the differential stage 800 is a complementary variant of the differential stage 700 since the differential stage 800 uses p-MOS transistors instead of the n-MOS transistors used in FIG. 7. In one case, the first p-MOS input transistor 601 from FIG. 6A is replaced by a first and a second p-MOS replacement input transistor 601a, 601b and connected up in the manner according to the invention. Furthermore, the second p-MOS input transistor 602 from FIG. 6A is replaced by a third and a fourth p-MOS replacement input transistor 602a, 602b and connected up according to the invention. Moreover, instead of the first to eighth n-MOS switching transistors 701 to 708, the first to eighth p-MOS switching transistors 801 to 808 are correspondingly provided, which correspond to the switching transistors 701 to 708 in accordance with their functionality. It should be noted, that in the case of the differential stage 800, the first and second p-MOS replacement switching transistors 601a, 601b have gate terminals that are separate from one another, that is to say that the operating point of these transistors is set by means of applying alternate signals to the gate terminals thereof.

Figure 9:
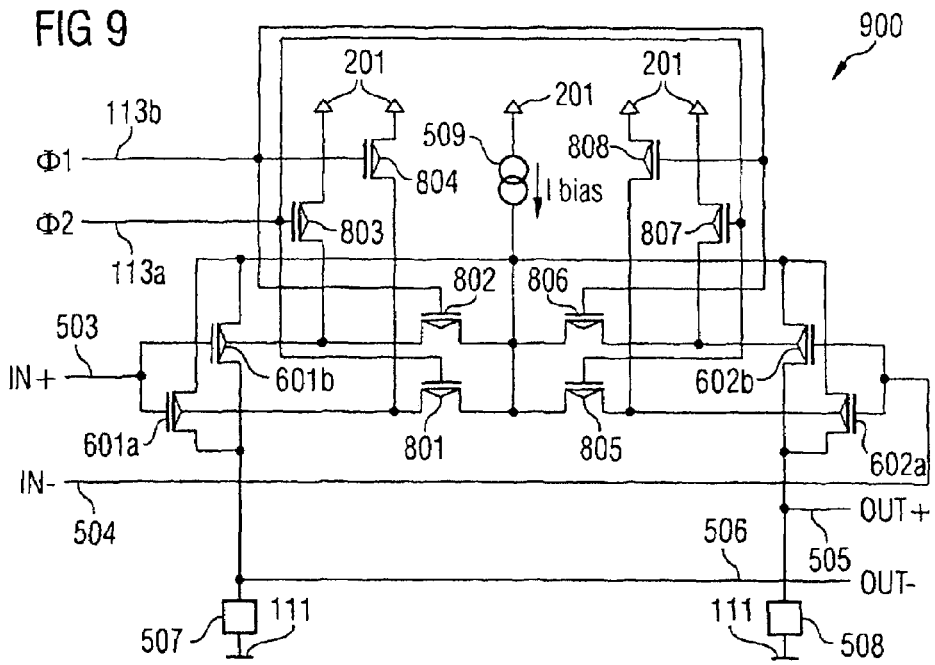

In the case of the differential stage 900 illustrated in FIG. 9 as an integrated circuit in accordance with a third exemplary embodiment of the invention, the interconnection is similar to that in the case of the differential stage 800 in FIG. 8 with the difference that the first and second p-MOS replacement input transistors 601a, 601b are coupled at the gate terminals thereof, whereas their well terminals are provided separately from one another and are switched to alternate potentials by means of the clock signals $\phi_1$ and $\phi_2$. The same applies analogously to the third and fourth p-MOS replacement input transistors 602a, 602b. In the case of the differential stage 900 illustrated in FIG. 9, therefore, the changeover of the p-MOS replacement input transistors 601a, 601b, 602a, 602b between inversion operation and depletion or accumulation operation is not effected by driving these transistors via their gate terminal, but rather via their well terminal. These are switched back and forth here between one source/drain potential of the transistors and the supply potential 201 VDD using the first to eighth p-MOS switching transistors 801 to 808 and also the clocked control signals $\phi_1$ and $\phi_2$.

With differential stage 900, the switching signals $\phi_1$ and $\phi_2$ cannot couple over directly onto the input signals at the inputs 503, 504 IN+, IN− via the first to eighth p-MOS switching transistors 801 to 808. Furthermore, the differential stage 900 avoids the situation in which the input impedance contains quasi-resistive components.

Figure 10:
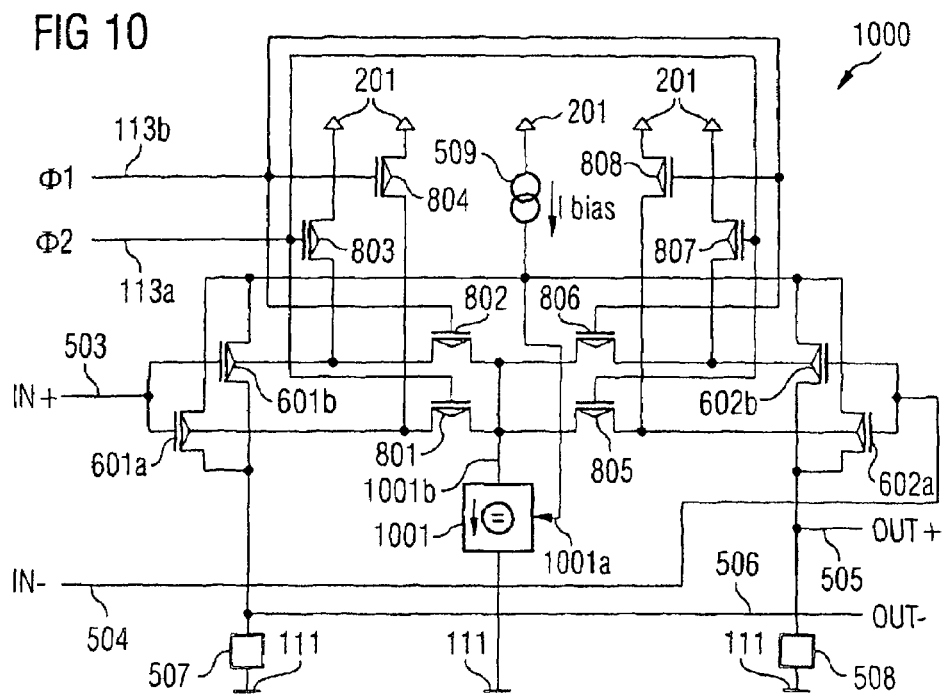

A description is given below, referring to FIG. 10, of a differential stage 1000 as an integrated circuit in accordance with a fourth exemplary embodiment of the invention.

The differential stage 1000 differs from the differential stage 900 essentially by virtue of the fact that a regulating circuit 1001 is provided, at the input 1001a of which one source/drain potential of the first to fourth p-MOS replacement input transistors 601a, 601b, 602a, 602b is present, the regulating circuit 1001 being used to generate a value which is offset by a negative voltage contribution $\Delta V$ with respect to said source/drain potential and is used (given activated p-MOS switching transistors 801, 802, 805 and 806) for driving the well potentials of the first to fourth p-MOS replacement input transistors 601a, 601b, 602a, 602b. The difference between the well potentials by means of which the input transistors 601a, 601b, 602a, 602b are switched back and forth between inversion and accumulation is therefore even greater in the case of the differential stage 1000 than in the case of the differential stage 900. Therefore, the differential stage 1000 has a sufficiently large signal swing occurring at the respective well terminals of the input transistors 601a, 601b, 602a, 602b, which results from the fact that the difference between VDD and the other potential applied to the well terminal of the input transistors 601a, 602b is sufficiently large. A reliable setting of the operating point of the transistors is thus ensured.

Figure 11:
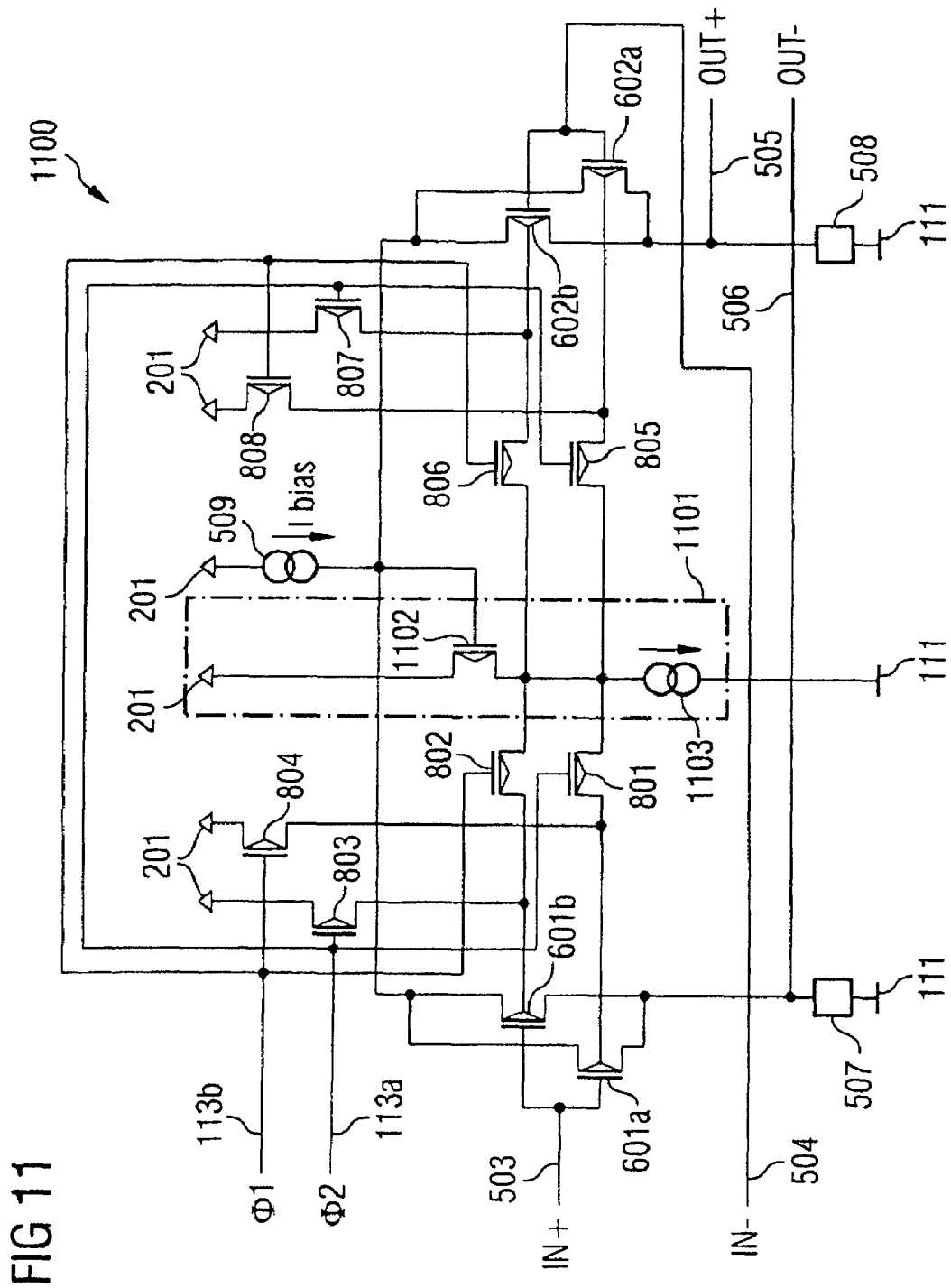

A description is given below, referring to FIG. 11, of a differential stage 1100 as an integrated circuit in accordance with a fifth exemplary embodiment of the invention.

The differential stage 1100 differs from the differential stage 1000 essentially in that the regulating circuit 1001 is configured as a source follower circuit 1101 in the case of the differential stage 1100. The source follower circuit 1101 contains an auxiliary transistor 1102, the gate terminal of which is coupled to the current source 509, and contains another current source 1103. The value of the voltage offset $\Delta V$, generated by means of the regulating circuit 1101 or the source follower transistor 1102, can be set by means of setting the geometrical parameters of the auxiliary transistor 1102 and by means of setting the value of the current of the other current source 1103.

The noise of the current source 509 Ibias is discussed below, or the noise of the transistor or transistors with which said current source 509 is realized (e.g. the n-MOS current source transistor 511 from FIG. 5B). This noise to a good approximation makes no contribution to the noise of the output signal of the differential stage since it is fed in equal portions and in correlated fashion into both branches of the stage. Consequently this parameter represents a common-mode contribution that is not manifested appreciably in the output signal. In this respect, circuitry means for suppressing the noise of the components with which the current source 509 is realized are not usually necessary or have only a negligible influence on the performance of the differential stage with regard to a further improvement of its noise properties. It should be noted, however, that the current source 509 may also as required be subjected to noise suppression according to the invention.

The properties of the load elements 507, 508 may, by contrast, have an effect on the overall noise of the differential stages in accordance with the exemplary embodiments of the invention described with reference to FIG. 7 to FIG. 11. Here circuitry approaches for suppression may mean a gain in performance.

A description is given below firstly, referring to FIG. 12A to FIG. 15B, of current sources in accordance with the prior art and subsequently, referring to FIG. 16A to FIG. 24, of current sources with the transistor arrangement according to the invention for reducing the low-frequency noise of such circuits.

Figure 12A:
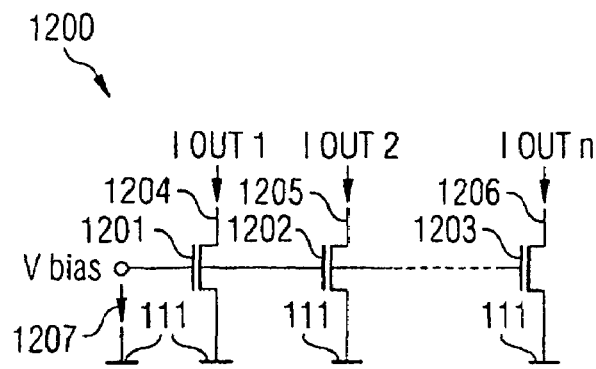
FIGS. 12A to 15B illustrate current source circuits in accordance with the prior art.

FIG. 12A illustrates a current source circuit 1200 in accordance with the prior art.

Said current source circuit has first to n-th current source transistors, the first current source transistor 1201, the second current source transistor 1202 and the n-th current source transistor 1203 of which are illustrated in FIG. 12A. Each of the current source transistors is coupled at one of the two source/drain terminals to an associated one of n output terminals, a first output 1204, a second output 1205 and an n-th output 1206 of which are illustrated in FIG. 12A. The first source/drain terminal of all the current source transistors 1201 to 1203 are generally at ground potential 111, a bias voltage 1207 Vbias is applied to the gate terminals of all the current source transistors 1201 to 1203, and the second source/drain terminal of the current source transistors are coupled to the outputs 1204 to 1206. In order that the current source circuit 1200 has a current source character, that is to say that the output current or the output currents at the outputs 1203 to 1206 exhibits or exhibit no or at most a small dependence on the applied output voltage or the applied output voltages, the transistors 1201 to 1203 are to be operated in the saturation region, that is to say that the condition is to be met that the applied source/drain voltages are at least as high as the difference between the bias voltage Vbias 1207 and the threshold voltage Vt of the transistors 1201 to 1203. The above statement holds true for Vbias>Vt, that is to say for an operating point at which one of the transistors 1201 to 1203 (or to put it more precisely part of the channel of the respective transistor 1201 to 1203) is operated in inversion.

Furthermore, a current source character also results for specific conditions in the subthreshold region under the condition Vbias<Vt, in the case of which inversion prevails nowhere in the entire transistor. This operating region is characterized in that the currents considered for a given geometry of the transistor, are significantly (up to two or more decades) lower than in inversion operation, and that this operating region is of interest in only few specific analog circuits.

Transistors 1201 to 1203 having channel regions of identical length are usually used in a current source circuit 1200 as illustrated in FIG. 12A. By means of setting the width of the transistors 1201 to 1203, it is then possible to define the ratio of the output currents.

FIG. 12B to FIG. 12E illustrate bias voltage generating circuits 1210, 1220, 1230 and 1240, by means of which the bias voltage Vbias 1207 can be generated if it is not applied directly. Each of the bias voltage generating circuits illustrated in FIG. 12B to FIG. 12E is provided with a converter transistor 1211, which acts as a current-voltage converter since one of its source/drain nodes is coupled to its gate node. In one case, the converter transistor 1211 forms a current mirror with the respective current source transistor 1201 to 1203.

Figure 12B:
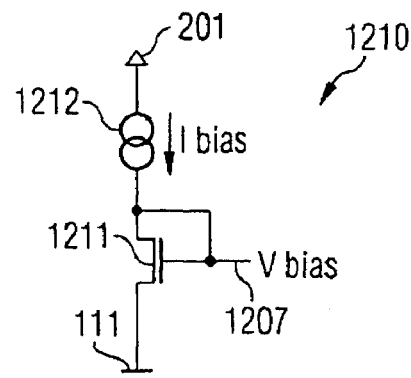

In the case of the bias voltage generating circuit 1210 from FIG. 12B, the current through the converter transistor 1211 is supplied by means of a current source 1212 Ibias.

Figure 12C:
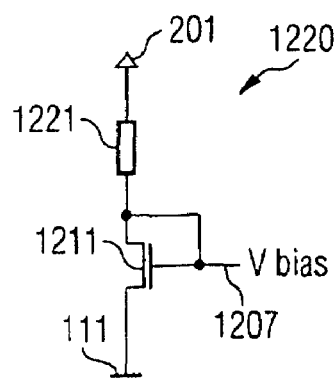
Figure 12D:
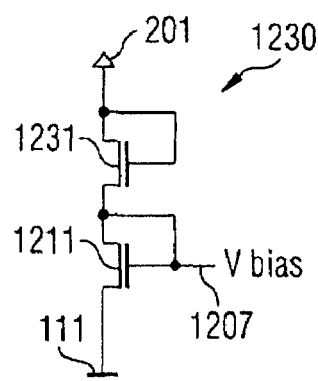
Figure 12E:
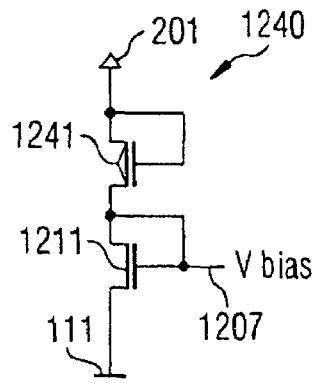

In the case of the bias voltage generating circuits 1220, 1230, 1240 illustrated in FIG. 12C to FIG. 12E, a load element is arranged between the gate or one of the source/drain nodes of the converter transistor 1211 and the supply voltage 201 (positive supply voltage), which load element is configured as a nonreactive resistor 1221 in FIG. 12C, as an n-MOS load transistor 1231 in FIG. 12D, and as a p-MOS load transistor 1241 in FIG. 12E.

Figure 13:
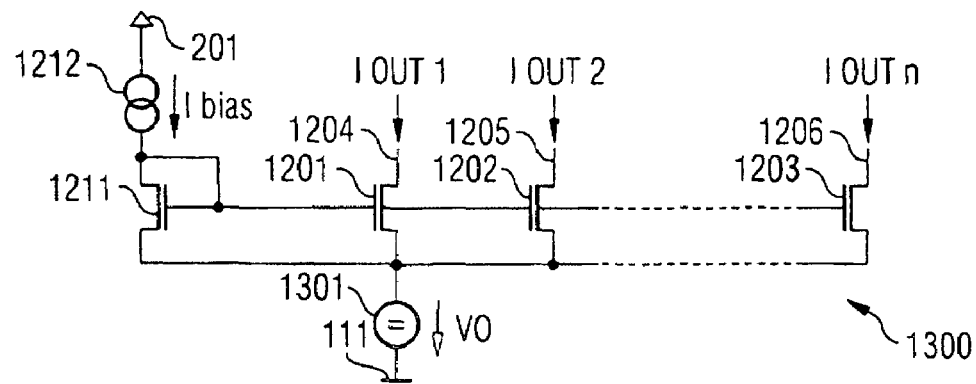

FIG. 13 illustrates a current source circuit 1300 in accordance with the prior art (can also be used as a current mirror circuit), in which the common source/drain potential of all the current source transistors 1201 to 1203 is brought to a value that is different from the electrical ground potential 111. This potential is provided by means of a voltage source 1301 V0 connected between the electrical ground potential 111 and the common source/drain terminal of all the transistors 1201 to 1203. The statement made with respect to FIG. 12A to FIG. 12E holds true with regard to the supply of all the current source transistors 1201 to 1203 with a common gate potential. In one case, the generation of the bias voltage 1207 Vbias in FIG. 13 can be realized in a manner similar to that in FIG. 12B.

Figure 14A:
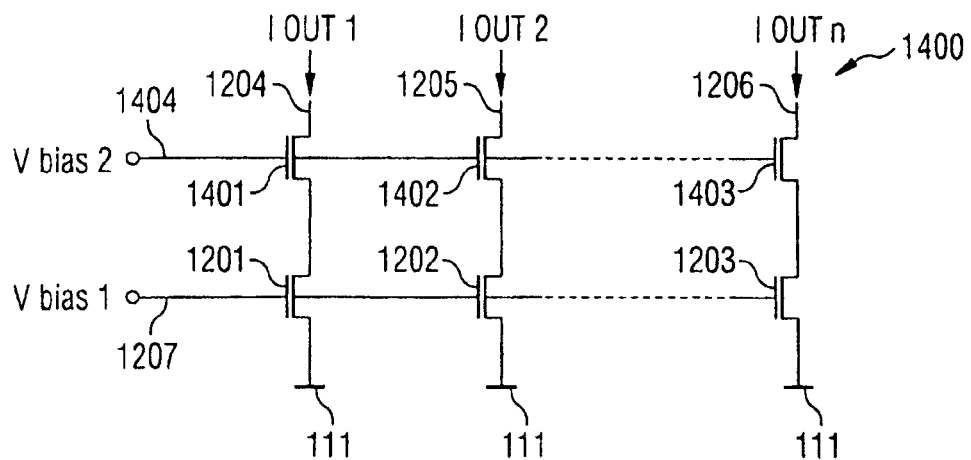

The cascaded current source circuit 1400 in accordance with the prior art as illustrated in FIG. 14A is described below.

In addition to the components of the current source circuit 1200 from FIG. 12A, in the case of the cascaded current source circuit 1400 a further n transistors (cascode transistors) are provided, the (n+1)-th cascode transistor 1401, the (n+2)-th cascode transistor 1402 and the 2n-th cascode transistor 1403 of which are illustrated in FIG. 14A. Furthermore, another bias voltage 1404 Vbias2 is provided in addition to the bias voltage 1207 Vbias (designated as Vbias1 in FIG. 14A) the other bias voltage 1404 being applied to all the gate terminals of the cascode transistors 1401 to 1403. The source/drain terminals of the cascode transistors 1401 to 1403 are connected between a respective source/drain terminal of a respective one of the current source transistors 1201 to 1203 and a respective one of the outputs 1204 to 1206.

In the cascading from FIG. 14A, unlike the circuit from FIG. 12A, has the differential output impedance, which is an important parameter for the assessment of the quality of a current source, that is greater in the case of the cascaded current source circuit 1400, that is to say that the current source properties are better pronounced. Details on the method of operation of the circuit illustrated in FIG. 14A can be found in R. Gregorian, G. C. Temes, "Analog MOS Integrated Circuits", NY, John Wiley & Sons, 1986 to A. B. Grebene, "Bipolar and MOS analog integrated circuit design", NY, John Wiley & Sons, 1984, for example.

Figure 14B:
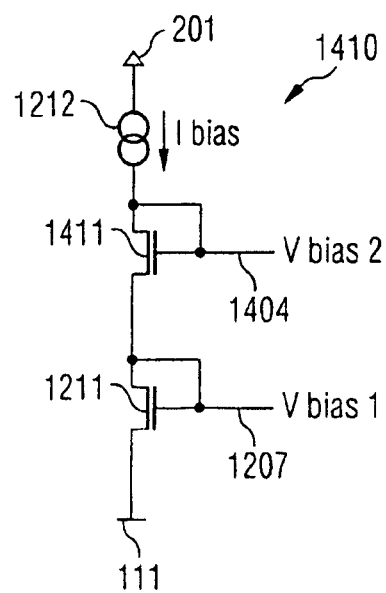

In the case of the cascaded bias voltage generating circuit 1410 from FIG. 14B for the generation of Vbias1 and Vbias2, in addition to the components of the bias voltage generating circuit 1210 from FIG. 12B, another converter transistor 1411 (connected up in a manner similar to the converter transistor 1211) is provided in order to generate the other bias voltage 1404 Vbias2.

Figure 14C:
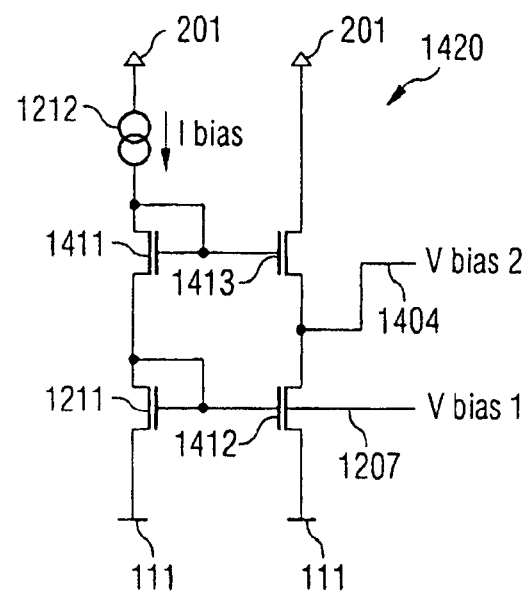

The cascaded bias voltage generating circuit 1420 from FIG. 14C contains first and second auxiliary transistors 1412 and 1413 in addition to the components of the cascaded bias voltage generating circuit 1410.

Figure 15A:
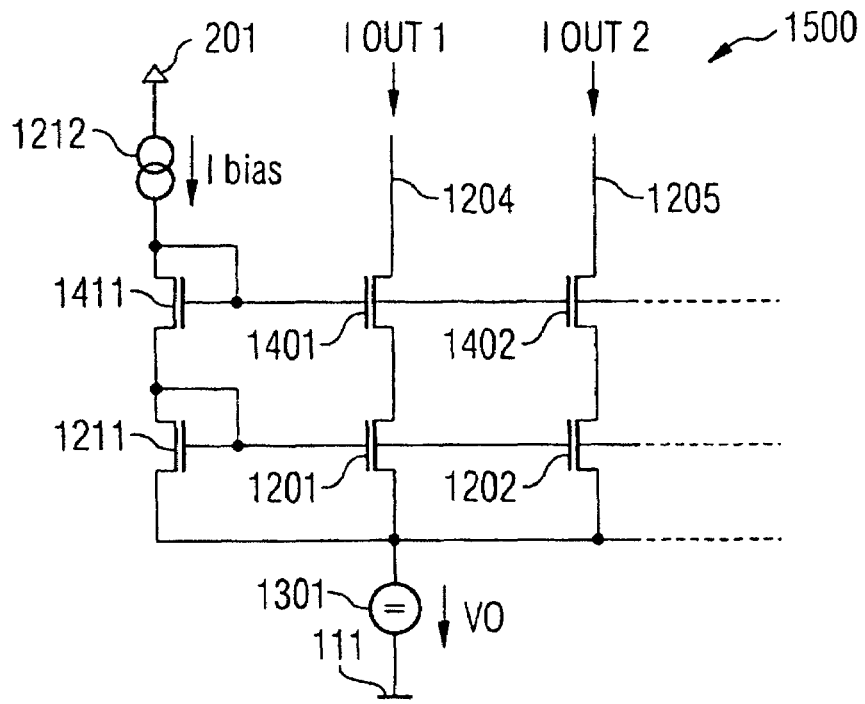

The current source circuit 1500 illustrated in FIG. 15A constitutes a combination of the circuits from FIG. 14A and FIG. 14B. The combination of the circuits from FIG. 14A and FIG. 14B produces the functionality of a current mirror circuit given adequate dimensioning of the transistors.

Figure 15B:
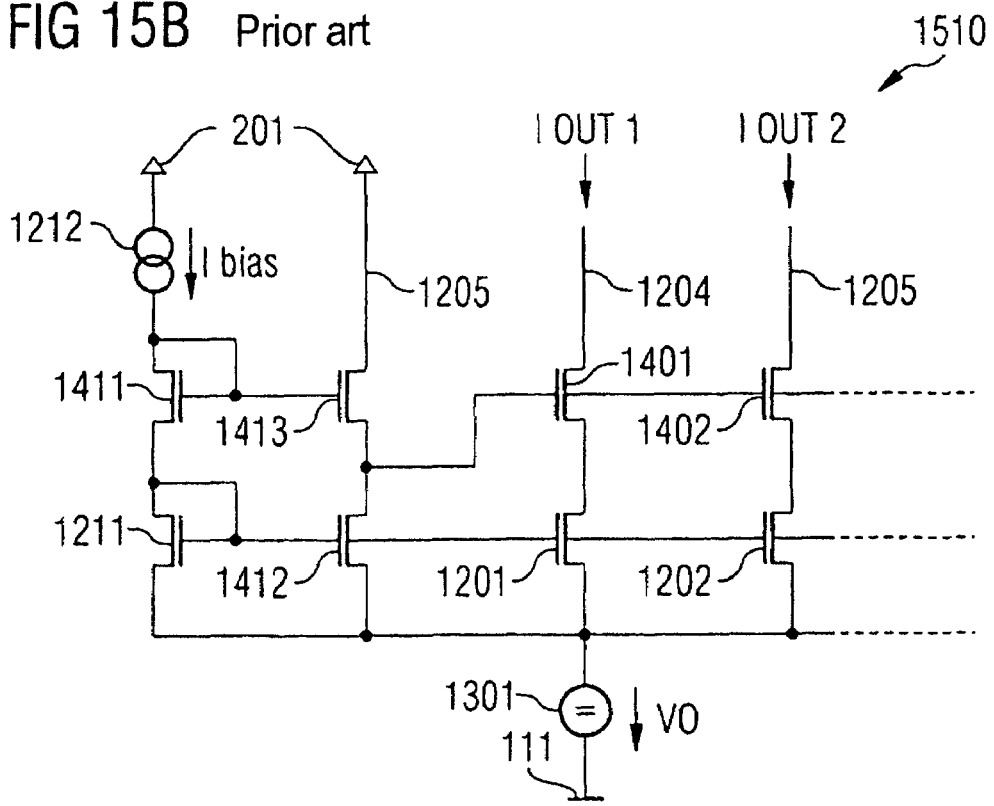

The current source circuit 1510 illustrated in FIG. 15B constitutes a combination of the circuit from FIG. 14A with that from FIG. 14C.

Both in the case of the current source circuit 1500 from FIG. 15A and in the case of the current source circuit 1510 from FIG. 15B, on account of the use of the voltage source 1301 V0 the common source/drain potential of the converter transistor 1211, of the first auxiliary transistor 1412, and of the first to n-th current source transistors 1201 to 1203 is brought to a value that is different from the ground potential 111.

A description is given below, referring to FIG. 16A, of a current source circuit 1600 as an integrated circuit in accordance with a sixth exemplary embodiment of the invention.

In the case of the current source circuit 1600, the current source transistors 1201 and 1202 are replaced according to the invention by first to fourth replacement current source transistors 1201a, 1201b, 1202a, 1202b. In other words, the principle of FIG. 1B is applied to the current source circuit 1200 in order to obtain the current source circuit 1600.

The dimensions of the replacement current source transistors 1201a, 1201b, 1202a, 1202b are identical to those of the first and second current source transistors 1201, 1202. The gate terminals of the first and second replacement current source transistors 1201a, 1201b and of the third and fourth replacement current source transistors 1202a, 1202b are respectively switched back and forth alternately between the bias voltage 1207 Vbias, on the one hand, and the ground potential 111, on the other hand, which is realized by means of the first to eighth switching transistors 1601 to 1608. The first to eighth switching transistors 1601 to 1608 are driven by means of the clock signals $\phi_1$, $\phi_2$, which are complementary to one another and have a duty cycle ratio of approximately 50%.

If, by way of example, $\phi_2$ is at a VDD potential and $\phi_1$ is at a ground potential, the first, fourth, fifth and eighth switching transistors 1601, 1604, 1605, 1608, are electrically conductive, whereas the other switching transistors 1602, 1603, 1606, 1607 turn off, so that the bias voltage 1207 Vbias is applied to the gate terminals of the first and third n-MOS replacement current source transistors 1201a, 1202a. Consequently, these transistors carry current and are therefore operated in inversion. The gate terminals of the second and fourth n-MOS replacement current source transistors 1201b, 1202b, by contrast, are at ground potential 111, are free of current and are therefore operated in depletion or accumulation.

A change in the clock signal $\phi_2$ to ground potential and in the clock signal $\phi_1$ to VDD potential has the effect that the second and fourth replacement current source transistors 1201b, 1202b are coupled to the bias voltage 1207 Vbias and are therefore operated in inversion, whereas in this scenario the first and third replacement current source transistors 1201a, 1202a are operated in depletion or accumulation. A sufficiently fast change in the clock signals $\phi_1$ and $\phi_2$ between the VDD potential and the ground potential, that is to say a sufficiently high clock frequency, has the effect that the noise contributions are reduced according to the invention.

A description is given below, referring to FIG. 16B, of a current source circuit 1610 as an integrated circuit in accordance with a seventh exemplary embodiment of the invention.

The current source circuit 1610 differs from the current source circuit 1600 essentially by virtue of the fact that the lower source/drain terminals in accordance with FIG. 16B of the first to fourth n-MOS replacement current source transistors 1201a, 1201b, 1202a, 1202b utilized as current sources are not brought to the electrical ground potential 111, but rather are brought to a potential that is different from the ground potential 111, here a positive potential, by means of the voltage source 1301 V0.

In the case of the current source circuit 1610, the noise suppression mechanism functions in just the same way as in the case of the current source circuit 1600. However, the voltage swing at the gate terminal of the first to fourth replacement current source transistors 1201a, 1201b, 1202a, 1202b in accordance with FIG. 16B is greater. The increased voltage swing has the effect that the two respective quasi Fermi levels associated with the two operating states of said transistors are even further apart from one another in energetic terms, as a result of which the noise is suppressed even more effectively.

A description is given below, referring to FIG. 17, of a current source circuit 1700 as an integrated circuit in accordance with an eighth exemplary embodiment of the invention.

Clearly, the current source circuit 1700 is similar to the current source circuit 1400 from FIG. 14A, the invention's principle of replacing a transistor by two transistors and of complementarily clocking the gate terminals of said transistors in order to reduce the noise voltage being realized in the case of the current source circuit 1700. It should be noted that only the two first column outputs 1204, 1205 with associated transistors are illustrated in FIG. 17.

In comparison with the current source circuit 1400, in the case of the current source circuit 1700, the current source transistors 1201, 1202 and cascode transistors 1401, 1402 are replaced by first to eighth n-MOS replacement current source transistors 1201a, 1201b, 1202a, 1202b, 1401a, 1401b, 1402a, 1402b and connected up according to the manner illustrated in FIG. 1B. The lower source/drain terminals in accordance with FIG. 17 of the first to fourth replacement current source transistors 1201a, 1201b, 1202a, 1202b are not connected directly to electrical ground potential 111, but rather are brought to an electrical potential generated by a voltage source 1301. However, it should be noted that the voltage source 1301 can also be omitted in the current source circuit 1700.

Furthermore, apart from the first to eighth n-MOS switching transistors 1601 to 1608, ninth to sixteenth n-MOS switching transistors 1701 to 1708 are additionally provided, to the gate terminals of which the clock signals $\phi_1$ and $\phi_2$ are applied in such a way that the fifth to eighth current source transistors 1401a, 1401b, 1402a, 1402b can thereby be controlled according to the invention.

A description is given below, referring to FIG. 18, of a current source circuit 1800 as an integrated circuit in accordance with a ninth exemplary embodiment of the invention.

The current source circuit 1800 differs from the current source circuit 1700 essentially by virtue of the fact that although the transistors 1201, 1202 are replaced by the configuration according to the invention as illustrated in FIG. 1B, the cascode transistors 1401, 1402 are left in the configuration illustrated in FIG. 14A. As a result, the advantages of a cascaded current source circuit over a non-cascaded current source circuit and the noise reduction according to one embodiment of the invention are combined with a lower outlay and smaller area.

These facts are explained below on the basis of an auxiliary circuit diagram 1900 illustrated in FIG. 19.

Figure 19:
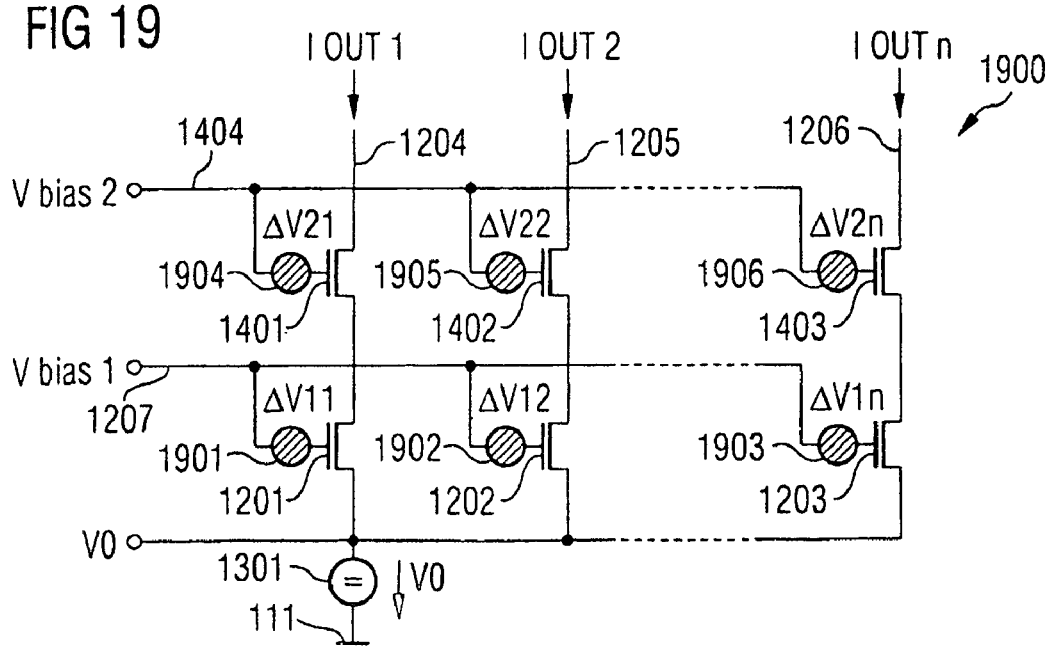
FIG. 19 illustrates an auxiliary circuit diagram for explaining the functionality of the current source circuits according to the invention.

The auxiliary circuit diagram 1900 is similar to the current source circuit 1400 from FIG. 14A, each real transistor 1201 to 1203, 1401 to 1403 illustrated in FIG. 14A being modeled in FIG. 19 by a transistor assumed to be noise-free and having identical reference symbols. In order to model the noise of the transistors 1201 to 1203, 1401 to 1403, the gate voltage of each of the transistors 1201 to 1203, 1401 to 1403 is acted on by an interference variable symbolizing the noise, which is modeled by means of a first to 2n-th noise voltage source 1901 to 1906 (clearly noise voltages $\Delta V1k$ for the first to n-th current source transistors 1201 to 1203, $\Delta V2k$ for the (n+1)-th to 2n-th cascode transistors 1401 to 1403, where k=1, 2, ..., n).

By means of a small-signal analysis, it is possible to determine the contributions or deviations $\Delta$Iout1, $\Delta$Iout2, ..., $\Delta$Ioutn with respect to the desired values Iout1, Iout2, ..., Ioutn. The following is obtained for k=1, 2, ..., n:

$$\Delta Ioutk = gm1k \times \Delta V1k + gDS1k \times \Delta V2K \tag{3}$$

The noise voltages $\Delta V1K$ and $\Delta V2k$ assigned to the individual transistors 1201 to 1203, 1401 to 1403 can be gathered from FIG. 19. The indices of the noise voltages $\Delta V1k$ correspond to the indices of gm1k and gDS1k in equation (3). In equation (3), gm1k denotes the transconductance (that is to say the derivative of the drain current with respect to the gate voltage) and gDS1k denotes the differential output conductance (that is to say the derivative of the drain or current with respect to the drain voltage) of the k-th transistor.

Since the following holds true to a good approximation:

$$gm1k \gg gDS1k \tag{4}$$

it follows that the noise of the cascode transistors 1401 to 1403 contributes considerably less to the overall noise of the output current than the noise of the transistors 1201 to 1203.

Consequently, the noise in the current source circuit 1800 is low even though only the current source transistors 1201 to 1203, but not the cascode transistors 1401 to 1403 have been replaced in the manner according to the invention.

A description is given below, referring to FIG. 20, of a current source circuit 2000 as an integrated circuit in accordance with a tenth exemplary embodiment of the invention.

Figure 20:
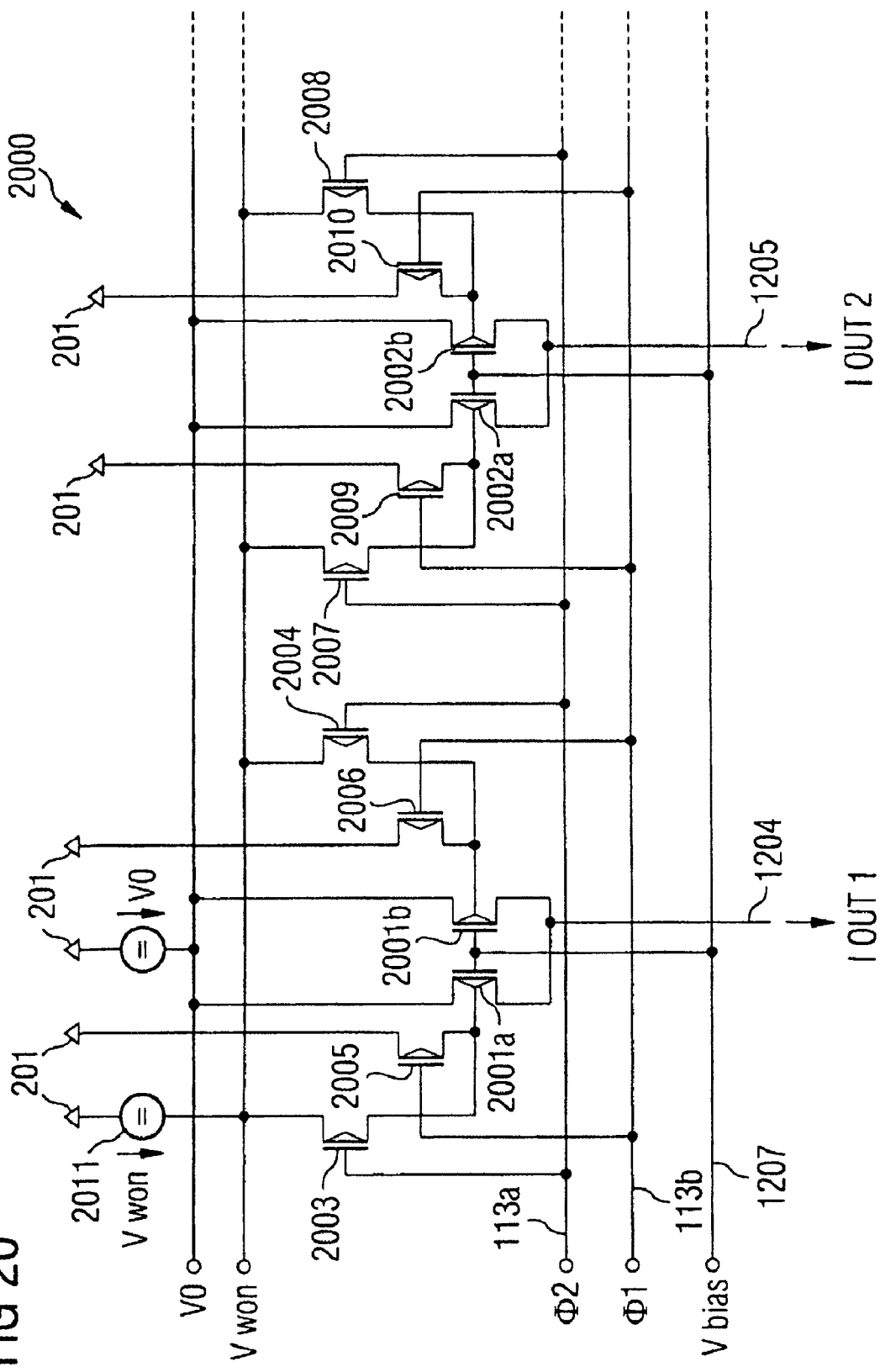

The current source circuit 200 from FIG. 20 is a non-cascaded current source circuit realized with p-MOS transistors. Consequently, the current source circuit 2000 corresponds approximately to the current source circuit 1610 from FIG. 16B with the difference that p-MOS transistors are used instead of n-MOS transistors, and that the transistor operating points are effected by means of setting the well potentials instead of the gate potentials. The gate regions of first and second p-MOS replacement current source transistors 2001a, 2001b are coupled, so that the operating point of these transistors is set by means of setting their well potentials. Third and fourth p-MOS replacement current source transistors 2002a, 2002b are analogously connected up and driven like the transistors 2001a, 2001b. Furthermore, first to eighth p-MOS switching transistors 2003 to 2010 are provided. The operating points of the transistors 2001a, 2001b, 2002a, 2000b are set by means of the p-MOS switching transistors 2003 to 2010, which are controlled using the mutually complementary clock signals $\phi_1$, $\phi_2$. In other words, the changeover of the first to fourth p-MOS replacement current source transistors 2001a, 2001b, 2002a, 2002b between inversion operation and depletion or accumulation operation is effected by means of periodically altering the potentials of the well terminals of said transistors. The two potentials required for this purpose are provided by the voltage source 1301 V0 and a further voltage source 2011 Vwon.

Figure 17:
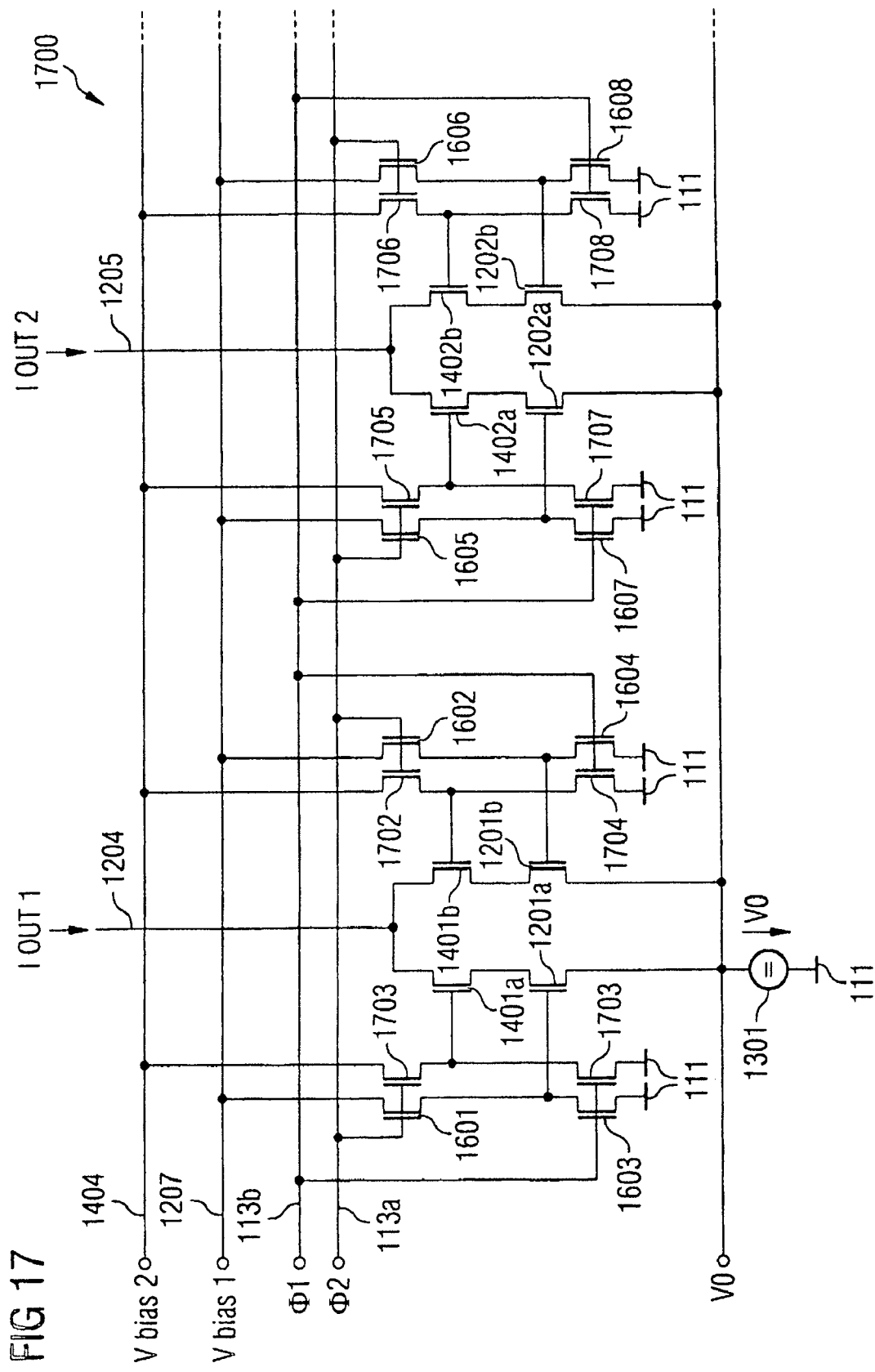
Figure 18:
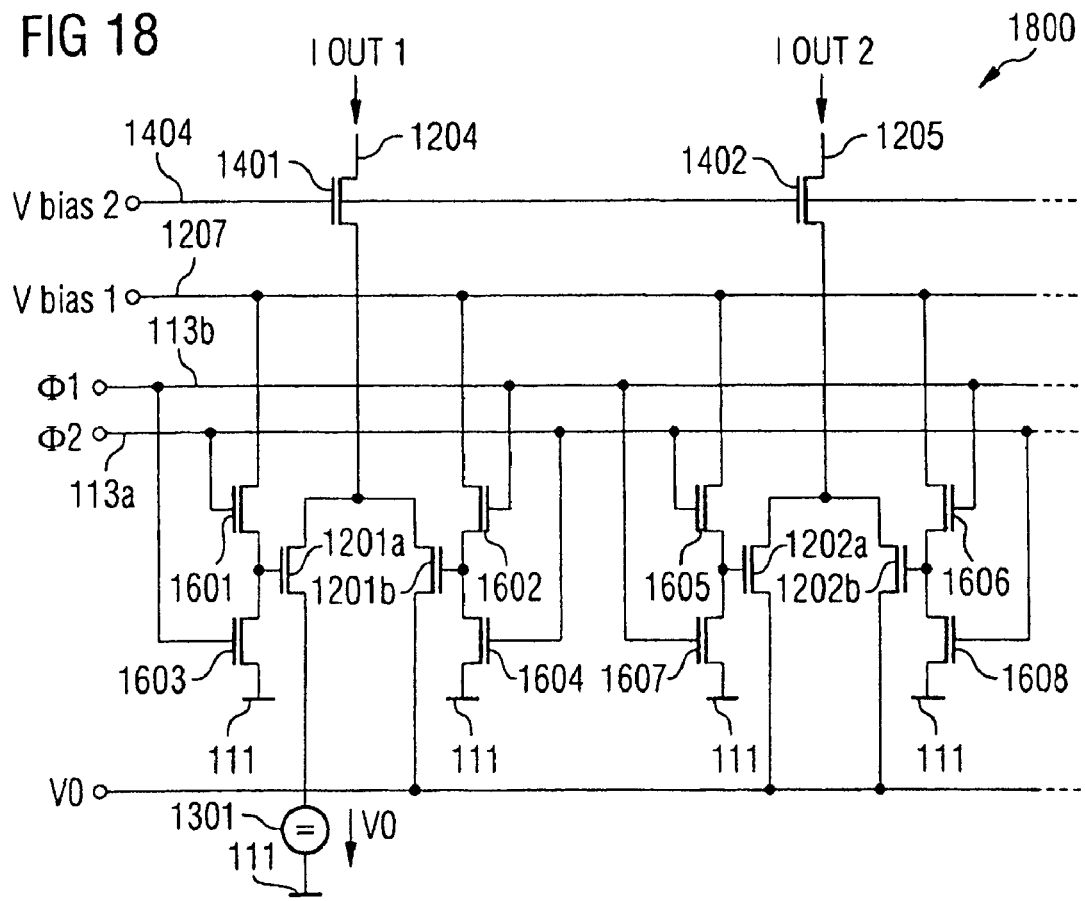

It goes without saying that cascaded current sources can also be constructed in accordance with this principle, in which case the cascode transistors can be operated either in noise-compensated fashion (as in the case of FIG. 17) or in non-noise-compensated fashion (as in the case of FIG. 18).

In the circuits illustrated in FIG. 16A, FIG. 16B, FIG. 17, FIG. 18 and FIG. 20, a separate switching transistor pair is introduced for each transistor that is to be operated in pulsed fashion according to the invention, by means of which pair the gate or well potential is changed over.

A description is given below, referring to FIG. 21 to FIG. 24, of current source circuits 2100, 2200, 2300, 2400 in which the respective switching transistors are embodied jointly for in each case a plurality of transistors that are to be pulsed according to the invention.

Figure 21:
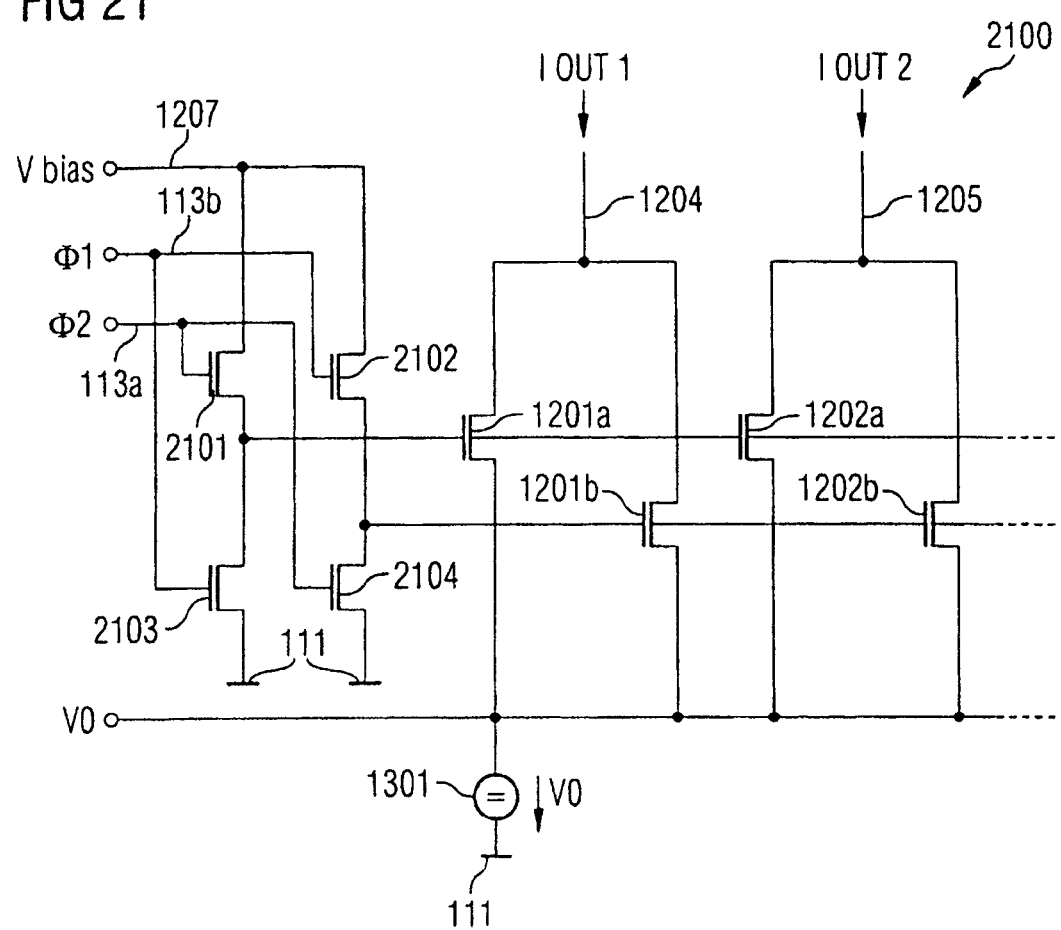

A description is given below, referring to FIG. 21, of a current source circuit 2100 as an integrated circuit in accordance with an eleventh exemplary embodiment of the invention.

The current source circuit 2100 differs from the current source circuit 1610 illustrated in FIG. 16B essentially by virtue of the fact that, in the case of the current source circuit 1610, in each case two separate switching transistors 1601, 1603 and 1602, 1604 and 1605, 1607 and 1606, 1608 are respectively provided for each of the first to fourth n-MOS replacement current source transistors 1201a, 1201b, 1202a, 1202b. By contrast, in the case of the current source circuit 2100, for the first to fourth n-MOS replacement current source transistors 1201a, 1201b, 1202a, 1202b, a total of only four common first to fourth n-MOS switching transistors 2101 to 2104 are provided for alternately applying the ground potential 111 or the bias voltage Vbias 1207 to the gate regions of the n-MOS replacement current source transistors, for which purpose the clock signals $\phi_1$, $\phi_2$ are used.

A description is given below, referring to FIG. 22, of a current source circuit 2200 as an integrated circuit in accordance with a twelfth exemplary embodiment of the invention.

Figure 22:
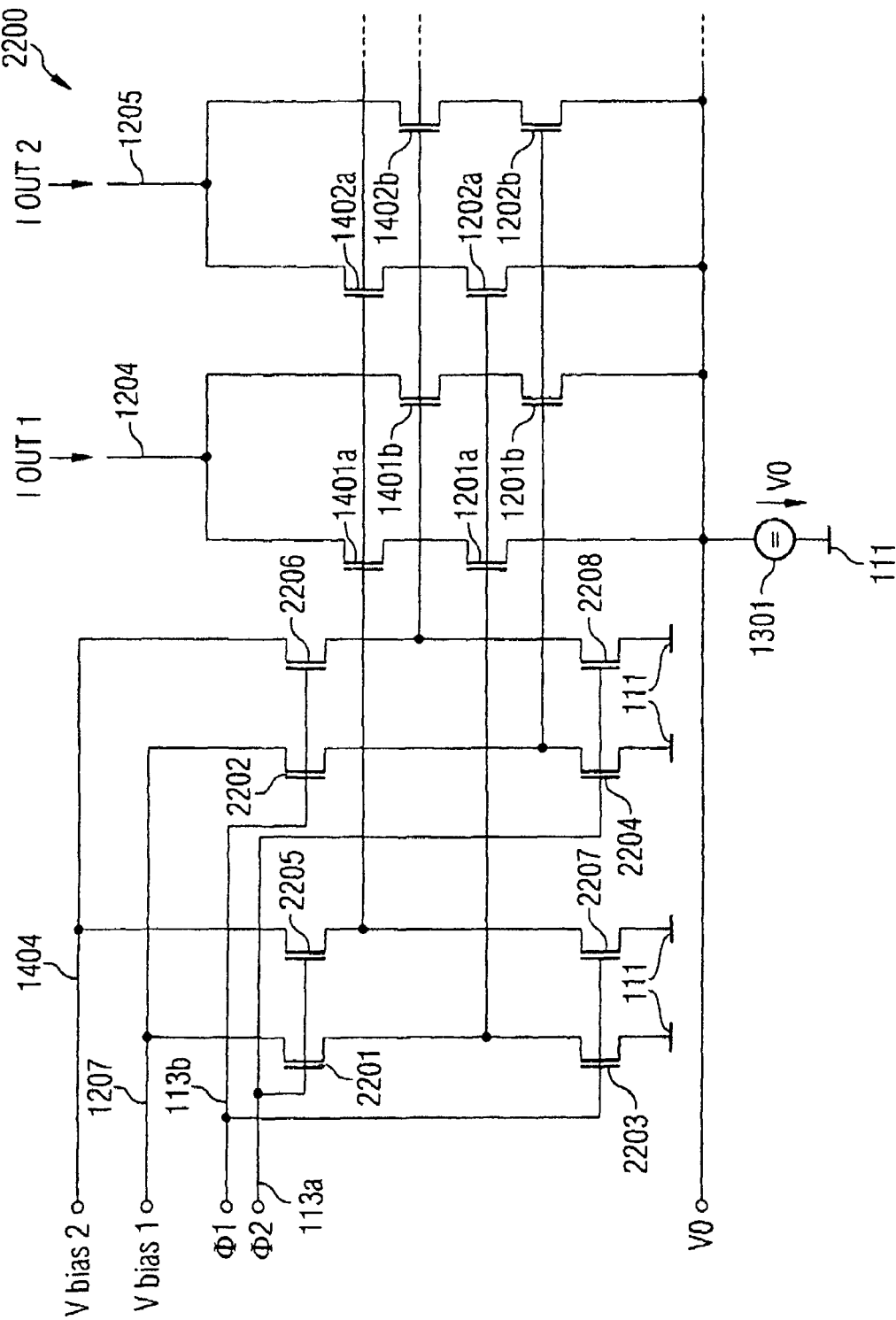

The current source circuit 2200 from FIG. 22 essentially corresponds to the current source circuit 1700 from FIG. 17, in which case, instead of the first to eighth n-MOS switching transistors 1601 to 1608 and the ninth to sixteenth n-MOS switching transistors 1701 to 1708, in the case of the configuration in accordance with FIG. 22, only eight switching transistors 2201 to 2208 are used for jointly driving the n-MOS replacement current source transistors 1201a, 1201b, 1202a, 1202b, 1401a, 1401b, 1402a, 1402b.

A description is given below, referring to FIG. 23, of a current source circuit 2300 as an integrated circuit in accordance with a thirteenth exemplary embodiment of the invention.

Figure 23:
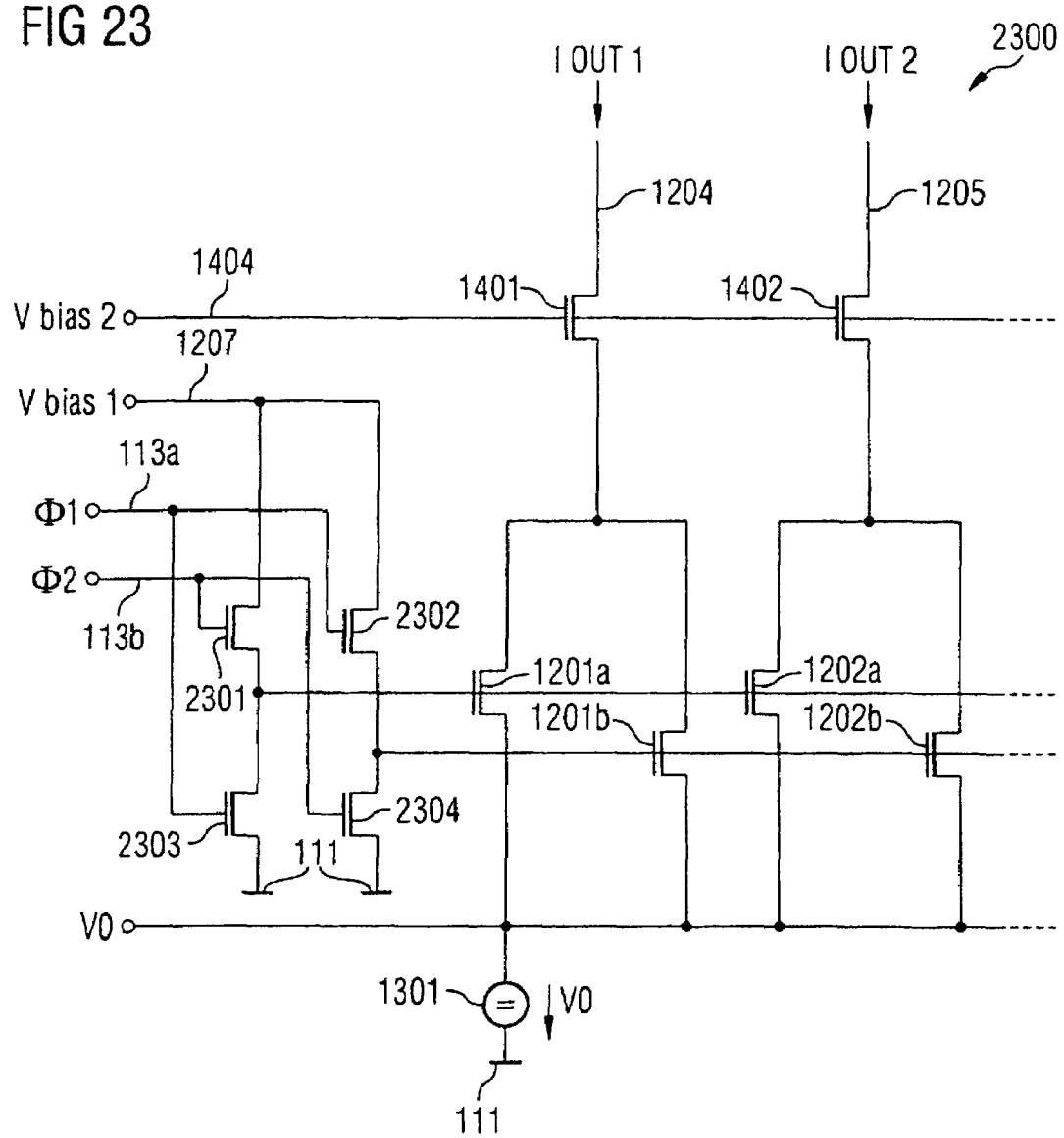

The current source circuit 2300 differs from the current source circuit 1800 illustrated in FIG. 18 essentially by virtue of the fact that, instead of the first to eighth n-MOS switching transistors 1601 to 1608, for driving the first to fourth n-MOS replacement current source transistors 1201a, 1201b, 1202a, 1202b, in accordance with FIG. 23, only first to fourth n-MOS switching transistors 2301 to 2304 are provided, by means of which the potentials of the gate terminals of the first to fourth n-MOS replacement current source transistors 1201a, 1201b, 1202a, 1202b can be controlled according to the invention.

A description is given below, referring to FIG. 24, of the current source circuit 2400 as an integrated circuit in accordance with a fourteenth exemplary embodiment of the invention.

The current source circuit 2400 illustrated in FIG. 24 differs from the current source circuit 2000 illustrated in FIG. 20 essentially by virtue of the fact that, instead of the first to eighth p-MOS switching transistors 2003 to 2010, in the case of the current source circuit 2400, only first to fourth p-MOS switching transistors 2401 to 2404 are provided, to be precise jointly for the replacement current source transistors 2001a, 2001b, 2002a, 2002b.

Current mirrors in accordance with the prior art (FIG. 25A) and according to the invention (FIG. 25B, FIG. 26) are described below.

The task of an ideal current mirror is to make available at its output or its outputs a current impressed into the current mirror on the input side (if appropriate weighted with a predetermined factor). Depending on the application, tolerances are permitted with regard to exactly complying with the mirror ratio. There are furthermore applications in which the requirements with regard to complying with a mirror ratio do not have to be applied on the entire input or output current, but these requirements must be complied with for alternating or differential signals impressed on the input current.

If, by way of example, Iin is the mean value of the input current, ΔIin is the impressed differential or alternating signal of the input current, Iout is the mean value of the output current, ΔIout is the resulting differential or alternating signal of the output current, and n is the predetermined mirror factor, then complying with the relationship $$\Delta Iout = n \times \Delta Iin \text{ or } \Delta Iout/\Delta Iin = n \qquad (5)$$

is demanded as exactly as possible, whereas for the ratio Iout/In greater deviations from the factor n are permitted.

Figure 25A:
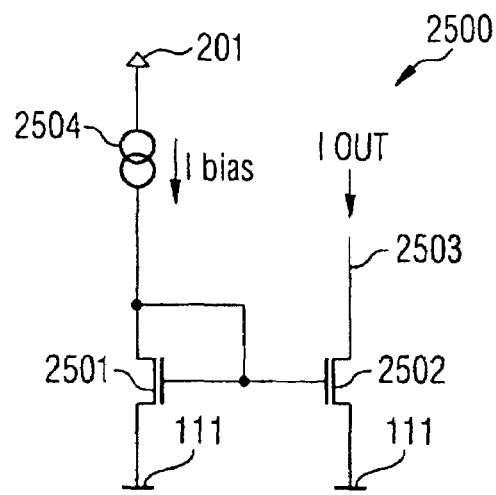
FIG. 25A illustrates a current mirror in accordance with the prior art.

A current mirror 2500 in accordance with the prior art is described below referring to FIG. 25A.

The current mirror circuit 2500 has a first and a second current mirror transistor 2501 and 2502, the gate terminals of which are coupled to one another. One respective source/drain terminal of the first current mirror transistors 2501 and 2502 is at electrical ground potential 111. The other source/drain terminal of the second current mirror transistor 2502 is coupled to an output 2503 of the current mirror 2500. The other source/drain terminal of the first current mirror transistor 2501 is coupled both to the latter's gate terminal and to one terminal of a current source 2504, Ibias, the other terminal of which is at the supply potential 201.

A description is given below, referring to FIG. 25B, of a current mirror circuit 2510 as an integrated circuit in accordance with a fifteenth exemplary embodiment of the invention.

In the case of the current mirror circuit 2510, the first and second current mirror transistors 2501 and 2502 are replaced by a configuration according to the invention such as is illustrated in FIG. 1B. In one case, the first current mirror transistor 2501 is replaced by a first replacement current mirror transistor 2501a and by a second replacement current mirror transistor 2501b. The second current mirror transistor 2502 is replaced by a third replacement current mirror transistor 2502a and by a fourth replacement current mirror transistor 2502b.

In the case of the current mirror circuit 2500, the entire input current Iin flows through the first current mirror transistor 2501, whereas in the case of the current mirror circuit 2510 part of said current does not flow through the first and second replacement current mirror transistors 2501a and 2501b that replace the first current mirror transistor 2501a. Instead, part of the current is consumed for a periodically performed recharging or charging of the gate capacitances of the transistors 2501a, 2501b, 2502a, 2502b. This current portion Icg can be specified by $$Icg = Vg, on \times f \times \Sigma Cg \qquad (6)$$

where f is the frequency of the clock signals $\phi_1$, $\phi_2$, Vg,on is the voltage established at the gate terminal of the transistors 2501a, 2501b, 2502a, 2502b, and ΣCg is the sum of the gate capacitances of all the transistors 2501a, 2501b, 2502a, 2502b (or more precisely the sum of the integrals of the gate capacitances over the voltage range swept over during clocked operation of the transistors in accordance with the invention).

It should be noted that the gate capacitance is approximately constant in very strong inversion and in very strong accumulation, but in the depletion region it exhibits a relatively great voltage dependence and a reduction in comparison with the values in inversion and accumulation.

Figure 25B:
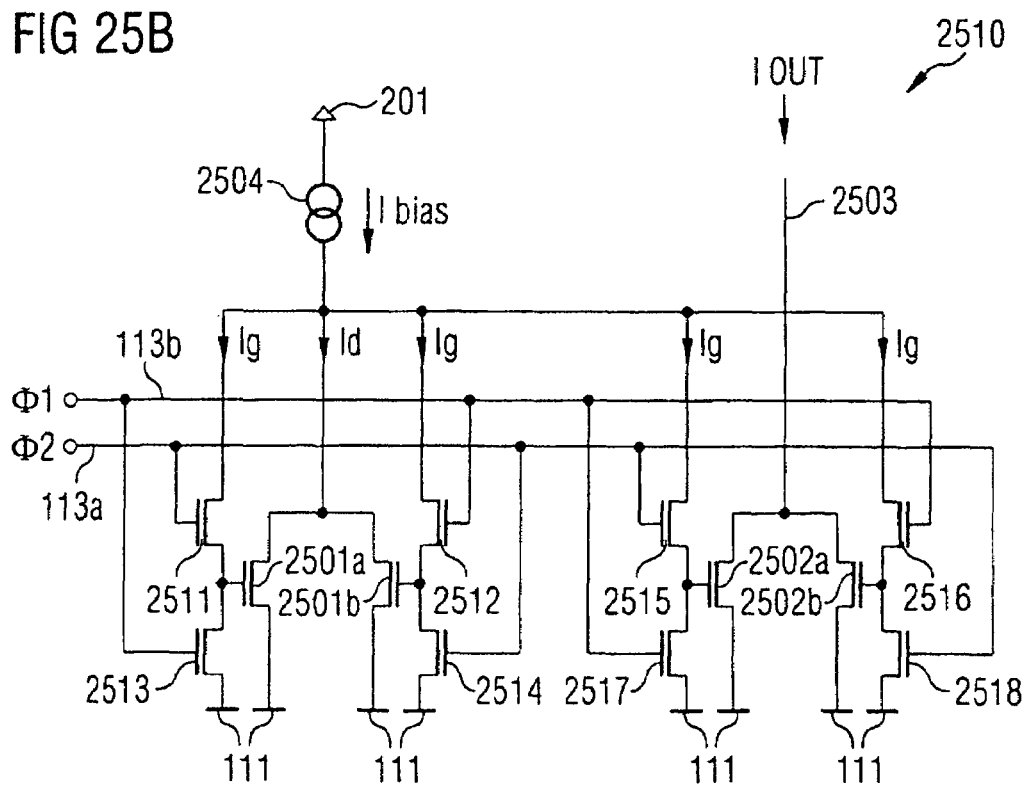
FIGS. 25B, 26 illustrate current mirrors as integrated circuits in accordance with fifteenth and sixteenth exemplary embodiments of the invention.

Furthermore, FIG. 25B illustrates first to eighth n-MOS switching transistors 2511 to 2518 for driving the first to fourth replacement current mirror transistors 2501a, 2501b, 2502a, 2502b in accordance with the invention, which are connected up in a manner similar to the first to eighth n-MOS switching transistors 1601 to 1608 illustrated in FIG. 16A, FIG. 16B.

It should be noted that the current mirror circuit 2510 illustrated in FIG. 25B can be modified or extended to the effect that a cascaded structure (similar to that in FIG. 14A) can be used or that the common source/drain potentials of all the transistors can be set to a value that is different from the ground potential (in a manner similar to that for example in accordance with FIG. 15A).

A description is given below, referring to FIG. 26, of a current mirror circuit 2600 as an integrated circuit in accordance with a sixteenth exemplary embodiment of the invention.

Figure 26:
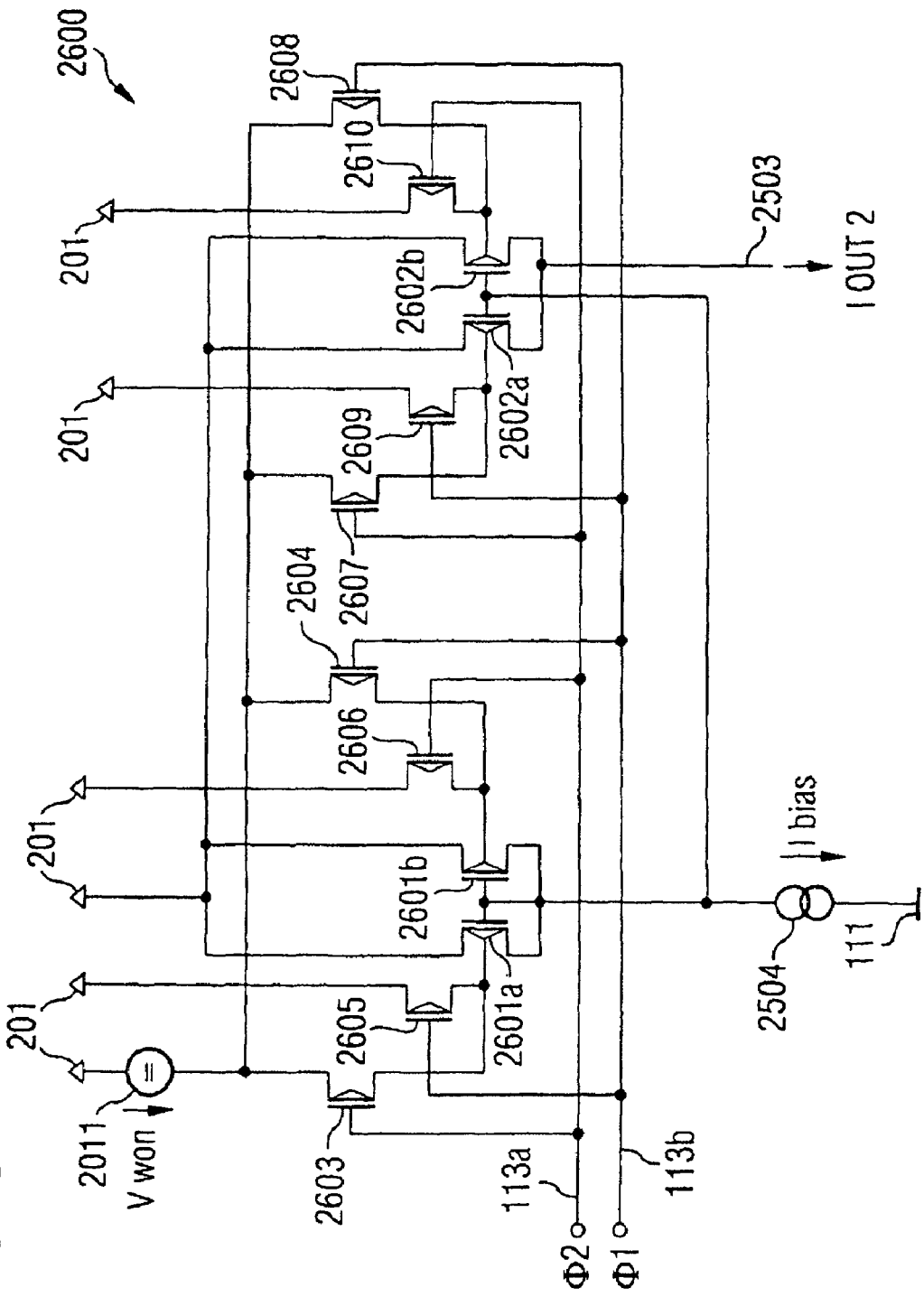

The current mirror circuit 2600 differs from the current mirror circuit 2510 illustrated in FIG. 25B essentially by virtue of the fact that p-MOS transistors are used for the replacement current mirror transistors and also for the switching transistors in accordance with FIG. 26, whereas n-MOS transistors are used in accordance with FIG. 25B. In the case of the current mirror circuit 2600, first and second p-MOS replacement current mirror transistors 2601a and 2601b are provided instead of the first and second n-MOS replacement current mirror transistors 2501a and 2501b, and, in accordance with FIG. 26B, third and fourth p-MOS replacement current mirror transistors 2602a, 2602b are provided instead of the third and fourth n-MOS replacement current mirror transistors 2502a, 2502b and first to eighth p-MOS switching transistors 2603 to 2610 are provided instead of the first to eighth n-MOS switching transistors 2511 to 2518.

The noise suppression according to the invention in accordance with the principle described in FIG. 4B is realized in the case of the current mirror circuit 2600. One advantage of the current mirror circuit 2600 over the realization illustrated in FIG. 25B is that the input current flows exclusively through the input transistors, that is to say that no further contribution is taken from it (e.g. in accordance with the relationship discussed above for Icg, c.f. equation (6)).

It goes without saying that the current mirror circuit 2600, too, can be modified or extended to the effect that a cascaded structure is used or that the source/drain potentials of the transistors, which are brought to VDD potential 201 in FIG. 26, are brought to a value that is different from the VDD potential 201.

Two different operational amplifier circuits are taken as a basis below, referring to FIG. 27 and to FIG. 30, to illustrate how the basic idea according to the invention and the discussed subcircuits according to the invention can be coupled to one another in the context of more complex circuits.

Figure 27:
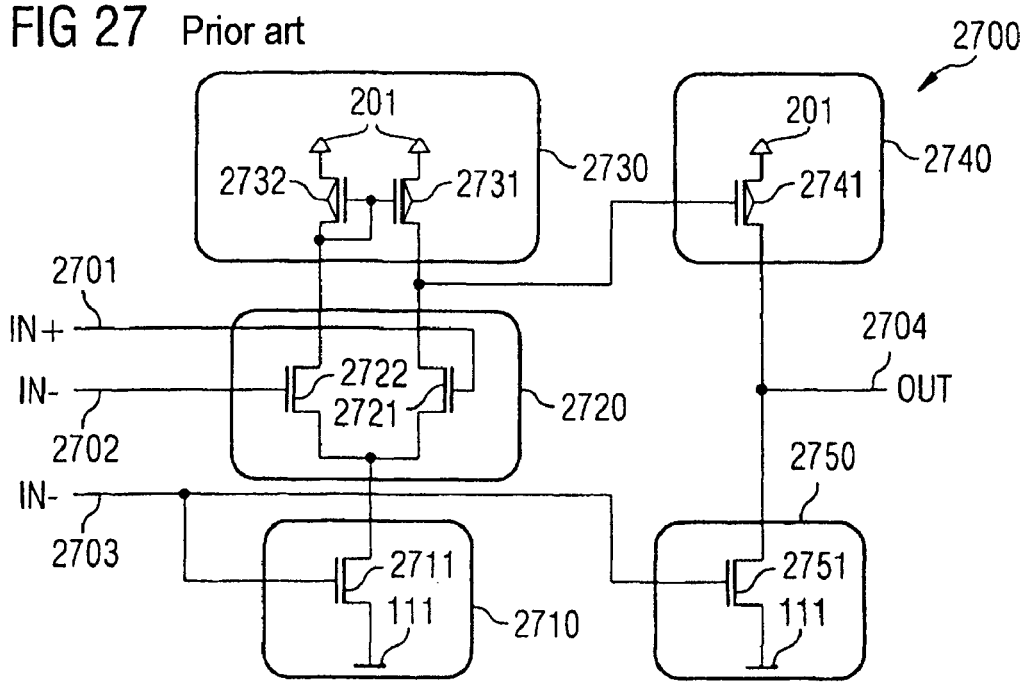
FIGS. 27 and 28 illustrate operational amplifiers in accordance with the prior art.

FIG. 27 illustrates a simple, so-called two-stage (single-ended) operational amplifier 2700 in accordance with the prior art such as is described in R. Gregorian, G. C. Temes, "Analog MOS Integrated Circuits", NY, John Wiley & Sons, 1986 to A. B. Grebene, "Bipolar and MOS analog integrated circuit design", NY, John Wiley & Sons, 1984.

The individual circuit blocks of the operational amplifier 2700 will be described first.

The operational amplifier 2700 is formed from a first current source 2710, a differential input transistor pair 2720, a current mirror 2730, a second current source 2740 and a third current source 2750.

The operational amplifier 2700 contains a first input 2701 IN+ and a second input 2702 IN−, the first input 2701 being coupled to the gate region of a first n-MOS differential stage transistor 2721. The second input 2702 is coupled to the gate region of a second n-MOS differential stage transistor 2722 of the differential input transistor pair 2720. One respective source/drain terminal of the n-MOS differential stage transistors 2721, 2722 is coupled to a source/drain terminal of a first n-MOS current source transistor 2711 of the first current source 2710. The other source/drain terminal of the first n-MOS current source transistor 2711 is coupled to the ground potential 111. Furthermore, a bias voltage 2703 Vbias is applied to the gate terminal of the first n-MOS current source transistor 2711. The bias voltage 2703 is furthermore applied to the gate terminal of a second n-MOS current source transistor 2751. One source/drain terminal of the second n-MOS current source transistor 2751 is coupled to electrical ground potential 111, and the other source/drain terminal of the second n-MOS current source transistor 2751 is coupled to an output 2704 and also to one source/drain terminal of a first p-MOS current source transistor of the second current source 2740. The second source/drain terminal of the first p-MOS current source transistor 2741 is coupled to supply potential 201, whereas the gate terminal of the first p-MOS current source transistor 2741 is coupled to the other source/drain terminal of the first n-MOS differential stage transistor 2721 of the differential input transistor pair 2720. Furthermore, the gate terminal of the first p-MOS current source transistor 2741 is coupled to one source/drain terminal of a first p-MOS current mirror transistor 2731 of the current mirror 2730. The other source/drain terminal thereof is at the supply potential 201. The gate terminal of the first p-MOS current mirror transistor 2731 is coupled to the gate terminal of a second p-MOS current mirror transistor 3732 of the current mirror 2730 and is furthermore coupled to one source/drain terminal of the second p-MOS current mirror transistor 2732. The other source/drain terminal of the second p-MOS current mirror transistor 2732 is at supply potential 201. The first source/drain terminal of the second p-MOS current mirror transistor 2732 is coupled to the other source/drain terminal of the second n-MOS differential stage transistor 2722 of the differential input transistor pair 2720.

The first current source 2710 is an n-MOS current source for operation of the single-ended differential stage, formed from the differential input transistor pair 2720 and the current mirror 2730. The operating point of the first current source transistor 2711 is effected using the constant bias voltage 2703. The second current source 2740 is a p-MOS current source and part of the output stage, the second current source 2740 being driven with the output signal of the single-ended differential stage. The third current source 2750 is an n-MOS current source and part of the output stage, the driving, that is to say operating point setting, of the third current source 2750 being effected with the bias voltage 2703 Vbias.

A description is given below, referring to FIG. 28, of another operational amplifier 2800 in accordance with the prior art.

This operational amplifier constitutes a so-called fully differential folded cascode circuit, which is described in R.

Gregorian, G. C. Temes, "Analog MOS Integrated Circuits", NY, John Wiley & Sons, 1986 to A. B. Grebene, "Bipolar and MOS analog integrated circuit design", NY, John Wiley & Sons, 1984.

The operational amplifier 2800 is formed from five circuit blocks, namely a first current source 2810, a differential input transistor pair 2820, a second current source 2830, a third current source 2840 and a common-mode feedback circuit 2850.

Once again a first input 2701 IN+ and a second input 2702 IN− are provided. Furthermore, first to fifth bias voltages 2801 to 2805 are provided, at which bias voltages Vbias1, Vbias2, Vbias3, Vbias4, Vbias5 are provided. Furthermore, a first output 2806 OUT+ and a second output 2807 OUT− are provided. The first current source 2810 has a first n-MOS current source transistor 2811, to the gate region of which the fifth bias voltage 2805 Vbias is applied. One source/drain region of the first n-MOS current source transistor 2811 is at ground potential 111, whereas the second source/drain terminal of the first n-MOS current source transistor is coupled to one respective source/drain terminal of a first and of a second n-MOS differential stage transistor 2721, 2722 of the differential input transistor pair 2820. It should be noted that the differential input transistor pair 2820 is configured and connected up like the differential input transistor pair 2720 from FIG. 27. The second source/drain terminal of the second n-MOS differential stage transistor 2722 is coupled to a respective first source/drain terminal of a first and of a second p-MOS current source transistor 2831, 2832 of the second current source 2830. The other source/drain terminal of the first p-MOS current source transistor 2831 is at supply potential 201, whereas the gate terminal of the first p-MOS current source transistor 2831 is at the first bias voltage 2801 Vbias1. Furthermore, a third and a fourth p-MOS current source transistor 2833, 2834 are provided in the second current source 2830. The first source/drain terminal of the third p-MOS current source transistor 2833 is at supply potential 201, whereas the second source/drain terminal of the third p-MOS current source transistor 2833 is coupled to the first source/drain terminal of the fourth p-MOS current source transistor 2834. The first bias voltage 2801 Vbias1 is applied to the gate terminals of the first and of the third p-MOS current source transistor 2831, 2833. The second bias voltage 2802 Vbias2 is applied to the gate terminals of the second and of the fourth p-MOS current source transistor 2832 and 2834. Furthermore, the second source/drain region of the third p-MOS current source transistor 2833 and the first source/drain region of the fourth p-MOS current source transistor 2834 are coupled to the second source/drain region of the first n-MOS differential stage transistor 2721 of the differential input transistor pair 2820. The second source/drain region of the second p-MOS current source transistor 2832 is coupled to the second output 2807 OUT−, whereas the second source/drain terminal of the fourth p-MOS current source transistor 2834 is coupled to the first output 2806 OUT+. The third current source 2840 has second to fifth n-MOS current source transistors 2841 to 2844. The second n-MOS current source transistor 2841 is coupled by one source/drain terminal to the first output 2806 OUT+, whereas the second source/drain terminal of the second n-MOS current source transistor 2841 is coupled to a first source/drain terminal of the third n-MOS current source transistor 2842. The second source/drain terminal of the third n-MOS current source transistor 2842 is coupled to a first source/drain terminal of the fifth n-MOS current source transistor 2844, the second source/drain terminal of which is coupled to a first source/drain terminal of the fourth n-MOS current source transistor 2843. The second source/drain terminal of the fourth n-MOS current source transistor 2843 is coupled to the second output 2807 OUT−. Furthermore, the third bias voltage 2803 Vbias3 is applied to the gate terminals of the second and of the fourth n-MOS current source transistor 2841, 2843, whereas the fourth bias voltage 2804 Vbias4 is applied to the gate terminals of the third and of the fifth n-MOS current source transistor 2842, 2844. Furthermore, the second source/drain terminal of the third n-MOS current source transistor 2842 and the first source/drain terminal of the fifth n-MOS current source transistor 2844 are coupled to a respective first source/drain terminal of a first and of a second common-mode feedback transistor 2851, 2852 of the common-mode feedback circuit 2850. The respective second source/drain terminals of the common-mode feedback transistors 2851, 2852 are at ground potential 111. The gate terminal of the first common-mode feedback transistor 2851 is coupled to the first output 2806 OUT+, whereas the gate terminal of the second common-mode feedback transistor 2852 is coupled to the second output 2807 OUT−.

The first current source 2810 is provided for operation of the differential stage 2820. The operating point of the first current source 2810 is set by means of the constant bias voltage 2805 Vbias5. The second current source 2830 is a cascaded current source having p-MOS transistors with a center tap. Furthermore, the second current source 2830 is part of the output stage. The third current source 2840 is a cascaded current source having n-MOS transistors and is part of the output stage. It should once again be noted that the transistors of the common-mode feedback circuit 2850 contribute only negligible contributions to the overall noise of the circuit since their noise is fed as a common-mode signal into both branches of the output stage.

A description is given below, referring to FIG. 29 of an operational amplifier 2900 as an integrated circuit in accordance with a seventeenth exemplary embodiment of the invention.

The operational amplifier 2900 is obtained by means of all the blocks of the operational amplifier 2700 from FIG. 27 that are relevant to low-frequency noise being replaced by corresponding subcircuits configured according to the invention.

In the first current source 2710, such replacement is dispensable since this circuit block makes only a small contribution to the overall noise of the circuit. If this block is also intended additionally to be subjected to noise compensation, an interconnection as in the third current source 2750 in FIG. 29 can be performed instead of the first n-MOS current source transistor 2711.

In the differential input transistor pair 2720, the first n-MOS differential stage transistor 2721 is replaced by first and second n-MOS replacement differential stage transistors 2721a, 2721b. Furthermore, the second n-MOS differential stage transistor 2722 is replaced by third and fourth n-MOS replacement differential stage transistors 2722a, 2722b in the manner according to the invention. Furthermore, n-MOS switching transistors 2901 are provided in order that the transistors 2721a, 2721b, 2722a, 2722b are connected up in accordance with the invention and are driven using clock signals $\phi_1$, $\phi_2$.

In the current mirror 2730, the first p-MOS current mirror transistor 2731 is replaced by first and second p-MOS replacement current mirror transistors 2731a, 2731b, and the second p-MOS current mirror transistor 2732 is replaced by third and fourth p-MOS replacement current mirror transistors 2732a, 2732b. Furthermore, p-MOS switching transistors 2902 are provided in order that the transistors 2731a, 2731b, 2732a, 2732b are driven using the clock signals $\phi_1$, $\phi_2$, in accordance with the invention.

In the second current source 2740, the first p-MOS current source transistor 2741 is replaced by first and second p-MOS replacement current source transistors 2741a, 2741b. Furthermore, p-MOS switching transistors 2902 are also provided in this circuit block.

Figure 29:
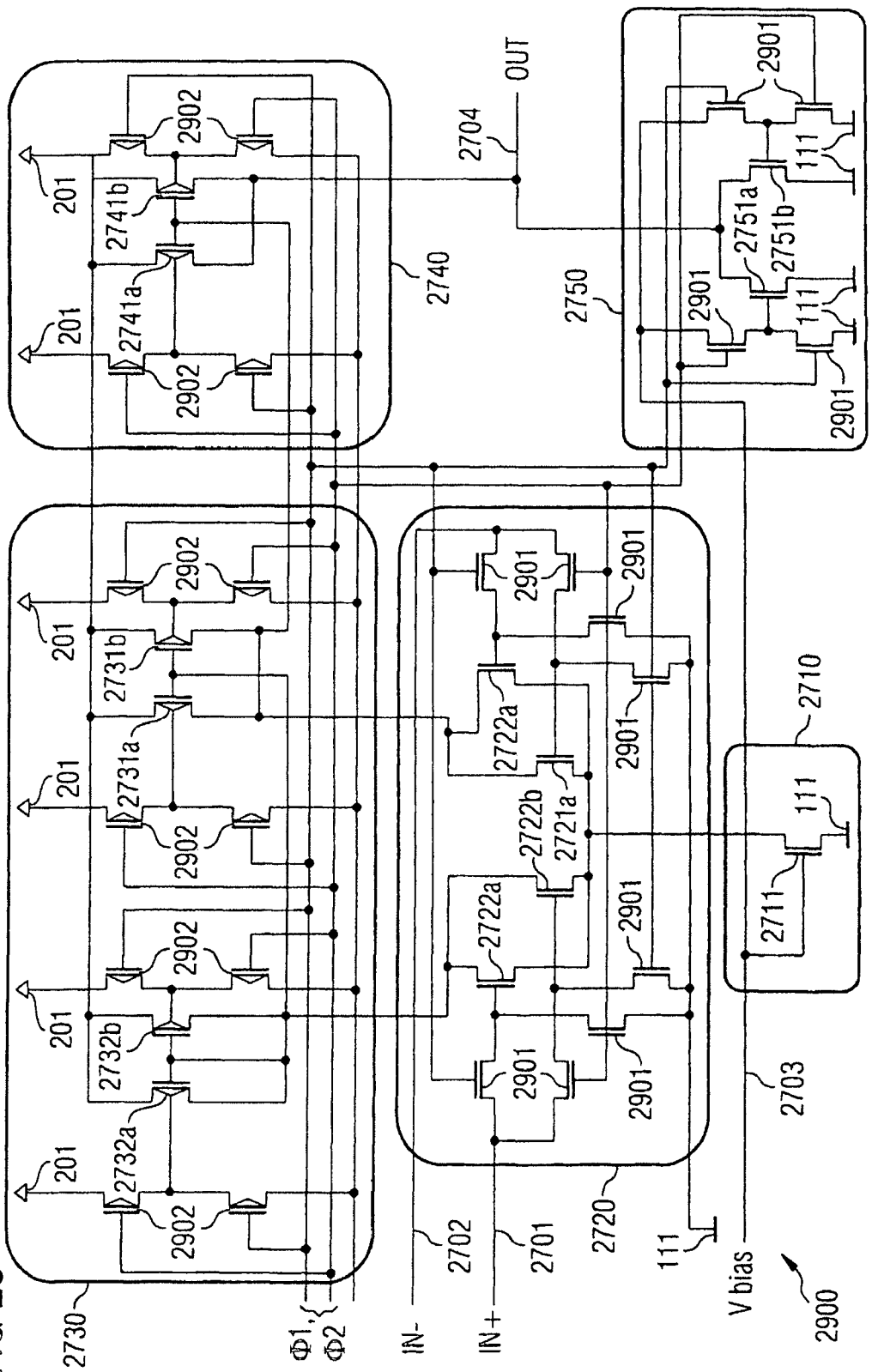
FIGS. 29, 30 illustrate operational amplifiers as integrated circuits in accordance with seventeenth and eighteenth exemplary embodiments of the invention.

In the third current source 2750, in FIG. 29 the second n-MOS current source transistor 2751 is replaced by third and fourth p-MOS replacement current source transistors 2751a, 2751b. Furthermore, n-MOS switching transistors 2901 are also provided in this subcircuit.

Clearly, in the circuit blocks 2720, 2750, the driving of the noise-compensated transistors is performed via the gate nodes thereof, whereas in the blocks 2730, 2740 replaced according to the invention, the driving of the noise-compensated transistors is performed via the well nodes thereof.

A description is given below, referring to FIG. 30, of an operational amplifier 3000 as an integrated circuit in accordance with an eighteenth exemplary embodiment of the invention.

Figure 28:
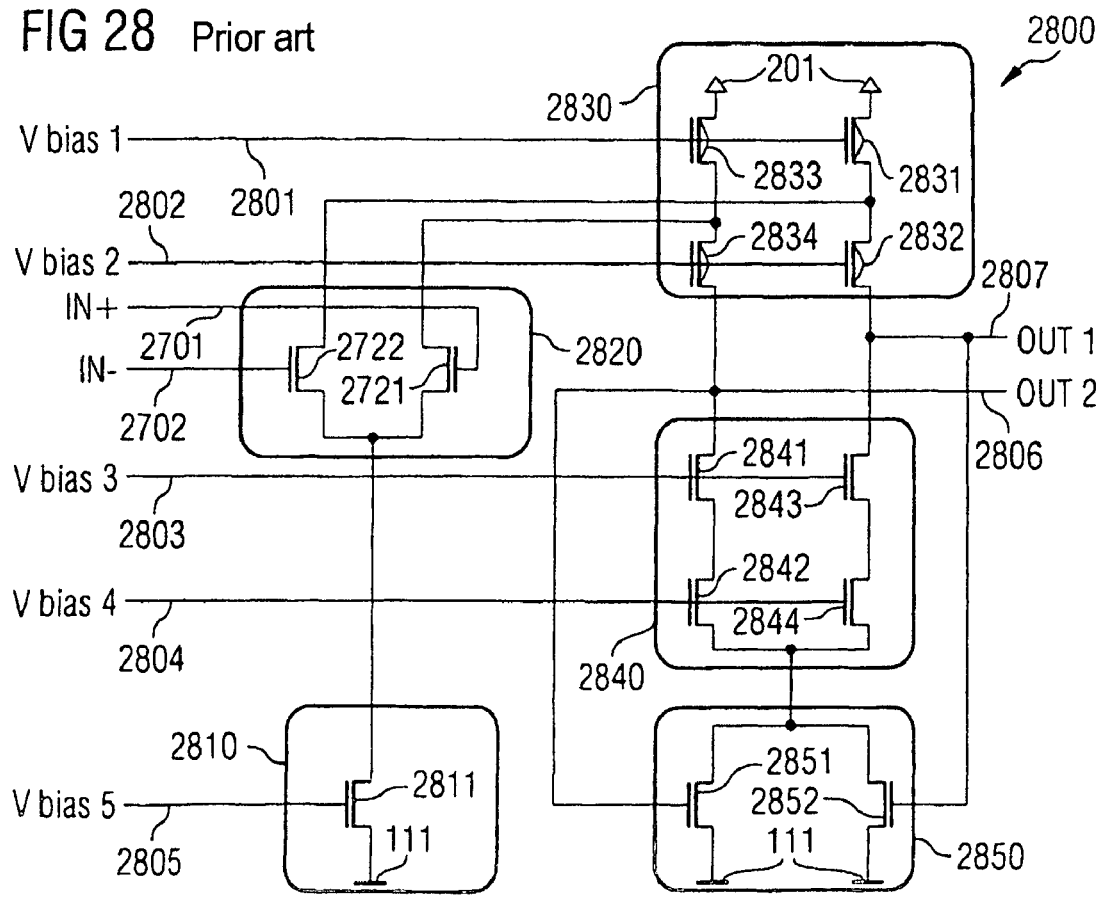
Figure 30:
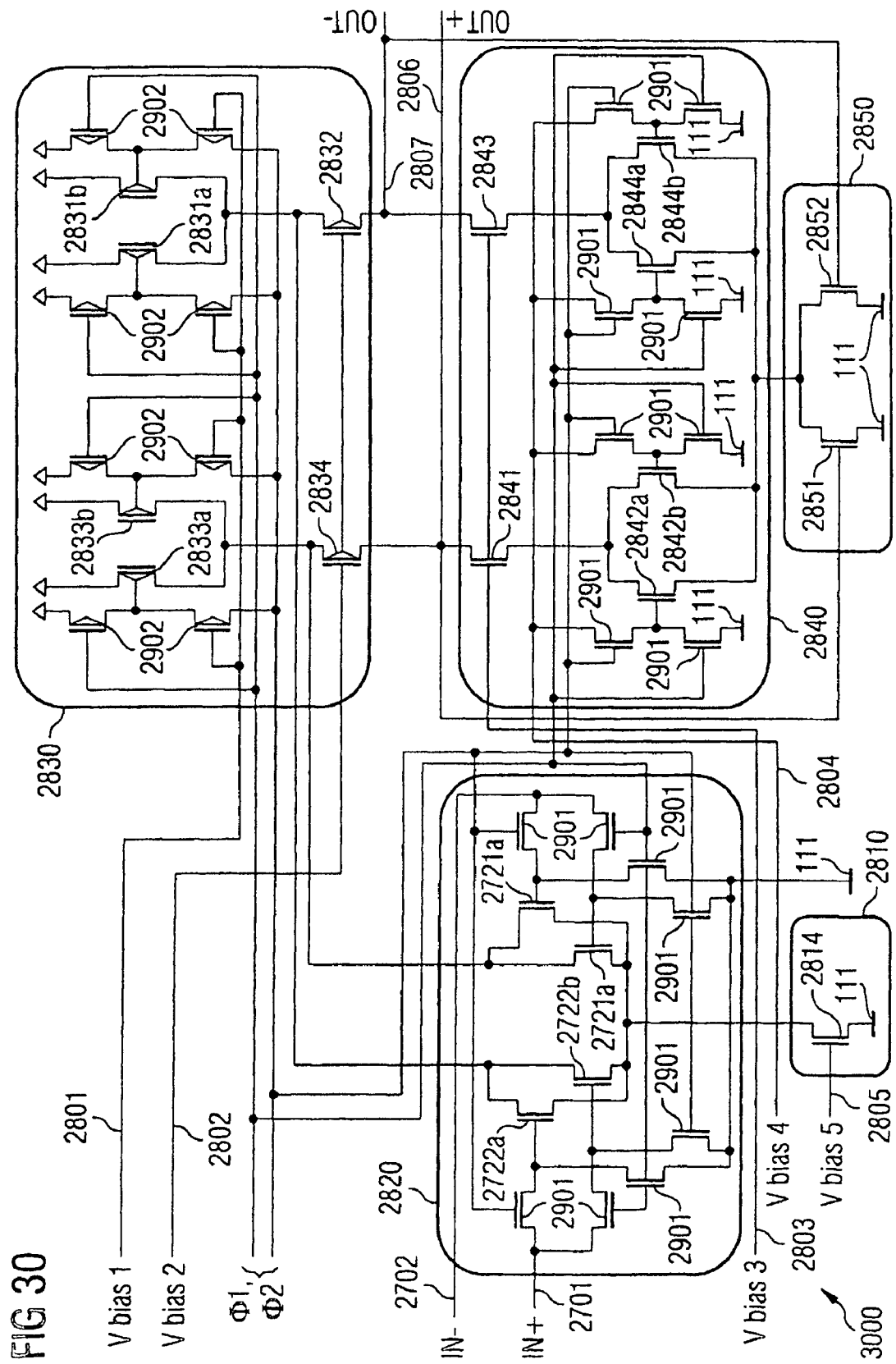

The operational amplifier 3000 from FIG. 30 differs from the operational amplifier 2800 illustrated in FIG. 28 essentially by virtue of the fact that in the circuit blocks 2820, 2830 and 2840 transistors are replaced, connected up and driven using the clock signals $\phi_1$, $\phi_2$ in accordance with the invention.

The differential input transistor pair 2820 is connected up like the differential input transistor pair 2720 from FIG. 29.

In the second current source 2830, the first p-MOS current source transistor 2831 is replaced by first and second p-MOS replacement current source transistors 2831a, 2831b. Furthermore, the third p-MOS current source transistor 2833 is replaced by third and fourth p-MOS replacement current source transistors 2833a, 2833b. Furthermore, p-MOS switching transistors 2902 are provided in order to enable the interconnection and driving according to the invention.

In the third current source 2840, the third n-MOS current source transistor 2842 is replaced by first and second n-MOS replacement current source transistors 2842a, 2842b, and furthermore the fifth n-MOS current source transistor 2844 is replaced by third and fourth n-MOS replacement current source transistors 2844a, 2844b. Furthermore, n-MOS switching transistors 2901 are provided in order to enable the interconnection and driving according to the invention.

In the case of the operational amplifier 3000, the blocks 2810, 2850 are not altered by comparison with FIG. 28, since the noise of these blocks makes only a negligible contribution. In the blocks 2820, 2830, 2840, the driving of noise-compensated transistors is performed via the gate nodes thereof, only a portion of the transistors, but not the cascode elements (transistors 2834, 2832, 2841, 2843), being replaced in the current source blocks 2830, 2840. It goes without saying that these cascode transistors can also be replaced if a particularly low noise is sought.

A description is given below, referring to FIG. 31A of a differential circuit 3100 in accordance with the prior art and, referring to FIG. 31B, of a differential circuit 3110 as a transistor arrangement in accordance with a fourth exemplary embodiment of the invention.

Figure 31B:
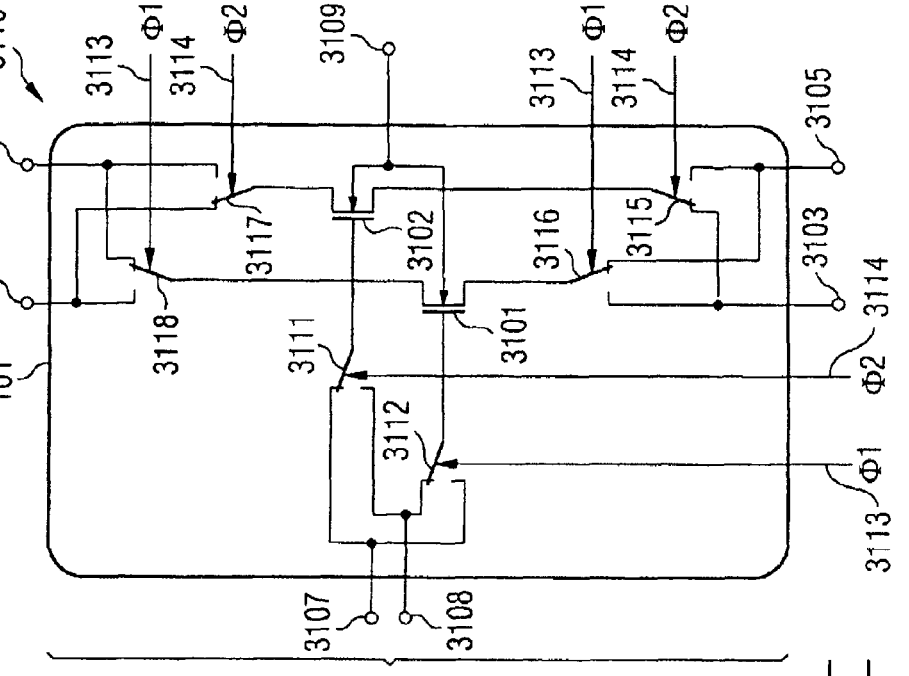
FIG. 31A illustrates a conventional transistor arrangement with differential signal processing and FIG. 31B illustrates a transistor arrangement with differential signal processing in accordance with a fourth exemplary embodiment of the invention.
Figure 31A:
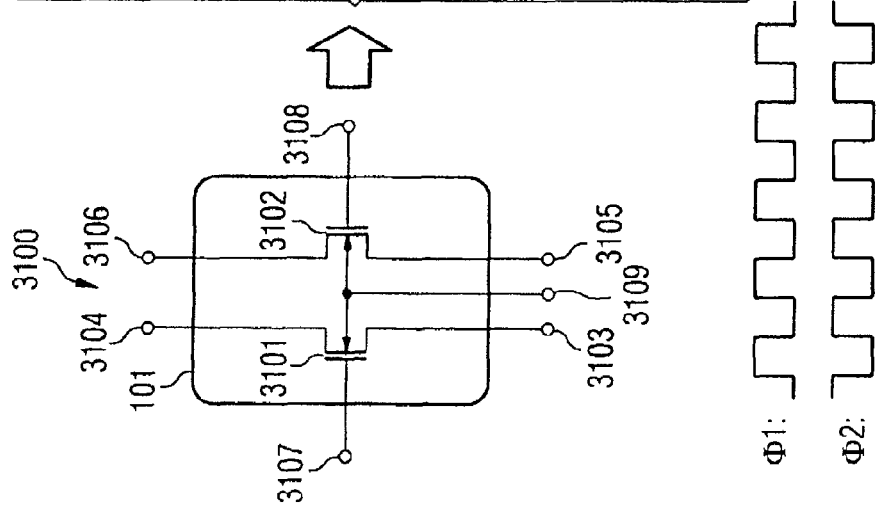

The differential circuit 3100 illustrated in FIG. 31A is set up for the differential processing of a first and of a second useful signal. The differential circuit 3100 contains a first n-MOS transistor 3101 and a second n-MOS transistor 3102. The first n-MOS transistor 3101 contains a first source/drain terminal 3103, a second source/drain terminal 3104 and a gate terminal 3107. Furthermore, the second n-MOS transistor 3102 contains a first source/drain terminal 3105, a second source/drain terminal 3106 and a gate terminal 3108.

The useful signals to be processed which are differential with respect to one another, are provided at the gate terminals 3107 and 3108 and lead to a characteristic current flow between the respective source/drain terminals 3103, 3104 and 3105, 3106. Each of the field effect transistors 3101 and 3102 contains a substrate terminal, the substrate terminals of the field effect transistors 3101, 3102 being coupled in order to form a common substrate terminal 3109.

A description is given below, referring to FIG. 31B, of a differential circuit 3110 as a transistor arrangement in accordance with a fourth exemplary embodiment of the invention.

In the case of the differential circuit 3110, in order to reduce influences of a mismatch between the two transistors 3101, 3102, the transistors 3101, 3102 are driven such that one of the two transistors 3101, 3102 processes the first useful signal to be processed in a first half of the clock cycle and processes the second useful signal to be processed in a second half of the clock cycle, and that the respective other field effect transistor processes the second useful signal to be processed in the first half of the clock cycle and processes the first useful signal to be processed in the second half of the clock cycle. As a result, a device mismatch can be averaged out and an interference influence based thereon can be eliminated.

The first useful signal is provided at the gate terminal 3107, and the differential useful signal with respect thereto is provided at the gate terminal 3108. By means of a first switching element 3111, the gate terminal of the second field effect transistor 3102—under the control of the second clock signal $\Phi 2$—is coupled to the first useful signal at terminal 3107 in a first half of the clock cycle, and, by means of the first switching element 3111, the gate terminal of the second field effect transistor 3102 is coupled to the first useful signal at terminal 3107 in a second half of the clock cycle—under the control of the second clock signal $\Phi 2$. By means of a second switching element 3112, the gate terminal of the first field effect transistor 3101 is coupled to the second useful signal at terminal 3108 in a first half of the clock cycle—under the control of the first clock signal $\Phi 1$—and to the first useful signal at the terminal 3107 in a second half-phase.

By means of a third switching element 3115 and by means of a fourth switching element 3116, it is possible—under the control of the clock signals $\Phi 1$, $\Phi 2$ at the first and second clock signal inputs 3113 and 3114—for signals provided at the terminals 3103 and 3105 to be applied alternately to the first source/drain terminals of the field effect transistors 3101, 3102. By means of a fifth switching element 3117 and by means of a sixth switching element 3118, it is possible—under the control of the clock signals $\Phi 1$, $\Phi 2$ at the first and second clock signal inputs 3113 and 3114—for signals provided at the terminals 3104 and 3106 to be applied alternately to the second source/drain terminals of the field effect transistors 3101, 3102.

A description is given below, referring to FIG. 32A, of a differential stage circuit 3200 as an integrated circuit in accordance with a nineteenth exemplary embodiment of the invention.

In the case of the differential stage circuit 3200 compared with the differential stage circuit 500 illustrated in FIG. 5A, an alternate driving of the gate terminals of the transistors 501, 502 is performed in such a way that in order to process a differential input signal IN+, IN− at the inputs 503, 504 in order to provide a differential output signal OUT+, OUT− at the outputs 505, 506, the two input signals IN+, IN− are applied alternately to the gate terminals of the transistors 501, 502. As a result, a mismatch of the two transistors 501, 502 is compensated for, that is to say that a production-dictated mismatch on average over time does not lead to a disturbance of the signal processing.

For this purpose, in a manner similar to that in FIG. 31B, a respective switching element 3111, 3112 is connected upstream of each of the gate terminals of the transistors 501, 502 and, for a respective half-phase of the clock signals Φ1, Φ2 applies a respective one of the two signals IN+, IN− to be processed to the respective gate terminal. The first source/drain terminals of the transistors 501, 502 are supplied with electric current by means of a current source 509. Depending on the value of the signals IN+, IN− at the gate terminals of the transistors 501, 502, the respective currents through the channel regions are controlled, so that a correspondingly processed voltage signal can thereby be tapped off at the node between the load and the second source/drain terminals of the two transistors 501, 502. Said voltage signal is forwarded to the respectively correct output 506, 505 by means of a fifth and sixth switching element 3117, 3118—controlled by means of clock signals Φ1, Φ2—so that the switches 3117, 3118, with regard to their changeover are synchronized with the changeover of the switching elements 3111, 3112.

Consequently, FIG. 32A illustrates a differential stage 3200 such as is often used as an amplifier or comparator in analog circuits. The transistors 501, 502 are modified compared with the circuit from FIG. 5A with regard to their driving to the effect that the switching elements 3111, 3112, 3117, 3118 are applied for alternately applying the two signals to be processed to the gate terminals of the transistors 501, 502.

Since the loads 507, 508 are often embodied as a transistor connected up as a diode, the principle according to the invention can also be applied thereto. For the sake of simplicity, it is possible to omit switches at the loads 507, 508 and also the switches at the transistors 501, 502 between the transistors and the nodes OUT+, OUT− 505, 506 (that is to say the switching elements 3118, 3117).

The simplification according to the invention applies in principle to all differential circuits for series-connected transistors of a branch.

A description is given below, referring to FIG. 32B, of a differential stage circuit 3210 as an integrated circuit in accordance with a twentieth exemplary embodiment of the invention.

Figure 32B:
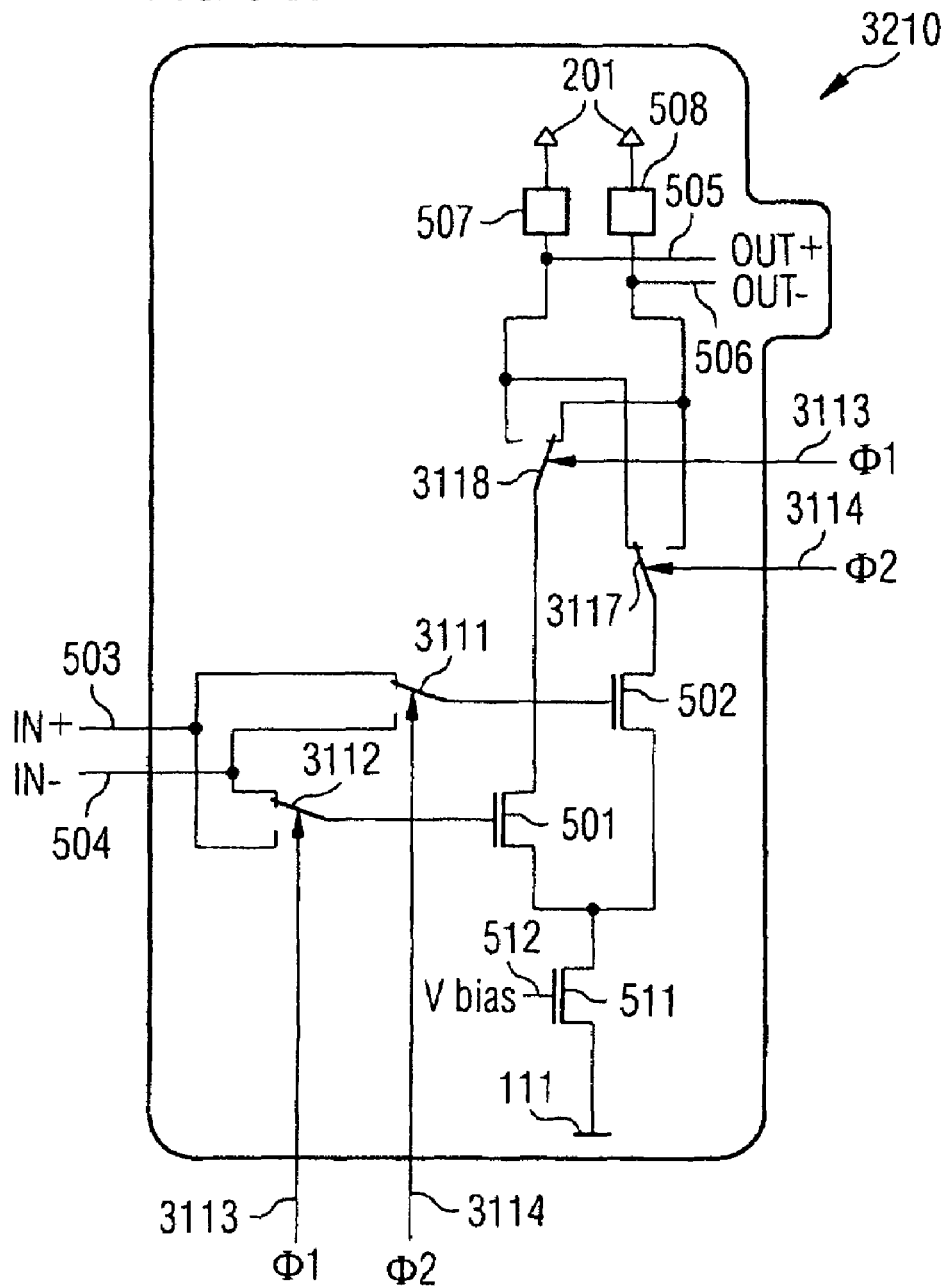

The differential stage circuit 3210 differs from the differential stage circuit 3200 in the manner that the differential stage circuit 510 from FIG. 5B differs from the differential stage circuit 500 from FIG. 5A, namely by virtue of the fact that the current source 509 in FIG. 32B is provided as a transistor 511 that is controlled with a bias voltage $V_{bias}$ at a terminal 512.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A transistor arrangement comprising:
  a first and a second field effect transistor, each of which has a first and a second source/drain terminal and a control terminal for application of a first or a second signal, the two field effect transistors being of the same conduction type;
  wherein the transistor arrangement is configured such that alternately:
    the first signal can be applied to the control terminal of the first field effect transistor and, simultaneously, the second signal can be applied to the control terminal of the second field effect transistor; and
    the second signal can be applied to the control terminal of the first field effect transistor and, simultaneously, the first signal can be applied to the control terminal of the second field effect transistor;
  wherein one of the first and second signals is a useful signal and the respective other signal is a reference potential, or in which the first signal and the second signal are in each case a reference potential, or in which the first signal and the second signal are in each case a useful signal.

2. The transistor arrangement as claimed in claim 1, wherein the first source/drain terminals of the first and of the second field effect transistor are coupled to one another; and wherein second source/drain terminals of the first and of the second field effect transistor are coupled to one another.

3. The transistor arrangement as claimed in claim 1, wherein the control terminal is a gate terminal or a substrate terminal.

4. The transistor arrangement as claimed in claim 3, wherein at least one of the substrate terminals is set up as a well terminal of one of the two field effect transistors, which is formed in a well.

5. The transistor arrangement as claimed in claim 1, wherein, for the case where the control terminal of the first and of the second field effect transistor is a gate terminal, the first and the second field effect transistor have a substrate terminal as additional control terminal; wherein for the case where the control terminal of the first and of the second field effect transistor is a substrate terminal, the first and the second field effect transistor have a gate terminal as additional control terminal, and wherein the additional control terminals of the first and of the second field effect transistor are coupled to one another.

6. The transistor arrangement as claimed in claim 1, wherein the first and the second field effect transistor are structurally identical.

7. A transistor arrangement comprising:
  a first and a second field effect transistor, each of which has a first and a second source/drain terminal and a control terminal for application of a first or a second signal, the two field effect transistors being of the same conduction type;
  wherein the transistor arrangement is configured such that alternately:
    the first signal can be applied to the control terminal of the first field effect transistor and, simultaneously, the second signal can be applied to the control terminal of the second field effect transistor; and
    the second signal can be applied to the control terminal of the first field effect transistor and, simultaneously, the first signal can be applied to the control terminal of the second field effect transistor:
  wherein the first and the second signal are applied alternately to the control terminals of the first and second field effect transistors with an alternating frequency which is at least as great as the cut-off frequency of the noise characteristic of the field effect transistors.

8. The transistor arrangement as claimed in claim 7, wherein the first and the second signal are applied alternately to the control terminals of the first and second field effect transistors with an alternating frequency which is greater than the frequencies of a useful frequency band of an assigned circuit.

9. The transistor arrangement as claimed in claim 7, wherein the first and the second signal are applied alternately to the control terminals of the first and second field effect transistors with a reciprocal alternating frequency which is less than a mean lifetime of an occupation state of a defect in the boundary region between channel region and gate insulating layer of the field effect transistors.

10. The transistor arrangement as claimed in claim 7, wherein the arrangement is configured such that a respective one of the two field effect transistors can be operated at an inversion operating point and the respective other of the two field effect transistors can be operated at an accumulation or depletion operating point.

11. A transistor arrangement comprising:
a first and a second field effect transistor, each of which has a first and a second source/drain terminal and a control terminal for application of a first or a second signal, the two field effect transistors being of the same conduction type;
wherein the transistor arrangement is configured such that alternately:
the first signal can be applied to the control terminal of the first field effect transistor and, simultaneously, the second signal can be applied to the control terminal of the second field effect transistor; and
the second signal can be applied to the control terminal of the first field effect transistor and, simultaneously, the first signal can be applied to the control terminal of the second field effect transistor;
wherein the control terminal of the first field effect transistor is coupled to a first switching element, which can be switched by means of a first clock signal with an alternating frequency; wherein, the control terminal of the second field effect transistor is coupled to a second switching element, which can be switched by means of a second clock signal, which is complementary to the first clock signal, with the alternating frequency; and wherein, by means of the respective switching element, the first or the second signal is alternately applied to the respective control terminal of the respective field effect transistor with the alternating frequency.

12. The transistor arrangement as claimed in claim 11, wherein the first and second switching elements are first and second switching transistor arrangements, to the respective gate terminal of which the respective clock signal can be applied, and a respective source/drain terminal of a respective switching transistor being coupled to the control terminal of the respective field effect transistor.

13. The transistor arrangement as claimed in claim 11, wherein the arrangement is configured as a differential transistor arrangement, in which the first signal and the second signal are differential useful signals with respect to one another.

14. The transistor arrangement as claimed in claim 13 further comprising a low-pass filter, which is connected up in such a way that an interference signal caused by means of the alternating application of the first signal and of the second signal can be suppressed by means of the low-pass filter.

15. The transistor arrangement as claimed in claim 13, wherein the first source/drain terminal of the first field effect transistor is coupled to a third switching element, which can be switched by means of the first clock signal with the alternating frequency, and wherein the first source/drain terminal of the second field effect transistor is coupled to a fourth switching element, which can be switched by means of the second clock signal, which is complementary to the first clock signal, with the alternating frequency.

16. The transistor arrangement as claimed in claim 13 further comprising a current source, which is coupled to the first source/drain terminal of the first field effect transistor and to the first source/drain terminal of the second field effect transistor.

17. The transistor arrangement as claimed in claim 13, wherein the second source/drain terminal of the first field effect transistor is coupled to a fifth switching element, which can be switched by means of the first clock signal with the alternating frequency; and wherein the second source/drain terminal of the second field effect transistor is coupled to a sixth switching element, which can be switched by means of the second clock signal, which is complementary to the first clock signal, with the alternating frequency.

18. The transistor arrangement as claimed in one of claim 13, wherein the arrangement is formed on and/or in a silicon on insulator substrate.

19. The transistor arrangement as claimed in claim 18, further comprising at least one additional field effect transistor, wherein each of the at least one additional field effect transistor having a first and a second source/drain terminal and having a control terminal, to which the first or the second signal can be applied, and wherein the transistor arrangement being set up in such a way that, in a first operating state, the first signal is applied to the control terminal of the first field effect transistor or of the second field effect transistor or of precisely one of the at least one additional field effect transistor and, simultaneously, the second signal is applied to the control terminals of all of the other field effect transistors, in subsequent operating states the first signal being applied progressively to the control terminal of in each case one of the remaining field effect transistors and, simultaneously, the second signal being applied to the control terminals of all of the other field effect transistors.

20. The transistor arrangement as claimed in one of claim 13, wherein the arrangement is realized using analog circuit technology.

21. The transistor arrangement as claimed in claim 11 further comprising a clock generator unit, which is coupled to the field effect transistors in such a way that it provides the signals to the field effect transistors alternately by means of clock signals that are shifted relative to one another.

22. The transistor arrangement as claimed in claim 21, wherein the clock generator unit is set up in such a way that it prescribes the clock signals for reducing the heating of the field effect transistors formed on and/or in the silicon on insulator substrate and/or for reducing the floating body effect of the field effect transistors formed on and/or in the silicon on insulator substrate.

23. A method for operating field effect transistors comprising:
connecting a first and a second field effect transistor to one another, each of the field effect transistors having a first and a second source/drain terminal and having a control terminal for application of a first or a second signal, the two field effect transistors being of the same conduction type;
setting up the transistor arrangement such that alternately the first signal is applied to the control terminal of the first field effect transistor and, simultaneously, the second signal is applied to the control terminal of the second field effect transistor and the second signal is applied to the control terminal of the first field effect transistor and, simultaneously, the first signal is applied to the control terminal of the second field effect transistor; and alternately applying the first and second signals such that the quasi-Fermi energy in a boundary region between channel region and gate insulating layer of the field effect transistors is periodically altered by a value which is greater than the product of the Boltzmann constant and the absolute temperature.

24. The method as claimed in claim 23 further comprising using a gate terminal or a substrate terminal as the control terminal.

25. The method as claimed in claim 24 further comprising alternately applying the first and second signals such that the quasi-Fermi energy in a boundary region between channel region and gate insulating layer of the field effect transistors is periodically altered by between approximately 100 meV and approximately 1 eV.

* * * * *